(12) United States Patent
Shitagaki et al.

(10) Patent No.: US 8,319,210 B2
(45) Date of Patent: Nov. 27, 2012

(54) LIGHT-EMITTING ELEMENT, LIGHT-EMITTING DEVICE, AND ELECTRONIC DEVICE

(75) Inventors: Satoko Shitagaki, Kanagawa (JP); Satoshi Seo, Kanagawa (JP); Ryoji Nomura, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 12/774,372

(22) Filed: May 5, 2010

(65) Prior Publication Data

US 2010/0213457 A1 Aug. 26, 2010

Related U.S. Application Data

(63) Continuation of application No. 11/998,400, filed on Nov. 29, 2007, now Pat. No. 7,732,811.

(30) Foreign Application Priority Data

Dec. 4, 2006 (JP) ................................ 2006-327662

(51) Int. Cl.
*H01L 35/24* (2006.01)
(52) U.S. Cl. .............. 257/40; 257/79; 257/94; 257/101; 257/E51.001
(58) Field of Classification Search .................... 257/40, 257/79, 94, 101
See application file for complete search history.

(56) References Cited

U.S. PATENT DOCUMENTS

| | | | |
|---|---|---|---|
| 5,834,130 A | 11/1998 | Kido | |
| 5,869,199 A | 2/1999 | Kido | |
| 5,989,737 A | 11/1999 | Xie et al. | |
| 6,344,283 B1 | 2/2002 | Inoue et al. | |
| 6,597,012 B2 * | 7/2003 | Kido et al. | ...................... 257/40 |
| 6,603,150 B2 | 8/2003 | Liao et al. | |
| 6,623,872 B2 | 9/2003 | Inoue et al. | |
| 6,730,929 B2 | 5/2004 | Fukuyama et al. | |

(Continued)

FOREIGN PATENT DOCUMENTS

EP 0 647 694 A1 4/1995

(Continued)

OTHER PUBLICATIONS

Tsutsui, T. et al, "High Quantum Efficiency in Organic Light-Emitting Devices with Iridium-Complex as a Triplet Emissive Center," Japanese Journal of Applied Physics, vol. 38, part 2, No. 12B, Dec. 15, 1999, pp. L1502-L1504.

(Continued)

*Primary Examiner* — Wai Sing Louie
(74) *Attorney, Agent, or Firm* — Husch Blackwell LLP

(57) ABSTRACT

A light-emitting element disclosed in the present invention includes a light-emitting layer and a first layer between a first electrode and a second electrode, in which the first layer is provided between the light-emitting layer and the first electrode. The present invention is characterized by the device structure in which the first layer comprising a hole-transporting material is doped with a hole-blocking material or an organic compound having a large dipole moment. This structure allows the formation of a high performance light-emitting element with high luminous efficiency and long lifetime. The device structure of the present invention facilitates the control of the rate of the carrier transport, and thus, leads to the formation of a light-emitting element with a well-controlled carrier balance, which contributes to the excellent characteristics of the light-emitting element of the present invention.

19 Claims, 30 Drawing Sheets

U.S. PATENT DOCUMENTS

| | | | |
|---|---|---|---|
| 6,806,491 | B2 | 10/2004 | Qiu et al. |
| 6,833,201 | B2 | 12/2004 | Czerw et al. |
| 6,998,487 | B2 | 2/2006 | Kim et al. |
| 7,045,953 | B2 | 5/2006 | Nakayama et al. |
| 7,097,918 | B2 | 8/2006 | Inoue et al. |
| 7,163,831 | B2 | 1/2007 | Hasegawa et al. |
| 7,173,370 | B2 | 2/2007 | Seo et al. |
| 7,192,659 | B2 | 3/2007 | Ricks et al. |
| 7,196,360 | B2 | 3/2007 | Seo et al. |
| 7,268,484 | B2 | 9/2007 | Nakamura |
| 7,365,360 | B2 | 4/2008 | Kang et al. |
| 2001/0005021 | A1 | 6/2001 | Fukuyama et al. |
| 2002/0086180 | A1 | 7/2002 | Seo et al. |
| 2002/0093283 | A1 | 7/2002 | Seo et al. |
| 2002/0102434 | A1 | 8/2002 | Inoue et al. |
| 2002/0109136 | A1 | 8/2002 | Seo et al. |
| 2002/0113546 | A1 | 8/2002 | Seo et al. |
| 2002/0121860 | A1 | 9/2002 | Seo et al. |
| 2002/0139303 | A1 | 10/2002 | Yamazaki et al. |
| 2002/0155632 | A1 | 10/2002 | Yamazaki et al. |
| 2003/0010288 | A1 | 1/2003 | Yamazaki et al. |
| 2004/0061108 | A1 | 4/2004 | Fukuyama et al. |
| 2004/0150328 | A1 | 8/2004 | Czerw et al. |
| 2004/0154542 | A1 | 8/2004 | Yamazaki et al. |
| 2004/0217693 | A1 | 11/2004 | Duggal et al. |
| 2004/0224182 | A1* | 11/2004 | Lazarev ........................ 428/690 |
| 2004/0245542 | A1 | 12/2004 | Kim |
| 2005/0048317 | A1 | 3/2005 | Seo et al. |
| 2005/0100760 | A1 | 5/2005 | Yokoyama |
| 2005/0179370 | A1 | 8/2005 | Nakayama et al. |
| 2005/0179378 | A1 | 8/2005 | Oooka et al. |
| 2005/0221121 | A1 | 10/2005 | Ishihara et al. |
| 2005/0260440 | A1 | 11/2005 | Seo et al. |
| 2005/0282036 | A1* | 12/2005 | D'Andrade et al. .......... 428/690 |
| 2006/0043859 | A1 | 3/2006 | Fukuoka et al. |
| 2006/0142520 | A1 | 6/2006 | Jones et al. |
| 2006/0158102 | A1 | 7/2006 | Kawamura et al. |
| 2006/0210828 | A1 | 9/2006 | Nakayama et al. |
| 2006/0243967 | A1 | 11/2006 | Nomura et al. |
| 2006/0243970 | A1 | 11/2006 | Seo et al. |
| 2007/0046185 | A1 | 3/2007 | Kim |
| 2007/0063156 | A1 | 3/2007 | Hayashi |
| 2007/0103065 | A1 | 5/2007 | Fukuoka et al. |
| 2007/0159083 | A1 | 7/2007 | Matsuura et al. |
| 2007/0172699 | A1 | 7/2007 | Nakashima et al. |
| 2007/0281386 | A1 | 12/2007 | Park |
| 2008/0006821 | A1 | 1/2008 | Suzuki et al. |
| 2008/0006822 | A1 | 1/2008 | Ohsawa |
| 2008/0007164 | A1 | 1/2008 | Suzuki et al. |
| 2008/0007165 | A1 | 1/2008 | Suzuki et al. |
| 2008/0122350 | A1 | 5/2008 | Sakata et al. |
| 2008/0214525 | A1 | 9/2008 | Howard et al. |
| 2008/0231177 | A1 | 9/2008 | Nomura et al. |
| 2008/0261075 | A1 | 10/2008 | Seo et al. |
| 2009/0140643 | A1 | 6/2009 | Ohsawa et al. |

FOREIGN PATENT DOCUMENTS

| | | |
|---|---|---|
| EP | 0 712 916 A1 | 5/1996 |
| EP | 0 891 121 A1 | 1/1999 |
| EP | 1 111 695 A2 | 6/2001 |
| EP | 1 565 041 A1 | 8/2005 |
| EP | 1 603 369 A1 | 12/2005 |
| EP | 1 643 812 A1 | 4/2006 |
| EP | 1 718 122 A1 | 11/2006 |
| JP | 3-114197 | 5/1991 |
| JP | 4-357694 | 12/1992 |
| JP | 5-182762 | 7/1993 |
| JP | 6-158038 | 6/1994 |
| JP | 7-41759 | 2/1995 |
| JP | 7-85972 | 3/1995 |
| JP | 8-306487 | 11/1996 |
| JP | 9-298088 | 11/1997 |
| JP | 10-255985 | 9/1998 |
| JP | 2000-68057 | 3/2000 |
| JP | 2000-243574 | 9/2000 |
| JP | 2001-267081 | 9/2001 |
| JP | 2001-319779 | 11/2001 |
| JP | 2004-31323 | 1/2004 |
| JP | 2004-221045 | 8/2004 |
| JP | 2004-273163 | 9/2004 |
| JP | 2004-356033 | 12/2004 |
| JP | 2005-11734 | 1/2005 |
| JP | 2005-11735 | 1/2005 |
| JP | 2005-100977 | 4/2005 |
| JP | 2005-510025 | 4/2005 |
| JP | 2005-150084 | 6/2005 |
| JP | 2005-235403 | 9/2005 |
| JP | 2005-285619 | 10/2005 |
| JP | 2005-285708 | 10/2005 |
| JP | 2006-49057 | 2/2006 |
| JP | 2006-156888 | 6/2006 |
| JP | 2007-258237 | 10/2007 |
| WO | WO 98/30071 A1 | 7/1998 |
| WO | WO 03/043383 A1 | 5/2003 |
| WO | WO 2004/047499 A1 | 6/2004 |
| WO | WO 2004/082338 A1 | 9/2004 |
| WO | WO 2004/110106 A1 | 12/2004 |
| WO | WO 2005/079118 A1 | 8/2005 |
| WO | WO 2006/059512 A1 | 6/2006 |
| WO | WO 2006/059736 A1 | 6/2006 |
| WO | WO 2007/139124 A1 | 12/2007 |

OTHER PUBLICATIONS

Goldsmith, C.R. et al, "C-H Bond Activation by a Ferric Methoxide Complex: Modeling the Rate-Determining Step in the Mechanism of Lipoxygenase," J. Am. Chem. Soc., vol. 124, No. 1, 2002, pp. 83-96.

Lee, M-T et al, "Improved Stability of Organic Electroluminescent Devices by Doping Styrylamines in Hole or Electron Transporting Layer," Applied Physics Letters, vol. 86, 2005, pp. 103501-1-103501-3.

Cina, S. et al, "P-135: Efficient Electron Injection from PEDOT-PSS into a Graded-n-Doped Electron Transporting Layer in an Inverted OLED Structure," SID 05 Digest, 2005, pp. 819-821.

Ohnishi, T. et al, "Development of Light-Emitting High Molecular Compounds—A Method of Measuring an Energy Level," *High Molecular EL Materials*, Kyoritsu Shuppan, Dec. 25, 2004, pp. 64-67 (with English translation—3 pages).

International Search Report re application No. PCT/JP2007/060940, dated Aug. 21, 2007.

Written Opinion re application No. PCT/JP2007/060940, dated Aug. 21, 2007.

Sawatani, T. et al, "Organic EL Device with DCM/Alq$_3$ Quantum-Confined Structure," IEICE Technical Report, vol. 99, No. 174, 1999, pp. 1-6 (with English abstract).

Sun, Q.J. et al, "Enhanced Performance of White Polymer Light-Emitting Diodes Using Polymer Blends as Hole-Transporting Layers," Applied Physics Letters, vol. 89, 2006, pp. 153501-1-153501-3.

International Search Report re application No. PCT/JP2007/073261, dated Mar. 4, 2008.

Written Opinion re application No. PCT/JP2007/073261, dated Mar. 4, 2008.

Tsai, C-H et al, "Highly Stable Organic Light-Emitting Devices with a Uniformly Mixed Hole Transport Layer," Applied Physics Letters, vol. 87, No. 24, Dec. 12, 2005, pp. 243505-1-243505-3.

PCT Invitation to Pay Additional Fees, re application No. PCT/JP2007/073261, dated Jan. 8, 2008.

* cited by examiner

LIGHT-EMITTING ELEMENT, LIGHT-EMITTING DEVICE, AND ELECTRONIC DEVICE

This application is a continuation of application Ser. No. 11/998,400 filed on Nov. 29, 2007 now U.S. Pat. No. 7,732,811.

TECHNICAL FIELD

The present invention relates to current excitation type light-emitting elements. Further, the present invention relates to light-emitting devices and electronic devices which have the light-emitting element.

BACKGROUND ART

In recent years, research and development have been extensively conducted on light-emitting elements utilizing electroluminescence. In a basic structure of such a light-emitting element, a light-emissive substance is interposed between a pair of electrodes. By voltage application to this element, light emission can be obtained from the light-emissive substance.

Since such a light-emitting element is of self-light-emitting type, it is considered that the light-emitting element has advantages over a liquid crystal display in that visibility of pixels is high, backlight is not required, and so on and is therefore suitable as flat panel display elements. Further, other advantages of such a light-emitting element are that the element can be manufactured to be thin and lightweight and the response speed is very high.

Since the light-emitting element can be formed into a film shape, light emission can be easily obtained from a flat surface with large-area. This is a feature which is difficult to be obtained by point light sources typified by an incandescent lamp and an LED or linear light sources typified by a fluorescent lamp. Accordingly, the light-emitting element is extremely effective for use as a flat light source applicable to illumination and the like.

Light-emitting elements utilizing electroluminescence are classified broadly according to whether they use an organic compound or an inorganic compound as a light-emissive substance.

When an organic compound is used as a light-emitting substance, electrons and holes are each injected into a layer including a light-emitting organic compound from a pair of electrodes by voltage application to a light-emitting element, so that a current flows therethrough. The electrons and holes (carriers) are recombined, and thus, the light-emitting organic compound is excited. The light-emitting organic compound relaxes to a ground state from the excited state, thereby emitting light. Based on this mechanism, such a light-emitting element is referred to as current excitation type light-emitting element.

Note that the excited state of an organic compound can be a singlet excited state or a triplet excited state, and luminescence from the singlet excited state is referred to as fluorescence, and luminescence from the triplet excited state is referred to as phosphorescence.

In improving element characteristics of such a light-emitting element, there are a number of problems which depend on a material used, and in order to solve the problems, improvement of an element structure, development of a material, and the like have been carried out.

For example, in Non-patent Document 1: Tetsuo TSUT-SUI, and eight others, Japanese Journal of Applied Physics, Vol. 38, L1502-L1504 (1999), a hole-blocking layer is provided, whereby light is efficiently emitted from a light-emitting element using a phosphorescent material. However, as described in Non-patent Document 1, the hole-blocking layer does not have durability and a lifetime of the light-emitting element is extremely short. Thus, it has been desired to develop a light-emitting element of which light-emitting efficiency is high and lifetime is long.

DISCLOSURE OF INVENTION

In view of the above problem, it is an object of the present invention to provide a light-emitting element with high luminous efficiency, high luminous efficiency, and a long lifetime. The object of the present invention also includes provision of a light-emitting device and an electronic device with high luminous efficiency, high luminous efficiency, and a long lifetime.

As a result of diligent study, the present inventors found that a light-emitting element with high luminous efficiency can be obtained by providing a layer for controlling the carrier transport.

Thus, according to one feature of the present invention, a light-emitting element includes a light-emitting layer and a first layer between a first electrode and a second electrode, in which the first layer is provided between the light-emitting layer and the first electrode. The first layer contains a first organic compound and a second organic compound, and a weight percent of the first organic compound is higher than that of the second organic compound. The first organic compound has a hole-transporting property, and the second organic compound is a substance into which a hole is not injected and which reduces a hole-transporting property of the first layer. Light emission is obtained from the light-emitting layer by applying voltage to the first electrode and the second electrode so that a potential of the first electrode is higher than that of the second electrode.

According to another feature of the present invention, a light-emitting element includes a light-emitting layer and a first layer between a first electrode and a second electrode, in which the first layer is provided between the light-emitting layer and the first electrode. The first layer contains a first organic compound and a second organic compound, and a weight percent of the first organic compound is higher than that of the second organic compound. According to the feature of the present invention, the first organic compound has a hole-transporting property, while the second organic compound is a hole-blocking material having a dipole moment of larger than or equal to 2.0 debye. Light emission is obtained from the light-emitting layer by applying voltage to the first electrode and the second electrode so that a potential of the first electrode is higher than a potential of the second electrode.

According to another feature of the present invention, a light-emitting element having the following structure is provided. Namely, the light-emitting element of the present invention includes a light-emitting layer and a first layer between a first electrode and a second electrode, in which the first layer is provided between the light-emitting layer and the first electrode. The first layer contains a first organic compound and a second organic compound, and a weight percent of the first organic compound is higher than that of the second organic compound. Here, the first organic compound has a hole-transporting property and a difference in the ionization potential between the second organic compound and the first organic compound is greater than or equal to 0.5 eV. The dipole moment of the second organic compound is also larger than or equal to 2.0 debye. Light emission is obtained from the light-emitting layer by applying voltage to the first electrode and the second electrode so that a potential of the first electrode is higher than a potential of the second electrode.

According to another feature of the present invention, a light-emitting element includes a light-emitting layer and a first layer between a first electrode and a second electrode, in which the first layer is provided between the light-emitting layer and the first electrode. The first layer contains a first organic compound and a second organic compound, and a weight percent of the first organic compound is higher than that of the second organic compound. According to this feature of the present invention, the first organic compound has a hole-transporting property, and the second organic compound has an ionization potential of greater than or equal to 5.8 eV and simultaneously has a dipole moment of larger than or equal to 2.0 debye. Light emission is obtained from the light-emitting layer by applying voltage to the first electrode and the second electrode so that a potential of the first electrode is higher than a potential of the second electrode.

Another feature of the present invention provides a light-emitting element having the following structure. Specifically, the light-emitting element of the present invention includes a light-emitting layer and a first layer between a first electrode and a second electrode, in which the first layer is provided between the light-emitting layer and the first electrode. The first layer contains a first organic compound and a second organic compound, and a weight percent of the first organic compound is higher than that of the second organic compound. The first organic compound has a hole-transporting property, and the difference in the ionization potential between the second organic compound and the first organic compound is greater than or equal to 0.5 eV. Here, the second organic compound has a heterocycle. Light emission is obtained from the light-emitting layer by applying voltage to the first electrode and the second electrode so that a potential of the first electrode is higher than a potential of the second electrode.

A light-emitting having the following structure is also included in the present invention. Namely, the present invention provides a light-emitting element having a light-emitting layer and a first layer between a first electrode and a second electrode, in which the first layer is provided between the light-emitting layer and the first electrode. The first layer contains a first organic compound and a second organic compound, and a weight percent of the first organic compound is higher than that of the second organic compound. The first organic compound has a hole-transporting property, and the second organic compound has an ionization potential of greater than or equal to 5.8 eV and also has a heterocycle. Light emission is obtained from the light-emitting layer by applying voltage to the first electrode and the second electrode so that a potential of the first electrode is higher than a potential of the second electrode.

According to another feature of the present invention, a light-emitting element includes a light-emitting layer and a first layer between a first electrode and a second electrode, in which the first layer is provided between the light-emitting layer and the first electrode. The first layer contains a first organic compound and a second organic compound, and a weight percent of the first organic compound is higher than that of the second organic compound. The first organic compound has a hole-transporting property, and the second organic compound is any of an oxadiazole derivative, a triazole derivative, and phenanthroline derivative. Light emission is obtained from the light-emitting layer by applying voltage to the first electrode and the second electrode so that a potential of the first electrode is higher than a potential of the second electrode.

Another feature of the present invention permits providing a light-emitting element comprising a light-emitting layer and a first layer between a first electrode and a second electrode, in which the first layer is provided between the light-emitting layer and the first electrode. The first layer contains a first organic compound and a second organic compound, and a weight percent of the first organic compound is higher than that of the second, organic compound. The first organic compound has a hole-transporting property, while the second organic compound is any of 1,3-bis[5-(p-tert-butylphenyl)-1,3,4-oxadiazol-2-yl]benzene, 3-(4-biphenylyl)-4-phenyl-5-(4-tert-butylphenyl)-1,2,4-triazole, and bathocuproine. Light emission is obtained from the light-emitting layer by applying voltage to the first electrode and the second electrode so that a potential of the first electrode is higher than a potential of the second electrode.

In any of the above structures, the light-emitting element has a feature that a concentration of the second organic compound in the first layer is greater than or equal to 1 wt % and less than or equal to 20 wt %. This concentration range allows the formation of a light-emitting element with a long lifetime.

Further, in any of the above structures, the first layer may not be in contact with the first electrode and the light-emitting layer. In other words, a layer may be provided between the first layer and the light-emitting layer and another layer may be provided between the first layer and the first electrode.

Still further, in any of the above structures, a thickness of the first layer is preferably greater than or equal to 1 nm and less than or equal to 20 nm.

Furthermore, in any of the above structures, the first layer and the light-emitting layer may be provided so as to be in contact with each other.

In addition, the present invention includes a light-emitting device having the above light-emitting element. The light-emitting device shown in this specification includes an image display device, a light-emitting device, or a light source (including a lighting device). Further, the light-emitting device of the present invention includes all the following modules: a module in which a connector such as a flexible printed circuit (FPC), a tape automated bonding (TAB) tape, or a tape carrier package (TCP) is attached to a panel connector provided with a light-emitting element; a module provided with a printed wiring board at the end of the TAB tape or the TCP; and a module in which an integrated circuit (IC) is directly mounted by a chip on glass (COG) method to a substrate on which a light-emitting element is formed.

Furthermore, the present invention includes an electronic device which is equipped with the light-emitting element of the present invention for the display portion. Therefore, one feature of the electronic device of the present invention is to include a display portion having both the above light-emitting element and a controller which controls light emission of the light-emitting element.

In a light-emitting element of the present invention, a layer for controlling the carrier transport is provided; thus, a light-emitting element with high luminous efficiency can be obtained. In addition, a light-emitting element with high luminous efficiency and a long lifetime can be obtained.

Further, the light-emitting element of the present invention is applied to a light-emitting device and an electronic device, whereby a light-emitting device and an electronic device with high luminous efficiency and reduced power consumption can be obtained. In addition, a light-emitting device and an electronic device which consumes low power and have a long lifetime can be obtained.

BEST MODE FOR CARRYING OUT THE INVENTION

Figure 1A:
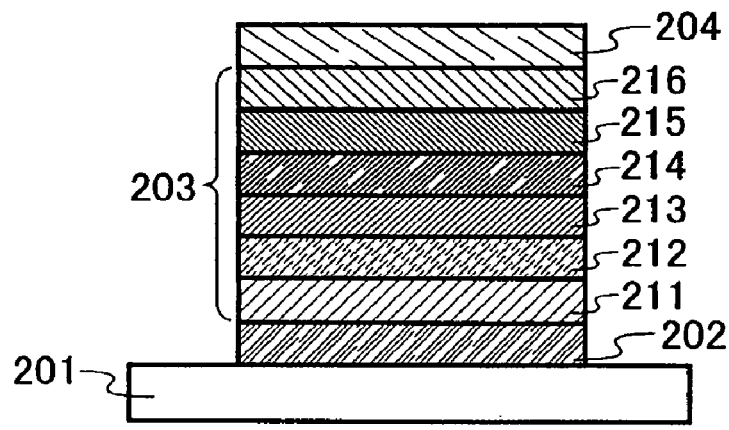
FIGS. 1A and 1B are views each illustrating a light-emitting element of the present invention.

Embodiment modes and embodiments of the present invention will be described hereinafter with reference to the accompanying drawings. However, the present invention is not limited to the following description, and those skilled in the art can easily understand that modes and details of the present invention can be changed in various ways without departing from the purpose and the scope of the present invention. Therefore, the present invention should not be interpreted as being limited to the description of the embodiment modes and embodiments below.

Note that, in this specification, the word "composite" refers not only to a state in which two materials are simply mixed but also to a state in which a plurality of materials are mixed and charges are transferred between the materials.

Embodiment Mode 1

One mode of a light-emitting element of the present invention will be described with reference to FIG. 1A. This embodiment mode will describe a light-emitting element in which a layer for controlling the transport of holes is provided as a layer for controlling the carrier transport.

The light-emitting element of the present invention has a plurality of layers between a pair of electrodes. The plurality of layers is stacked by combining layers formed of a substance having a high carrier-injecting property and a substance having a high carrier-transporting property so that a light-emitting region is formed at a position away from the electrodes, that is, so that carriers are recombined at a position away from the electrodes.

In this embodiment mode, a light-emitting element includes a first electrode 202, a second electrode 204, and an EL layer 203 provided between the first electrode 202 and the second electrode 204. Note that description will be made on the assumption that the first electrode 202 functions as an anode and the second electrode 204 functions as a cathode, in this embodiment mode. That is, light emission is obtained when a voltage is applied to the first electrode 202 and the second electrode 204 so that the potential of the first electrode 202 is higher than the potential of the second electrode 204.

A substrate 201 is used as a support of the light-emitting element. As the substrate 201, glass, plastic, or the like can be used, for example. Note that materials other than glass or plastic can be used as long as they can function as a support of a light-emitting element.

The first electrode 202 is preferably formed using a material with a high work function (specifically, 4.0 eV or more) such as metals, alloys, electrically conductive compounds, or a mixture of them. Specifically, indium tin oxide (ITO), ITO containing silicon or silicon oxide, indium zinc oxide (IZO), indium oxide containing tungsten oxide and zinc oxide (IWZO), and the like can be given. Such conductive metal oxide films are generally formed by a sputtering method, but may be also formed by an ink-jet method, a spin coating method, or the like by application of a sol-gel method or the like. For example, indium zinc oxide (IZO) can be deposited by a sputtering method using a target in which 1 to 20 wt % of zinc oxide is added to indium oxide. Further, indium oxide containing tungsten oxide and zinc oxide (IWZO) can be deposited by a sputtering method using a target in which 0.5 to 5 wt % of tungsten oxide and 0.1 to 1 wt % of zinc oxide are added to indium oxide. Besides, gold (Au), platinum (Pt), nickel (Ni), tungsten (W), chromium (Cr), molybdenum (Mo), iron (Fe), cobalt (Co), copper (Cu), palladium (Pd), titanium (Ti), nitride of metal materials (for example, titanium nitride), and the like can be given.

When a layer containing a composite material described below is used as a layer in contact with the first electrode, the first electrode can be formed using various metals, alloys, electrically conductive compound, a mixture of them, or the like regardless of their work functions. For example, aluminum (Al), silver (Ag), an aluminum alloy (e.g., AlSi), or the like can be used. Besides, an element belonging to Group 1 or 2 of the periodic table which has a low work function, that is, alkali metals such as lithium (Li) and cesium (Cs), alkaline earth metals such as magnesium (Mg), calcium (Ca), and strontium (Sr), alloys of them (for example, MgAg and AlLi) can be used. Moreover, rare earth metals such as europium (Eu) and ytterbium (Yb); alloys of them; or the like can be also used. A film made of an alkali metal, an alkaline earth metal, or an alloy of them can be formed by a vacuum deposition method. Further, a film made of an alloy of an alkali metal or an alkaline earth metal can be also formed by a sputtering method. It is also possible to deposit a silver paste or the like by an ink-jet method or the like.

The EL layer 203 shown in this embodiment mode includes a hole-injecting layer 211, a layer 212 for controlling the carrier transport, a hole-transporting layer 213, a light-emitting layer 214, an electron-transporting layer 215, and an electron-injecting layer 216. Note that the structure of the EL layer 203 is not limited to the above structure as long as at least the layer for controlling the carrier transport 212 shown in this embodiment and the light-emitting layer 214 are included. That is, the structure of the EL layer 203 is not particularly limited. Thus, layers which contain a substance having a high electron-transporting property, a substance having a high hole-transporting property, a substance having a high electron-injecting property, a substance having a high hole-injecting property, a substance having a bipolar property (a substance with a high electron-transporting property and a high hole-transporting property), or the like may be appropriately combined with the layer for controlling the carrier transport and the light-emitting layer which are shown in this embodiment mode to form the EL layer 203. For example, the EL layer 203 can be formed in any combination of the hole-injecting layer, the hole-transporting layer, the light-emitting layer, the electron-transporting layer, the electron-injecting layer, and the like as long as both the layer for controlling the carrier transport 212 and the light-emitting layer 214 are included. Specific materials for forming each layer are shown below.

The hole-injecting layer 211 is a layer containing a substance having a high hole-injecting property. As a substance having a high hole-injecting property, molybdenum oxide, vanadium oxide, ruthenium oxide, tungsten oxide, manganese oxide, or the like can be used. Besides, the following can be also given as organic compounds with a low molecular-weight: phthalocyanine-based compounds such as phthalocyanine (abbreviation: $H_2PC$), copper(II) phthalocyanine (abbreviation: CuPc), and vanadyl(IV) phthalocyanine (VOPc); aromatic amine compounds such as 4,4',4''-tris(N, N-diphenylamino)triphenylamine (abbreviation: TDATA), 4,4',4''-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), and 3-[N-(1-naphthyl)-N-(9-phenylcarbazol-3-yl)amino]-9-phenylcarbazole (abbreviation: PCzPCN1); and the like.

Alternatively, the hole-injecting layer 211 can be formed using a composite material in which a substance having an acceptor property is mixed into a substance having a high hole-transporting property. Note that a material for forming the electrode can be selected regardless of its work function with the use of a composite material in which a substance having an acceptor property is mixed into a substance having a high hole-transporting property. That is, not only a material with a high work function but also a material with a low work function can be used for the first electrode 202. Such a composite material can be formed by co-depositing a substance having a high hole-transporting property and a substance having an acceptor property.

As an organic compound used for the composite material, various compounds such as aromatic amine compounds, carbazole derivatives, aromatic hydrocarbons, and compounds with a high molecular-weight (for example, oligomer, dendrimer, or polymer) can be used. The organic compound used for the composite material is preferably an organic compound having a high hole-transporting property. Specifically, a substance with a hole mobility of $10^{-6}$ cm$^2$/Vs or more is preferably used. However, other substances may be also used as long as the hole-transporting properties thereof are higher than the electron-transporting properties thereof. Specific organic compounds that can be used for the composite material are described below.

For example, the following organic compounds can be used for the composite material: aromatic amine compounds such as MTDATA, TDATA, DPAB, DNTPD, DPA3B, PCzPCA1, PCzPCA2, PCzPCN1, 4,4'-bis[N-(1-naphthyl)-N-phenylamino]biphenyl (abbreviation: NPB or α-NPD), and N,N'-bis(3-methylphenyl)-N,N'-diphenyl-[1,1'-biphenyl]-4,4'-diamine (abbreviation: TPD); carbazole derivatives such as 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), and 1,4-bis[4-(N-carbazolyl)phenyl-2,3,5,6-tetraphenylbenzene; and aromatic hydrocarbon compounds such as 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenyl anthracene (abbreviation: DPAnth), 2-tert-butylanthracene (abbreviation: t-BuAnth), 9,10-bis(4-methyl-1-naphthyl)anthracene (abbreviation: DMNA), 9,10-bis[2-(1-naphthyl)phenyl]-2-tert-butyl-anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, coronene, 4,4'-bis(2,2-diphenylvinyl)biphenyl (abbreviation: DPVBi), and 9,10-bis[4-(2,2-diphenylvinyl)phenyl]anthracene (abbreviation: DPVPA).

As a substance having an acceptor property, organic compounds such as 7,7,8,8-tetracyano-2,3,5,6-tetrafluoroquinodimethane (abbreviation: F$_4$-TCNQ) and chloranil, and a transition metal oxide can be given. In addition, oxides of metals belonging to Groups 4 to 8 in the periodic table can be also given. Specifically, it is preferable to use vanadium oxide, niobium oxide, tantalum oxide, chromium oxide, molybdenum oxide, tungsten oxide, manganese oxide, and rhenium oxide which have high electron-accepting properties. Among them, molybdenum oxide is particularly preferable because it is stable even in atmospheric air, has a low hygroscopic property, and is easy to handle.

As the hole-injecting layer 211, compounds with a high molecular-weight (for example, oligomer, dendrimer, or polymer) can be used. For example, the following compounds with a high molecular-weight can be used: poly(N-vinylcarbazole) (abbreviation: PVK), poly(-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), poly[N,N'-bis(4-butylphenyl)-N,N'-bis(phenyl)benzidine] (abbreviation: Poly-TPD), and the like. Further, high molecular compounds mixed with acid such as poly (3,4-ethylenedioxythiophene)/poly(styrenesulfonate) (PEDOT/PSS) and polyaniline/poly(styrenesulfonate) (PAni/PSS) can be also used.

Further, a composite material formed by using the above polymers such as PVK, PVTPA, PTPDMA, or Poly-TPD and the above-mentioned substance having an acceptor property can be used as the hole-injecting layer 211.

The layer 212 for controlling the carrier transport contains a first organic compound and a second organic compound, and a weight percent of the first organic compound is higher than that of the second organic compound.

The first organic compound is a so-called hole-transporting material which has a hole-transporting property higher than an electron-transporting property. Specifically, an aromatic amine compound can be used. For example, MTDATA, TDATA, DPAB, DNTPD, DPA3B, PCzPCA1, PCzPCA2, PCzPCN1, 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), and the like can be given. Further, a compound with a high molecular-weight such as PVK, PVTPA, PTPDMA, or Poly-TPD can be also used.

The second organic compound is an organic compound with a large dipole moment to which a hole is not injected. A hole-blocking material can be given as a substance in which a hole is not injected. In general, the hole-blocking material is a substance with a high ionization potential. In particular, a material whose ionization potential is greater than or equal to 5.8 eV is preferable because a hole is not injected to such a material. The ionization potential of greater than or equal to 6.0 eV is particularly preferable. Further, a material with an ionization potential which is 0.5 eV greater than that of the first organic compound is also preferable because a hole injected to the first compound is not transported to the second organic compound. Furthermore, the dipole moment of the second organic compound is preferably larger than or equal to 2.0 debye. In particular, the organic compound which has the dipole moment of much larger than 2.0 debye can be preferably used as the layer for controlling the carrier transport.

As the second organic compound, specifically, the following can be used: oxadiazole derivatives such as 1,3-bis[5-(p-tert-butylphenyl)-1,3,4-oxadiazol-2-yl]benzene (abbreviation: OXD-7) and 2-(4-biphenylyl)-5-(4-tert-butylphenyl)-1,3,4-oxadiazole (abbreviation: PBD); triazole derivatives such as 3-(4-biphenylyl)-4-phenyl-5-(4-tert-butylphenyl)-1,2,4-triazole (abbreviation: TAZ01) and 3,5-bis(4-tert-butylphenyl)-4-phenyl-1,2,4-triazole (abbreviation: t-BuTAZ); phenanthroline derivatives such as bathophenanthroline (abbreviation: BPhen) and bathocuproine (abbreviation: BCP); or the like.

Figure 4:
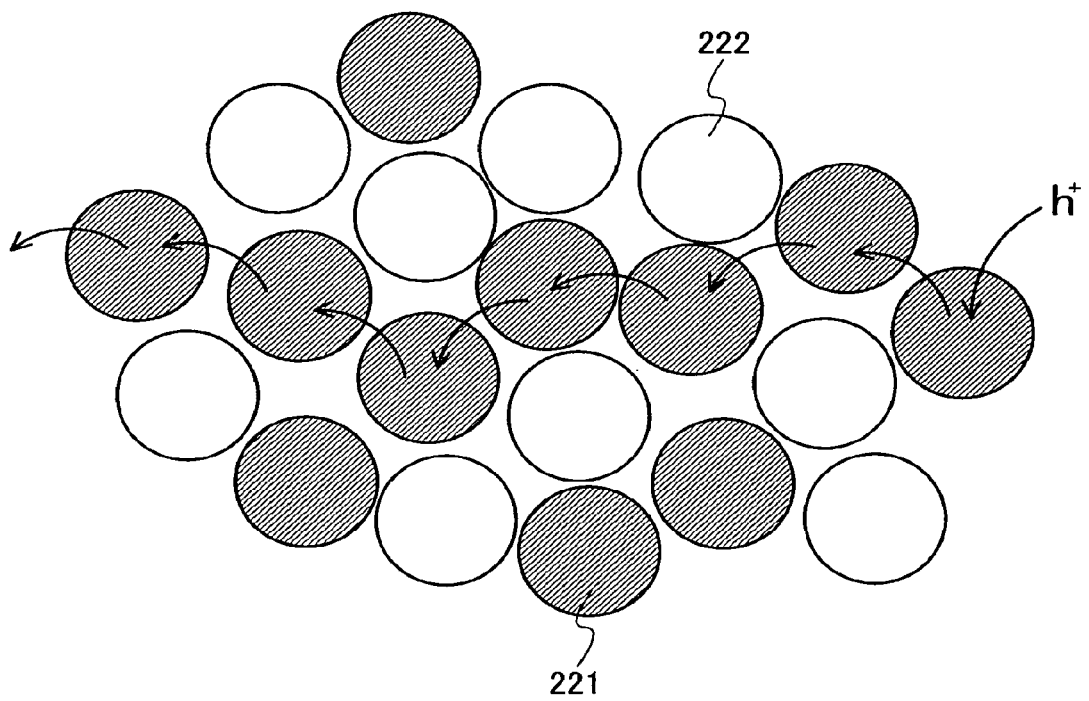
FIG. 4 is a view illustrating a light-emitting element of the present invention.

A conceptual view of the layer for controlling the carrier transport which is shown in this embodiment mode is illustrated in FIG. 4. In FIG. 4, a first organic compound 221 has a hole-transporting property; therefore, holes (h$^+$) are readily injected to the organic compound 221 and transported to the vicinal first organic compound.

On the other hand, a hole is not injected into a second organic compound 222 because the ionization potential of the second organic compound 222 is larger than that of the first organic compound and because the ionization potential difference between the second organic compound and the first organic compound is greater than or equal to 0.5 eV. Thus, a hole is not injected into the second organic compound and holes are transported by hopping between the first organic compounds.

Further, the second organic compound 222 is a substance with a large dipole moment. Specifically, the dipole moment is preferably greater than or equal to 2.0 debye. Inclusion of the second organic compound with a large dipole moment decreases the transporting rate of holes which are transported between the first organic compounds. That is, it is considered that the second organic compound with a large dipole moment which is located in vicinity of the first organic compound has an effect to retard the transport of holes.

Thus, by inclusion of the second organic compound, transport rate of holes in the layer comprising the first organic compound 221 becomes lower. In other words, addition of the second organic compound permits controlling the carrier transport. Further, transport rate of carriers can be tuned by controlling the concentration of the second organic compound.

In particular, increase in dipole moment of the second organic compound results in increase in the effect to reduce the transport rate of holes. Thus, in the case where a substance with a large dipole moment is used as the second organic compound, the effect can be sufficiently obtained even when a weight percent of the second organic compound contained in the layer for controlling the carrier transport is low.

As described above, control of the carrier transport allows the improvement in carrier balance, which results in improved recombination probability of holes and electrons; thus, high luminous efficiency can be obtained. Further, as shown in this embodiment mode, a structure in which the layer for controlling the carrier transport is provided between the light-emitting layer and the first electrode which functions as an anode is particularly effective for the light-emitting element in which excessive holes are readily formed upon driving. This is because a well-controlled carrier balance can be achieved by introducing the layer for controlling the carrier transport to the light-emitting element which tends to exist in the hole-excessive sate, which is contributed by the ability of the layer for controlling the carrier transport to retard the transport of holes.

Further, by control of transport of excessive holes, the number of cation which are formed in the light-emitting layer and vicinities thereof by excessive holes can be reduced. Since the cation serves as a quencher, decrease in luminous efficiency can be avoided by suppressing the cation formation.

Since a light-emitting element using an organic compound has excessive holes on driving in many cases, the present invention can be preferably applied to a number of light-emitting elements using an organic compound.

For example, in the case of a conventional light-emitting element where the layer 212 for controlling the carrier transport is not provided, holes are injected into the hole-transporting layer 213 without receiving the effect of the layer 212 to decelerate the transport of holes, which allows the holes to reach the light-emitting layer 214. In general, a light-emitting element using an organic compound readily exists in the hole-excessive state upon driving. In that case, the holes which cannot undergo the recombination with electrons pass through the light-emitting layer 214. When the holes pass through the light-emitting layer 214, the holes reach the vicinities of the interface between the light-emitting layer 214 and the electron-transporting layer 215. Therefore, a light-emitting region is formed in the vicinities of the interface between the light-emitting layer 214 and the electron-transporting layer 215; thus, the recombination probability of the light-emitting layer 214 and luminous efficiency decrease. Further, when the holes reach the electron-transporting layer 215, the electron-transporting layer 215 is readily deteriorated. When the number of holes which reach the electron-transporting layer 215 is increased over, time, the recombination probability is reduced over time, which results in reduction in element lifetime (luminance decay over time).

In the light-emitting element of the present invention, holes injected from the first electrode 202 pass through the hole-injecting layer 211, and are injected into the layer 212 for controlling the carrier transport. Transport rate of the holes injected into the layer 212 for controlling the carrier transport is decreased, and the hole injection to the hole-transporting layer 213 is retarded. Therefore, the hole injection to the light-emitting layer 214 is controlled. As a result, the light-emitting region is formed at around the center of the light-emitting layer 214 in the light-emitting element of the present invention, whereas the light-emitting region is normally formed in the vicinities of the interface between the light-emitting layer 214 and the electron-transporting layer 215 in a conventional light-emitting element. Therefore, the possibility that the holes reach the electron-transporting layer 215, which promotes deterioration of the electron-transporting layer 215, is reduced.

It is important in the present invention that an organic compound having a hole-transporting property is added with an organic compound which reduces a hole-transporting property, instead of just applying a substance with low hole mobility in the layer 212 for controlling the carrier transport. Such a structure permits suppressing the change over time of the initially well-controlled number of the injected holes, in addition to just controlling the hole-injection into the light-emitting layer. Accordingly, in the light-emitting element of the present invention, a phenomenon can be prevented, in which carrier balance is deteriorated over time and recombination probability is decreased, which results in extension of element lifetime (suppression of luminance decay over time).

In the light-emitting element of the present invention, a light-emitting region is hard to be formed at the interface between the light-emitting layer and the hole-transporting layer or at the interface between the light-emitting layer and the electron-transporting layer. Therefore, the light-emitting element is hardly deteriorated because the light-emitting region is not located in a region close to the hole-transporting layer or the electron-transporting layer. Further, change in carrier balance over time (particularly, change over time of the number of injected electron) can be suppressed. Therefore, a light-emitting element with negligible deterioration and a long lifetime can be obtained.

Note that a concentration of the second organic compound in the layer for controlling the carrier transport is preferably greater than or equal to 1 wt % and less than or equal to 20 wt %. This concentration range allows the formation of the light-emitting element with a lifetime. In particular, it is more preferred that the concentration of the second organic compound is greater than or equal to 1 wt % and less than or equal to 10 wt %.

The thickness of the layer for controlling the carrier transport is preferably greater than or equal to 1 nm and less than or equal to 20 nm. When the layer for controlling the carrier transport is too thick, the transport rate of carriers is excessively decreased, which results in high driving voltage. When the layer for controlling the carrier transport is too thin, on the other hand, it is impossible to implement the function of controlling the carrier transport. Therefore, the thickness of the layer for controlling the carrier transport is preferably greater than or equal to 1 nm and less than or equal to 20 nm.

The hole-transporting layer 213 is a layer containing a substance having a high hole-transporting property. As the substance having a high hole-transporting property, specifically, as a organic compound with a low molecular-weight, an aromatic amine compound such as NPB (or α-NPD), TPD, 4,4'-bis[N-(9,9-dimethylfluoren-2-yl)-N-phenylamino]biphenyl (abbreviation: DFLDPBi), or 4,4'-bis[N-(spiro-9,9'-bifluoren-2-yl)-N-phenylamino]biphenyl (abbreviation: BSPB) can be used. The substances described here has a mobility of $10^{-6}$ cm$^2$/Vs or more. However, substances other than the above substances may be also used as long as the hole-transporting properties thereof are higher than the electron-transporting properties thereof. Note that the layer containing the substance having a high hole-transporting property is not limited to be a single layer but may exist in a stacked form in which two or more layers formed of the above substances are stacked.

As the hole-transporting layer 213, the compound with a high molecular-weight such as PVK, PVTPA, PTPDMA, or Poly-TPD can be used.

The light-emitting layer 214 is a layer containing a highly light-emissive substance, which can be formed using various materials. The compounds describe below are exemplified as organic compounds with a low molecular-weight. For example, as a light-emitting material which exhibits bluish light, the following can be used: N,N'-bis[4-(9H-carbazol-9-yl)phenyl]-N,N'-diphenylstilbene-4,4'-diamine (abbreviation: YGA2S); 4-(9H-carbazol-9-yl)-4'-(10-phenyl-9-anthryl)triphenylamine (abbreviation: YGAPA), and the like. In addition, as a light-emitting material which exhibits greenish light emission, the following can be used: N-(9,10-diphenyl-2-anthryl)-N,9-diphenyl-9H-carbazol-3-amine (abbreviation: 2PCAPA); N-[9,10-bis(1,1'-biphenyl-2-yl)-2-anthryl]-N,9-diphenyl-9H-carbazol-3-amine (abbreviation: 2PCABPhA); N-(9,10-diphenyl-2-anthryl)-N,N',N'-triphenyl-1,4-phenylenediamine abbreviation: 2DPAPA); N-[9,10-bis(1,1'-biphenyl-2-yl)-2-anthryl]-N,N',N'-triphenyl-1,4-phenylenediamine (abbreviation: 2DPABPhA); N-[9,10-bis(1,1'-biphenyl-2-yl)]-N-[4-(9H-carbazol-9-yl)phenyl]-N-phenylanthracen-2-amine (abbreviation: 2YGABPhA); N,N,9-triphenylanthracen-9-amine (abbreviation: DPhAPhA); and the like. Moreover, as a light-emitting material which exhibits yellowish light emission, rubrene, 5,12-bis(1,1'-biphenyl-4-yl)-6,11-diphenyltetracene (abbreviation: BPT), and the like can be used. As a light-emitting material which exhibits reddish light emission, N,N,N',N'-tetrakis(4-methylphenyl)tetracene-5,11-diamine (abbreviation: p-mPhTD); 7,13-diphenyl-N,N',N',N'-tetrakis(4-methylphenyl)acenaphtho[1,2-a]fluoranthene-3,10-diamine (abbreviation: p-mPhAFD), and the like can be used. Alternatively, a phosphorescent material such as bis[2-(2'-benzo[4,5-a]thienyl)pyridinato-N,C$^{3'}$]iridium(III)acetylacetonate (abbreviation: Ir(btp)$_2$(acac)) can be also used.

Note that the light-emitting layer may also have a structure in which the above highly light-emissive substance is dispersed in another substance. Various substances can be used for the material in which the light-emissive substance is dispersed. In particular, it is preferable to use a substance whose lowest unoccupied molecular orbital (LUMO) level is higher than that of the light-emissive substance and whose highest occupied molecular orbital (HOMO) level is lower than that of the light-emissive substance.

Specifically, the following metal complexes can be used: tris(8-quinolinolato)aluminum(III) (abbreviation: Alq); tris(4-methyl-8-quinolinolato)aluminum(III) (abbreviation: Almq$_3$); bis(10-hydroxybenzo[h]-quinolinato)beryllium(II) (abbreviation: BeBq$_2$); bis(2-methyl-8-quinolinolato)(4-phenylphenolato)aluminum(III), (BAlq); bis(8-quinolinolato)zinc(II) (abbreviation: Znq); bis[2-(2-benzoxazolyl)phenolato]zinc(II) (Abbreviation: ZnPBO); bis[2-(2-benzothiazolyl)phenolato]zinc(II) (abbreviation: Zn(BTZ)$_2$); and the like. Further, the following heterocyclic compounds can be also used: 2-(4-biphenylyl)-5-(4-tert-butylphenyl)-1,3,4-oxadiazole (abbreviation: PBD); 1,3-bis[5-(p-tert-butylphenyl)-1,3,4-oxadiazol-2-yl]benzene (abbreviation: OXD-7); 3-(4-biphenylyl)-4-phenyl-5-(4-tert-butylphenyl)-1,2,4-triazole (abbreviation: TAZ); 2,2',2"-(1,3,5-benzenetriyl)-tris(1-phenyl-1H-benzimidazole) (abbreviation: TPBI); bathophenanthroline (abbreviation: BPhen); bathocuproine (abbreviation: BCP); and the like. Furthermore, the following condensed aromatic compounds can be also used: 9-[4-(10-phenyl-9-anthryl)phenyl]-9H-carbazole (abbreviation: CzPA); 3,6-diphenyl-9-[4-(10-phenyl-9-anthryl)phenyl]-9H-carbazole (abbreviation: DPCzPA); 9,10-bis(3,5-diphenylphenyl)anthracene (abbreviation: DPPA); 9,10-di(2-naphthyl)anthracene (abbreviation: DNA); 2-tert-butyl-9,10-di(2-naphthyl)anthracene (abbreviation: t-BuDNA); 9,9'-bianthryl (abbreviation: BANT); 9,9'-(stilben-3,3'-di yl)diphenanthrene (abbreviation: DPNS); 9,9'-(stilben-4,4'-diyl)diphenanthrene (abbreviation: DPNS2); 3,3',3"-(benzene-1,3,5-triyl)tripyrene (abbreviation: TPB3); 9,10-diphenylanthracene (abbreviation: DPAnth); 6,12-dimethoxy-5,11-diphenylchrysene; and the like. Alternatively, the following aromatic amine compounds can be used: N,N-dipheyl-9-[4-(10-phenyl-9-anthryl)phenyl]-9H-carbazol-3-amine (abbreviation: CzA1PA); 4-(10-phenyl-9-anthryl)triphenylamine (abbreviation: DPhPA); N,9-diphenyl-N-[4-(10-phenyl-9-anthryl)phenyl]-9H-carbazol-3-amine (abbreviation: PCAPA); N,9-diphenyl-N-{4-[4-(10-phenyl-9-anthryl)phenyl]phenyl}9H-carbazol-3-amine (abbreviation: PCAPBA); N-(9,10-diphenyl-2-anthryl)-N,9-diphenyl-9H-carbazol-3-amine (abbreviation: 2PCAPA); NPB (or α-NPD); TPD; DFLDPBi; BSPB; and the like.

As a material in which the light-emissive substance is dispersed, plural kinds of materials can be used. For example, a substance such as rubrene or like, which suppresses the crystallization of the light-emissive layer, can be further added in order to suppress the crystallization of the light emissive substrate. In addition, NPB, Alq, or the like may be further added in order to efficiently transfer energy to the light-emissive substance.

When a structure in which a highly light-emissive substance is dispersed in another substance is employed, the crystallization of the light-emitting layer 214 can be suppressed. Further, concentration quenching which results from the high concentration of the highly light-emissive substance can be also suppressed.

Compounds with a high molecular-weight can be also used for the light-emitting layer 214. Specifically, as a light-emitting material which exhibits bluish light emission, the following can be used: poly(9,9-dioctylfluorene-2,7-diyl) (abbreviation: POF); poly[(9,9-dioctylfluorene-2,7-diyl-co-(2,5-dimethoxybenzene-1,4-diyl)] (abbreviation: PF-DMOP); poly{(9,9-dioctylfluorene-2,7-diyl)-co-[N,N'-di-(p-butylphenyl)-1,4-diaminobenzene]} (abbreviation: TAB-PFH); and the like. As a light-emitting material which exhibits greenish light emission, the following can be used: poly(p-phenylenevinylene) (abbreviation: PPV); poly[(9,9-dihexylfluorene-2,7-diyl)-alt-co-(benzo[2,1,3]thiadiazol-4,7-diyl)] (abbreviation: PFBT); poly[(9,9-dioctyl-2,7-divinylenefluorenylene)-alt-co-(2-methoxy-5-(2-ethylhexyloxy)-1,4-phenylene)]; and the like. As a light-emitting material which exhibits orangish to reddish light emission, the following can be used: poly[2-methoxy-5-(2'-ethylhexoxy)-1,4-phenylenevinylene] (abbreviation: MEH-PPV); poly(3-butylthiophene-2,5-diyl); poly{[9,9-dihexyl-2,7-bis(1-cyanovinylene)fluorenylene]-alt-co-[2,5-bis(N,N'-diphenyl amino)-1,4-phenylene]}; poly{[2-methoxy-5-(2-ethylhexyloxy)-1,4-bis(1-cyanovinylenephenylene)]-alt-co-[2,5-bis(N,N'-diphenylamino)-1,4-phenylene]} (abbreviation: CN-PPV-DPD); and the like.

The electron-transporting layer 215 is a layer containing a substance having a high electron-transporting property. For example, as organic compounds with a low molecular-weight, the following metal complexes can be used: tris(8-quinolinolato)aluminum(III) (abbreviation: Alq); tris(4-methyl-8-quinolinolato)aluminum(III) (abbreviation: Almq$_3$); bis(10-hydroxybenzo[h]-quinolinato)beryllium(II) (abbreviation: BeBq$_2$); bis(2-methyl-8-quinolinolato)(4-phenylphenolato)aluminum(III) (BAlq); bis(8-quinolinolato)zinc(II) (abbreviation: Znq); bis[2-(2-benzoxazolyl)

phenolato]zinc(II) (Abbreviation: ZnPBO); bis[2-(2-benzothiazolyl)phenolato]zinc(II) (abbreviation: $Zn(BTZ)_2$); and the like. Further, the following heterocyclic compounds can be also used: 2-(4-biphenylyl)-5-(4-tert-butylphenyl)-1,3,4-oxadiazole (abbreviation: PBD); 1,3-bis[5-(p-tert-butylphenyl)-1,3,4-oxadiazol-2-yl]benzene (abbreviation: OXD-7); 3-(4-biphenylyl)-4-phenyl-5-(4-tert-butylphenyl)-1,2,4-triazole (abbreviation: TAZ01); 2,2',2"-(1,3,5-benzenetriyl)-tris(1-phenyl-1H-benzimidazole) (abbreviation: TPBI); bathophenanthroline (abbreviation: BPhen); bathocuproine (abbreviation: BCP); and the like. The substances described here are substances with a mobility of $10^{-6}$ cm2/Vs or more. Note that substances other than the above substances may be also used as the electron-transporting layer as long as the electron-transporting properties thereof are higher than the hole-transporting properties thereof. Further, the electron-transporting layer is not limited to be a single layer but may have a stacked structure in which two or more layers formed of the above substances are stacked.

Further, the electron-transporting layer 215 can be also formed using a compound with a high molecular-weight. For example, the following can be used: poly[(9,9-dihexylfluorene-2,7-diyl)-co-(pyridin-3,5-diyl)] (abbreviation: PF-Py), poly[(9,9-dioctyllfluorene-2,7-diyl)-co-(2,2'-pyridin-6,6'-diyl)] (abbreviation: PF-BPy), and the like.

The electron-injecting layer 216 is a layer containing a substance which has a high ability to promote electron-injection from the second electrode 204 to the EL layer 203. As a substance having such an ability, alkali metals, alkaline earth metals, or compounds thereof can be used such as lithium fluoride (LiF), cesium fluoride (CsF), and calcium fluoride ($CaF_2$). For example, it is possible to use a layer formed of a substance having an electron-transporting property in which an alkali earth metal, an alkaline earth metal, or a compound thereof is mixed, such as a mixture of Alq and magnesium (Mg). It is preferable to use the layer formed of a substance having an electron-transporting property in which an alkali earth metal, an alkaline earth metal, or a compound thereof is mixed is used because electrons can be efficiently injected from the second electrode 204.

The second electrode 204 is preferably formed using a substance with a low work function (specifically, 3.8 eV or less) such as metals, alloys, electrically conductive compounds, or a mixture thereof. Specific examples of such a cathode material include an element belonging to Group 1 or 2 of the periodic table, that is, alkali metals such a lithium (Li) and cesium (Cs) and alkaline earth metals such as magnesium (Mg), calcium (Ca), and strontium (Sr), and alloys thereof (for example, MgAg and AlLi). Rare earth metals such as europium (Eu) and ytterbium (Yb), alloys thereof, and the like can be also used. A film made of an alkali metal, an alkaline earth metal, or an alloy thereof can be formed by a vacuum deposition method. Further, a film formed of an alloy of an alkali metal or an alkaline earth metal can be formed by a sputtering method. It is also possible to deposit a metal paste such as a silver paste by an ink-jet method or the like.

When the electron-injecting layer 216 which is a layer having a function of promoting electron injection is provided between the second electrode 204 and the electron-transporting layer 215, the second electrode 204 can be formed using various conductive materials such as Al, Ag, ITO, and ITO containing silicon or silicon oxide, regardless of their work functions. Such conductive materials can be deposited by a sputtering method, an ink-jet method, a spin coating method, or the like.

As a method forming the EL layer, various methods can be used regardless of a dry process or a wet process. For example, a vacuum deposition method, an ink-jet method, a spin coating method, or the like can be used. Further, different deposition methods may be used for different electrodes or different layers.

For example, among the above materials, a compound with a high molecular-weight may be selected to form the EL layer by a wet process. Alternatively, an organic compound with a low molecular-weight may be selected to form the EL layer by a wet process. Further, it is also possible to form the EL layer by depositing an organic compound with a low molecular-weight by using a dry process such as a vacuum deposition method.

Similarly, the electrodes can be formed by a wet process such as a sol-gel process or by a wet process with a paste of a metal material. Alternatively, the electrodes can be formed by a dry process such as a sputtering method or a vapor deposition method.

For example, in the case where the light-emitting element of the present invention is applied to a display device and its light-emitting layer is selectively deposited according to each color, the light-emitting layer is preferably formed by a wet process. When the light-emitting layer is formed by an ink-jet method, selective deposition of the light-emitting layer for each color can be easily performed even when a large substrate is used.

In the light-emitting element of the present invention having the above structure, current flows due to a potential difference applied between the first electrode 202 and the second electrode 204, whereby holes and electrons are recombined in the EL layer 203 and light emission is obtained.

Figure 3A:
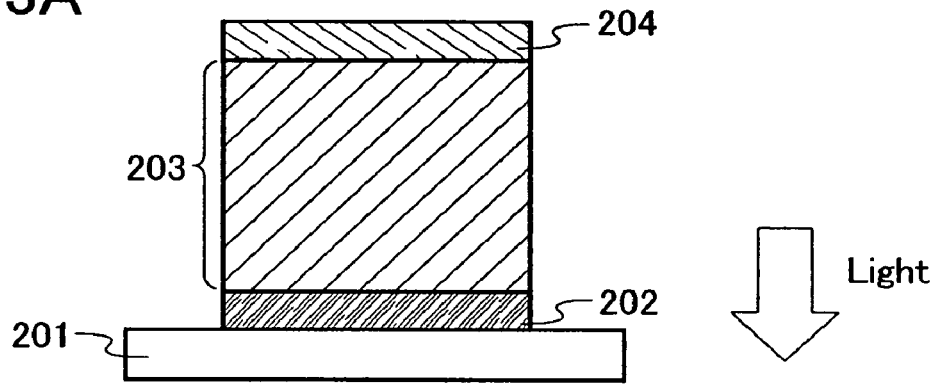
FIGS. 3A to 3C are views each illustrating a light-emitting element of the present invention.
Figure 3B:
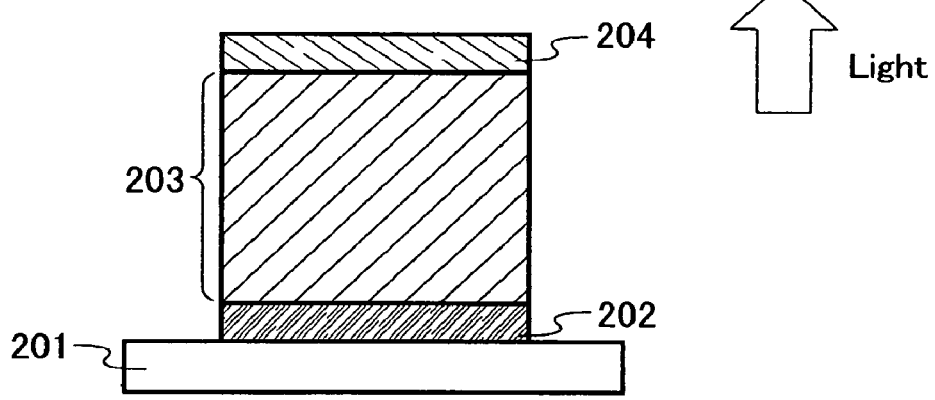
Figure 3C:
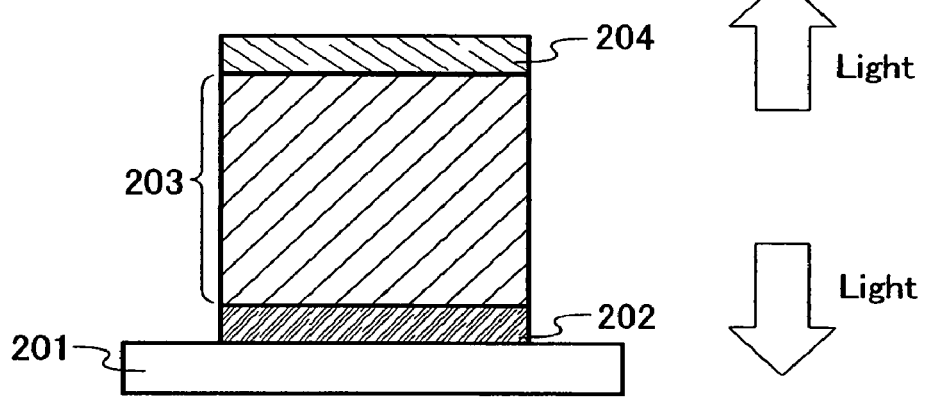

Light emission is extracted outside through one or both the first electrode 202 and the second electrode 204. Therefore, one or both the first electrode 202 and the second electrode 204 are light-transmitting electrodes. When only the first electrode 202 is a light-transmitting electrode, light emission is extracted from the substrate side through the first electrode 202 as illustrated in FIG. 3A. Meanwhile, when only the second electrode 204 is a light-transmitting electrode, light emission is extracted from a side opposite to the substrate side through the second electrode 204 as illustrated in FIG. 3B. When both the first electrode 202 and the second electrode 204 are light-transmitting electrodes, light emission is extracted from both the substrate side and the side opposite to the substrate side through the first electrode 202 and the second electrode 204 as illustrated in FIG. 3C.

Note that the structure of the layers provided between the first electrode 202 and the second electrode 204 is not limited to the above structure. Any structure other than the above structure may be employed as long as a light-emitting region in which holes and electrons are recombined is provided apart from the first electrode 202 and the second electrode 204 in order to prevent quenching which occurs when the light-emitting region is close to the electrodes, and as long as the layer for controlling the carrier transport is provided.

That is, the structure of the layers provided between the first electrode 202 and the second electrode 204 is not particularly limited. Thus, layers which contain a substance having a high electron-transporting property, a substance having a high hole-transporting property, a substance having a high electron-injecting property, a substance having a high hole-injecting property, and a substance having a bipolar property (a substance with a high electron-transporting property and a hole-transporting property), or the like may be appropriately combined with the layer for controlling the carrier transport and the light-emitting layer which are shown in this embodiment mode.

Note that the layer for controlling the carrier transport shown in this embodiment mode is a layer for controlling the transport of holes. Therefore, it is preferable to provide the layer for controlling the carrier transport between the anode and the light-emitting layer.

When a layer is formed between the light-emitting layer 214 and the layer 212 for controlling the carrier transport as illustrated in FIG. 1A, that is, when the light-emitting layer 214 and the layer 212 for controlling the carrier transport are not in contact with each other, undesired interaction which occurs between the light-emitting layer 214 and the layer 212 for controlling the carrier transport can be suppressed. Therefore, such a structure is preferable because deterioration of the light-emitting element can be suppressed.

Figure 1B:
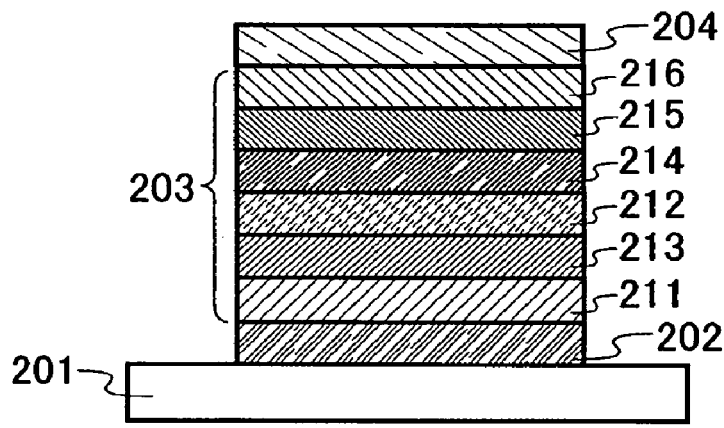

As illustrated in FIG. 1B, a structure in which the light-emitting layer 214 and the layer 212 for controlling the carrier transport are in contact with each other may be employed. In this structure, it is preferable to use an organic compound, in which electrons are not easily injected and a band gap thereof is higher than that of an organic compound having the highest weight percent among the organic compounds contained in the light-emitting layer 214. In this case, the light-emitting layer 214 and the layer 212 for controlling the carrier transport can be successively formed with the same mask. Thus, this structure is preferred in manufacturing a full-color display or the like where selective formation of the layer for controlling the carrier transport is required separately for each light-emitting element, because this structure facilitates the manufacture thereof.

Figure 2A:
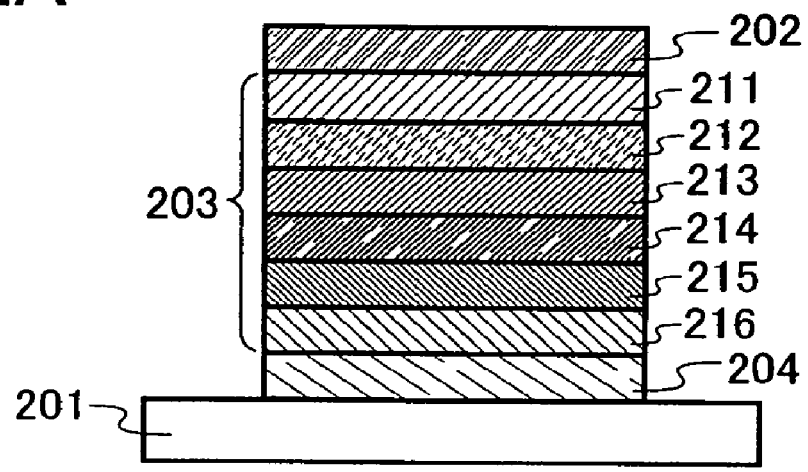
FIGS. 2A and 2B are views each illustrating a light-emitting element of the present invention.
Figure 2B:
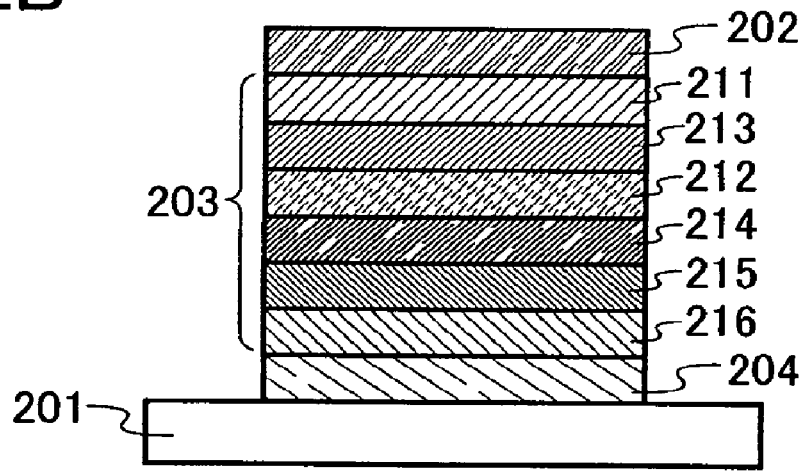

The light-emitting elements illustrated in FIGS. 2A and 2B each have a structure in which the second electrode 204 which functions as a cathode, the EL layer 203, and the first electrode 202 which functions as an anode are sequentially stacked over the substrate 201. The light-emitting element illustrated in FIG. 2A has a structure in which the layers of the EL layer illustrated in FIG. 1A are stacked in a reverse order, that is, the electron-injecting layer 216, the electron-transporting layer 215, the light-emitting layer 214, the hole-transporting layer 213, the layer 212 for controlling the carrier transport, and the hole-injecting layer 211 are sequentially stacked. The light-emitting element illustrated in FIG. 2B has a structure in which the layers of the EL layer illustrated in FIG. 1B are stacked in a reverse order, that is the electron-injecting layer 216, the electron-transporting layer 215, the light-emitting layer 214, the layer 212 for controlling the carrier transport, the hole-transporting layer 213, and the hole-injecting layer 211 are sequentially stacked.

In this embodiment mode, the light-emitting element is formed over a substrate made of glass, plastic, or the like. When a plurality of such light-emitting elements is formed over one substrate, a passive matrix type light-emitting device can be manufactured. Alternatively, it is also possible to form, for example, thin film transistors (TFTs) over a substrate made of glass, plastic, or the like and form light-emitting elements on electrodes that are electrically connected to the TFTs. Accordingly, an active matrix type light-emitting device in which drive of the light-emitting elements is controlled with the TFTs can be manufactured. Note that the structure of the TFTs is not particularly limited. Either staggered TFTs or inversely staggered TFTs may be employed. Further, a driver circuit formed on the TFT substrate may be formed from both N-channel and P-channel TFTs or from one of N-channel and P-channel TFTs. Furthermore, the crystallinity of a semiconductor film used for forming the TFTs is not specifically limited. Either an amorphous semiconductor film or a crystalline semiconductor film may be used.

A light-emitting element of the present invention includes a layer for controlling the carrier transport. The layer for controlling the carrier transport contains at least two kinds of substances. Therefore, by selecting the combination of substances and controlling the mixture ratio thereof, the thickness of the layer, or the like, carrier balance can be precisely controlled.

Since the carrier balance can be controlled by selecting the combination of substances and by controlling the mixture ratio thereof, the thickness of the layer, or the like, the carrier balance can be more easily controlled than in a conventional light-emitting element. That is, the transport of carriers can be controlled by controlling the mixture ratio of the substances, the thickness of the layer, or the like, without replacing the substances with a different one.

By improving the carrier balance with the layer for controlling the carrier transport, the luminous efficiency of the light-emitting element can be improved.

Further, using the layer for controlling the carrier transport makes it possible to prevent excessive holes from being injected and also to prevent holes from penetrating the light-emitting layer to reach the electron-transporting layer or the electron-injecting layer. When holes reach the electron-transporting layer or the electron-injecting layer, the recombination probability in the light-emitting layer decreases (in other words, carrier balance is lost). This phenomenon results in decrease in luminous efficiency. Further, decrease in luminous efficiency over time is caused. That is, the lifetime of the light-emitting element is decreased.

However, by using the layer for controlling the carrier transport as shown in this embodiment mode, it becomes possible to prevent excessive holes from being injected and also to prevent holes from penetrating the light-emitting layer to reach the electron-transporting layer or the electron-injecting layer. Further, a decrease in luminous efficiency over time can be suppressed. That is, a long-lifetime light-emitting element can be obtained.

In the present invention, among the two or more kinds of substances contained in the layer for controlling the carrier transport, the second organic compound which has a lower weight percent than the first organic compound is used for controlling the carrier transport. Therefore, the transport of carriers can be controlled with a component having the lowest concentration among the components contained in the layer for controlling the carrier transport. Thus, a long-lifetime light-emitting element which does not easily deteriorate over time can be obtained. Namely, the carrier balance hardly changes compared with the case where the carrier balance is controlled with a single substance. For example, when the transport of carriers is controlled by a layer formed of a single substance, the carrier balance of the whole layer is changed by a partial change in morphology, partial crystallization, or the like. Therefore, such a light-emitting element will readily deteriorate over time. However, as shown in this embodiment mode, when the transport of carriers is controlled with a component having the lowest weight percent among the components contained in the layer for controlling the carrier transport, it is possible to reduce the effects of morphological change, crystallization, aggregation, or the like, whereby deterioration over time can be suppressed. Therefore, a long-lifetime light-emitting element in which the luminous efficiency will not readily decrease over time can be obtained.

As shown in this embodiment mode, a structure in which the layer for controlling the carrier transport is provided between the light-emitting layer and the second electrode which functions as a cathode is particularly effective for a light-emitting element which readily exists in the hole-excessive state upon driving. Since a light-emitting element using an organic compound tends to take the hole-excessive state in many cases, the present invention can be preferably applied to a number of light-emitting elements using an organic compound.

Note that this embodiment mode can be combined with other embodiment modes as appropriate.

Embodiment Mode 2

This embodiment mode will describe a mode of a light-emitting element in which a plurality of light-emitting units according to the present invention are stacked (hereinafter, referred to as a stacked type element) with reference to FIG. 5. This light-emitting element is a light-emitting element including a plurality of light-emitting units between a first electrode and a second electrode.

Figure 5:
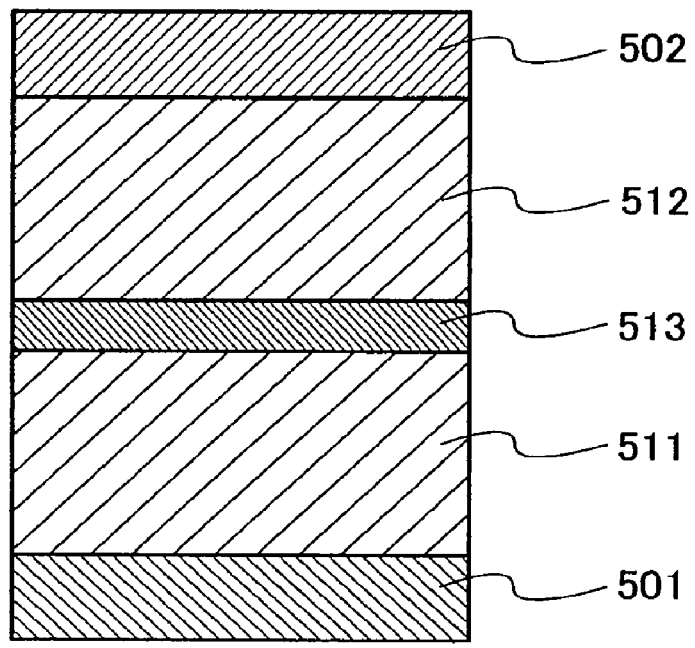
FIG. 5 is a view illustrating a light-emitting element of the present invention.

In FIG. 5, a first light-emitting unit 511 and a second light-emitting unit 512 are stacked between a first electrode 501 and a second electrode 502. As to the first electrode 501 and the second electrode 502, similar electrodes to those shown in Embodiment Mode 1 can be applied. The first light-emitting unit 511 and the second light-emitting unit 512 may each have the same structure or different structure, and a similar structure to that shown in Embodiment Mode 1 can be employed.

A charge generation layer 513 contains a composite material of an organic compound and a metal oxide. The composite material of an organic compound and a metal oxide is the composite material shown in Embodiment Mode 1, and includes an organic compound and a metal oxide such as $V_2O_5$, $MoO_3$, or $WO_3$. As the organic compound, various compounds such as an aromatic amine compound, a carbazole derivative, aromatic hydrocarbon, and a compound with a high molecular-weight (oligomer, dendrimer, polymer, or the like) can be used. As the organic compound, it is preferable to use the organic compound which has a hole-transporting property with a hole mobility of $10^{-6}$ cm$^2$/Vs or more. However, other substances than the materials described above may be also used as long as the substances have hole-transporting properties higher than the electron transporting properties. The composite material of the organic compound and the metal oxide can achieve low-voltage driving and low-current driving because of the superior carrier-injecting property and carrier-transporting property.

Note that the charge generation layer 513 may be formed by combination of a composite material of the organic compound and the metal oxide with other materials. For example, a layer containing a composite material of the organic compound and the metal oxide may be combined with a layer containing one compound selected from substances having an electron-donating property and a compound having a high electron transporting property. Further, a layer containing a composite material of the organic compound and the metal oxide may be combined with a transparent conductive film.

In any case, any kind of structure is acceptable as long as the charge generation layer 513 interposed between the first light-emitting unit 511 and the second light-emitting unit 512 is capable of injecting electrons into one of these light-emitting units and holes into the other when voltage is applied to the first electrode 501 and the second electrode 502.

Although this embodiment mode describes the light-emitting element having two light-emitting units, the present invention can be similarly applied to a light-emitting element in which three or more light-emitting units are stacked. When the charge generation layer is provided between the pair of electrodes so as to partition the plural light-emitting units like the light-emitting element of this embodiment mode, it is possible to provide a light-emitting element which exhibits a high luminance at a low current density and a long lifetime. Thus, such a light-emitting element can be applied for illumination.

The light-emitting units can be designed to emit light having different colors from each other, thereby obtaining light emission of a desired color from the whole light-emitting element. For example, in a light-emitting element having two light-emitting units, the emission colors of the first light-emitting unit and the second light-emitting unit are made complementary, so that a white-emissive light-emitting element can be obtained. Note that the word "complementary" refers to the color relationship in which an achromatic color is obtained when colors are mixed. That is, mixing of complementarily colored light gives white light. The same relationship can be applied to a light-emitting element having three light-emitting units. For example, when the first light-emitting unit emits red light, the second light-emitting unit emits green light, and the third light-emitting unit emits blue light, white light can be emitted from the light-emitting element.

Note that this embodiment mode can be combined with other embodiment modes as appropriate.

Embodiment Mode 3

This embodiment mode will describe a light-emitting device having a light-emitting element of the present invention.

Figure 6A:
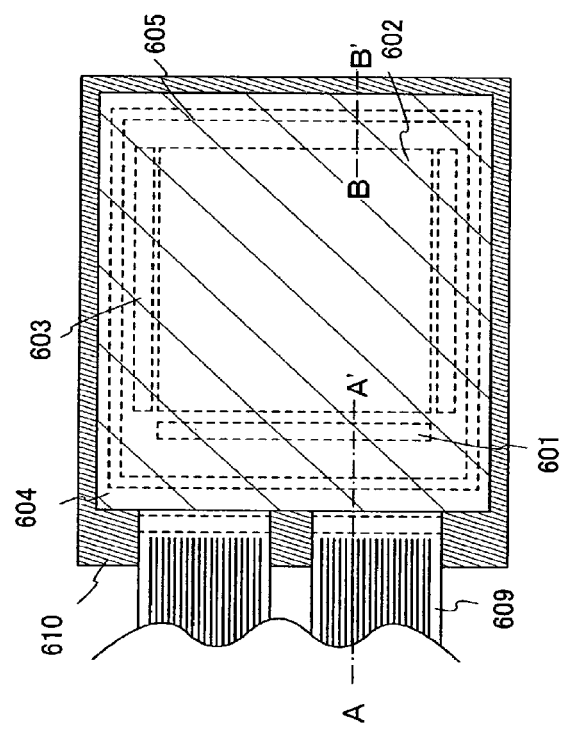
FIGS. 6A and 6B are views illustrating a light-emitting device of the present invention.
Figure 6B:
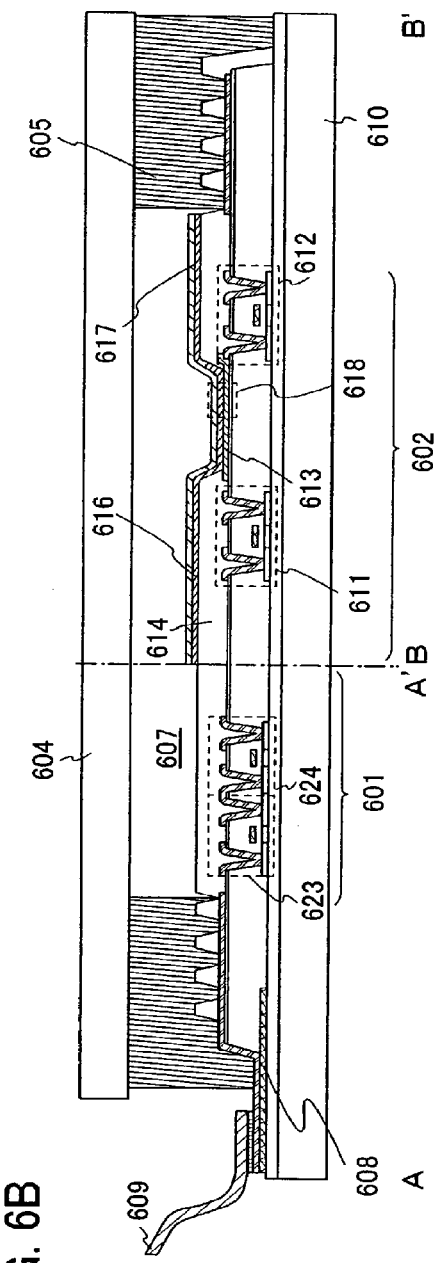

This embodiment mode describes a light-emitting device having a light-emitting element of the present invention in a pixel portion, with reference to FIGS. 6A and 6B. FIG. 6A is a top view illustrating a light-emitting device while FIG. 6B is a cross-sectional view taken along lines A-A' and B-B' of FIG. 6A. The light-emitting device includes a driver circuit portion (source-side driver circuit) 601, a pixel portion 602, and a driver circuit portion (gate-side driver circuit) 603 which are illustrated with dotted lines. These units control light emission of the light-emitting element. In addition, reference numeral 604 denotes a sealing substrate; 605, a sealing material; and 607, a space surrounded by the sealing material 605.

A leading wire 608 is to transmit a signal to be inputted to the source-side driver circuit 601 and the gate-side driver circuit 603, and receive a video signal, a clock signal, a start signal, a reset signal, and the like from an FPC (Flexible Printed Circuit) 609, which serves as an external input terminal. Although only the FPC is illustrated here, this FPC may be provided with a printed wiring board (PWB). The light-emitting device in this specification includes not only a light-emitting device itself but also a light-emitting device with an FPC or a PWB attached thereto.

Next, a cross-sectional structure is described with reference to FIG. 6B. The driver circuit portion and the pixel portion are formed over an element substrate 610. Here, the source-side driver circuit 601, which is the driver circuit portion, and one pixel in the pixel portion 602 are illustrated.

A CMOS circuit, which is a combination of an N-channel TFT 623 and a P-channel TFT 624, is formed as the source-side driver circuit 601. The driver circuit may be formed using various kinds of CMOS circuits, PMOS circuits, and NMOS circuits. Although a driver-integration type device, in which a driver circuit is formed over the same substrate as a pixel portion, is shown in this embodiment mode, a driver circuit is not necessarily formed over the same substrate as a pixel portion and can be formed outside the substrate.

The pixel portion 602 has a plurality of pixels, each of which includes a switching TFT 611, a current-controlling TFT 612, and a first electrode 613 which is electrically connected to a drain of the current-controlling TFT 612. Note that an insulator 614 is formed so as to cover an end portion of the first electrode 613. Here, a positive photosensitive acrylic resin film is used for the insulator 614.

The insulator 614 is formed so as to have a curved surface having curvature at an upper end portion or a lower end portion thereof in order to obtain favorable coverage. For example, in the case of using a positive photosensitive acrylic resin as a material for the insulator 614, the insulator 614 is preferably formed so as to have a curved surface with a curvature radius (0.2 to 3 μm) only at the upper end portion thereof. Either a negative photoresist which becomes insoluble in an etchant by light irradiation or a positive photoresist which becomes soluble in an etchant by light irradiation can be used for the insulator 614.

An EL layer 616 and a second electrode 617 are formed over the first electrode 613. Various metals, alloys, electrically conductive compounds, and mixture thereof can be used for a material for forming the first electrode 613. When the first electrode 613 is used as an anode, it is particularly preferable to select a material with a high work function (a work function of 4.0 eV or more) among such metals, alloys, electrically conductive compounds, and mixture thereof. For example, the first electrode 613 can be formed by using a single-layer film such as a film made of ITO containing silicon, a film made of indium zinc oxide (IZO), a titanium nitride film, chromium film, a tungsten film, a Zn film, or a Pt film; a stacked layer of a titanium nitride film and a film containing aluminum as its main component; a three-layer structure of a titanium nitride film, a film containing aluminum as its main component, and a titanium nitride film; or the like. When the first electrode 613 has a stacked layer structure, the electrode 613 has low resistance as a wiring, giving a favorable ohmic contact. Further, the first electrode 613 can function as an anode.

In addition, the EL layer 616 is formed by various methods such as a vapor-deposition method using an evaporation mask, an ink-jet method, and a spin coating method. The EL layer 616 includes the light-emitting layer shown in Embodiment Mode 1. As other materials for forming the EL layer 616, a low molecular compound, oligomer, dendrimer, or a high molecular compound may be also used. Further, not only organic compounds but also inorganic compounds can be used for the material for forming the EL layer.

As a material for forming the second electrode 617, various metals, alloys, electrically conductive compounds, and mixture of them can be used. When the second electrode 617 is used as a cathode, it is particularly preferable to select a material with a low work function (a work function of 3.8 eV or less) among such metals, alloys, electrically conductive compounds, and mixture thereof. For example, elements belonging to Group 1 or 2 of the periodic table, that is, alkali metals such a lithium (Li) and cesium (Cs) and alkaline earth metals such as magnesium (Mg), calcium (Ca), and strontium (Sr); alloys thereof (for example, MgAg and AlLi); and the like can be given. In the case where light generated in the EL layer 616 is transmitted through the second electrode 617, the second electrode 617 may be also formed using a stacked layer of a thin metal film and a transparent conductive film (for example, indium tin oxide (ITO), ITO containing silicon or silicon oxide, indium zinc oxide (IZO), or indium oxide containing tungsten oxide and zinc oxide (IWZO)).

By attaching the sealing substrate 604 to the element substrate 610 with the sealing material 605, a light-emitting element 618 is provided in the space 607 surrounded by the element substrate 610, the sealing substrate 604, and the sealing material 605. Note that the space 607 is filled with a filler. Besides the case where the space is filled with an inert gas (for example, nitrogen, argon, or the like), there is also the case where the space 607 is filled with the sealing material 605.

Note that an epoxy resin is preferably used for the sealing material 605. Such material preferably allows as little moisture and oxygen as possible to penetrate. As a material for forming the sealing substrate 604, a glass substrate or a quartz substrate can be used as well as a plastic substrate made of FRP (Fiberglass-Reinforced Plastics), PVF (polyvinyl fluoride), polyester, acrylic, or the like.

By the above process, a light-emitting device having the light-emitting element of the present invention can be obtained.

Figure 7A:
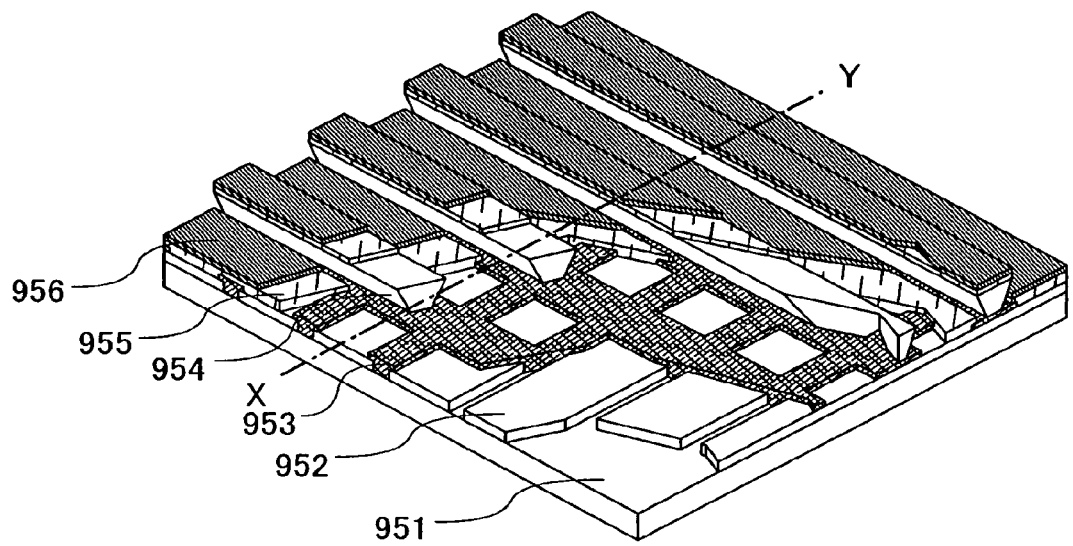
FIGS. 7A and 7B are views illustrating a light-emitting device of the present invention.
Figure 7B:
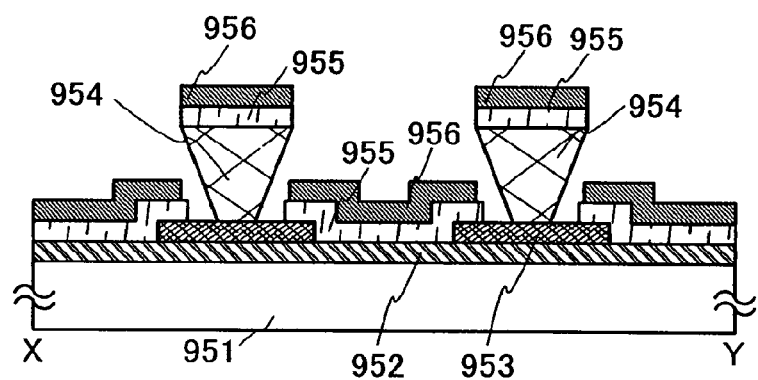

Although this embodiment mode has described the active matrix type light-emitting device in which the driving of the light-emitting element is controlled by a transistor as described above, the light-emitting device may be of a passive matrix type light-emitting device. FIG. 7A is a perspective view of a passive type light-emitting device manufactured by applying the present invention. FIG. 7B is a cross-sectional view taken along a line X-Y of FIG. 7A. In each of FIGS. 7A and 7B, an EL layer 955 is provided between an electrode 952 and an electrode 956 over a substrate 951. An end portion of the electrode 952 is covered with an insulating layer 953. Then, a partition layer 954 is provided over the insulating layer 953. A side wall of the partition layer 954 has such a gradient that the distance between one side wall and the other side wall is shortened as approaching the substrate surface. That is, a cross section of the partition layer 954 in a short-side direction is trapezoid-like, in which a bottom side (a side in a similar direction to a surface direction of the insulating layer 953, which is in contact with the insulating layer 953) is shorter than an upper side (a side in a similar direction to the surface direction of the insulating layer 953, which is not in contact with the insulating layer 953). In this way, by providing the partition layer 954, a problem of defects in a light-emitting element due to electrostatic and the like can be prevented. Even in the case of the passive matrix type light-emitting device, a light-emitting device with high luminous efficiency can be obtained by including the light-emitting element of the present invention with high luminous efficiency.

The light-emitting device of the present invention has the light-emitting element shown in Embodiment Mode 1 or 2. Thus, a light-emitting device with high luminous efficiency can be obtained.

Further, since the light-emitting device of the present invention has the light-emitting element with high luminous efficiency, a light-emitting device with low power consumption can be obtained.

Furthermore, since the light-emitting device of the present invention has the long-lifetime light-emitting element which is hardly deteriorated, a long-lifetime light-emitting device can be obtained.

Note that this embodiment mode can be combined with other embodiment modes as appropriate.

Embodiment Mode 4

This embodiment mode will describe electronic devices of the present invention, which include the light-emitting device described in Embodiment Mode 3 as part thereof. The electronic devices of the present invention each have the light-emitting element described in Embodiment Mode 1 or Embodiment Mode 2, and a display portion having a long lifetime.

As the electronic device manufactured by using the light-emitting device of the present invention, cameras such as video cameras or digital cameras, goggle-type displays, navigation systems, audio reproducing devices (such as car audios or audio components), computers, game machines, mobile information terminals (such as mobile computers, cellular phones, mobile game machines, or electronic books), image reproducing devices equipped with a recording medium (specifically, devices equipped with a display device for reproducing a recording medium such as digital versatile disk (DVD) and displaying the image), and the like are given. Specific examples of these electronic devices are illustrated in FIGS. 8A to 8D.

Figure 8A:
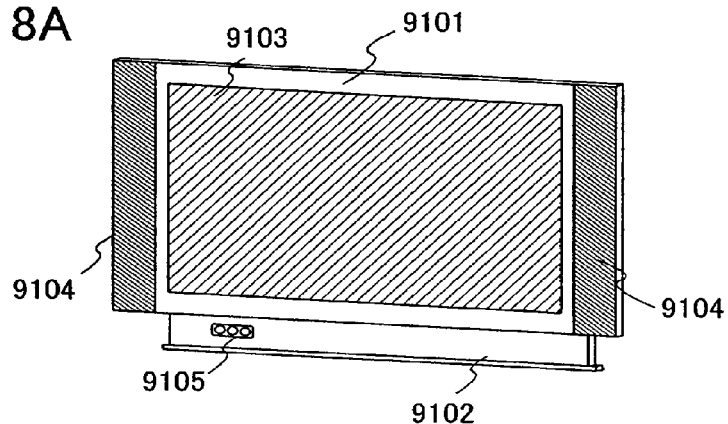
FIGS. 8A to 8D are views each illustrating an electronic device of the present invention.

FIG. 8A illustrates a television device according to this embodiment mode, which includes a housing 9101, a support 9102, a display portion 9103, a speaker portion 9104, a video input terminal 9105, and the like. In this television device, the display portion 9103 is formed by arranging similar light-emitting elements to those described in Embodiment Modes 1 and 2 in a matrix form. The light-emitting elements have a feature of high luminous efficiency and low power consumption. Further, there is a feature of a long lifetime. Since the display portion 9103 formed using the light-emitting element also has a similar feature, image quality is less deteriorated and low power consumption is achieved in this television device. Through such features, deterioration compensating function circuits and power supply circuits can be greatly reduced in number or in size in the television device; therefore, a reduction in the size and weight of the housing 9101 and the support 9102 can be achieved. Since low power consumption, improvement in image quality, and reduction in size and weight are achieved in the television device according to this embodiment mode, a product which is suitable for a living environment can be provided.

Figure 8B:
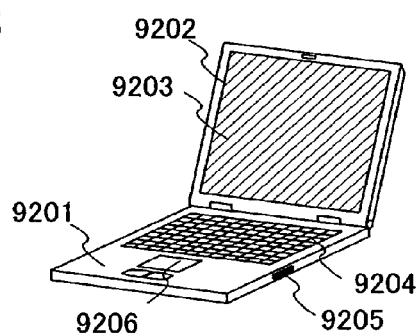

FIG. 8B illustrates a computer according to this embodiment mode, which includes a main body 9201, a housing 9202, a display portion 9203, a keyboard 9204, an external connection port 9205, a pointing device 9206, and the like. In this computer, the display portion 9203 is formed by arranging similar light-emitting elements to those described in Embodiment Modes 1 and 2 in a matrix form. The light-emitting elements have a feature of high luminous efficiency and low power consumption. Further, there is a feature of a long lifetime. Since the display portion 9203 formed using the light-emitting element also has the similar feature, image quality is less deteriorated and low power consumption is achieved in this computer. Through such features, deterioration compensating function circuits and power supply circuits can be greatly reduced in number or in size in the computer. Therefore, a reduction in the size and weight of the main body 9201 and the housing 9202 can be achieved. Since low power consumption, improvement in image quality, and reduction in size and weight are achieved in the computer according to this embodiment mode, a product which is suitable for an environment can be provided. Further, the computer can be carried and the computer having the display portion which has strong resistance to an impact from external when being carried can be provided.

Figure 8C:
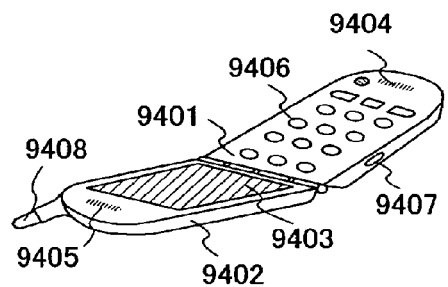

FIG. 8C illustrates a cellular phone according to this embodiment mode, which includes a main body 9401, a housing 9402, a display portion 9403, an audio input portion 9404, an audio output portion 9405, operation keys 9406, an external connection port 9407, an antenna 9408, and the like. In this cellular phone, the display portion 9403 is formed by arranging similar light-emitting elements to those described in Embodiment Modes 1 and 2 in a matrix form. The light-emitting elements have a feature of high luminous efficiency and low power consumption. Further, there is a feature of a long lifetime. Since the display portion 9403 formed using the light-emitting element also has a similar feature, image quality is hardly deteriorated and low power consumption is achieved in this cellular phone. Through such features, deterioration compensating function circuits and power supply circuits can be greatly reduced in number or in size in the cellular phone. Therefore, a reduction in the size and weight of the main body 9401 and the housing 9402 can be achieved. Since low power consumption, improvement in image quality, and reduction in size and weight are achieved in the cellular phone according to this embodiment mode, a product which is suitable for being carried can be provided. Further, a product having the display portion which has strong resistance to an impact from external when being carried can be provided.

Figure 8D:
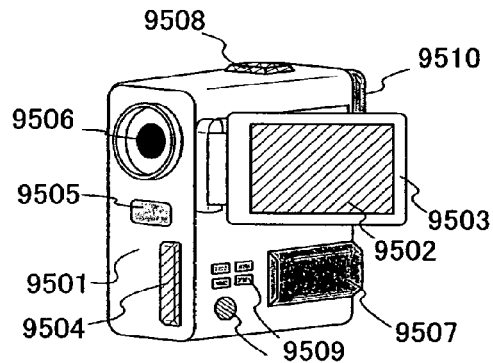

FIG. 8D illustrates a camera according to this embodiment mode, which includes a main body 9501, a display portion 9502, a housing 9503, an external connection port 9504, a remote control receiving portion 9505, an image receiving portion 9506, a battery 9507, an audio input portion 9508, operation keys 9509, an eyepiece portion 9510, and the like. In this camera, the display portion 9502 is formed by arranging similar light-emitting elements to those described in Embodiment Modes 1 and 2 in a matrix form. The light-emitting elements have a feature of high luminous efficiency and low power consumption. Further, there is a feature of a long lifetime. Since the display portion 9502 formed using the light-emitting element also has a similar feature, image quality is hardly deteriorated and low power consumption is achieved in this camera. Through such features, deterioration compensating function circuits and power supply circuits can be greatly reduced in number or in size in the camera. Therefore, a reduction in the size and weight of the main body 9501 can be achieved. Since low power consumption, improvement in image quality, and reduction in size and weight are achieved in the camera according to this embodiment mode, a product which is suitable for being carried can be provided. Further, a product having the display portion which has strong resistance to an impact from external when being carried can be provided.

Figure 9:
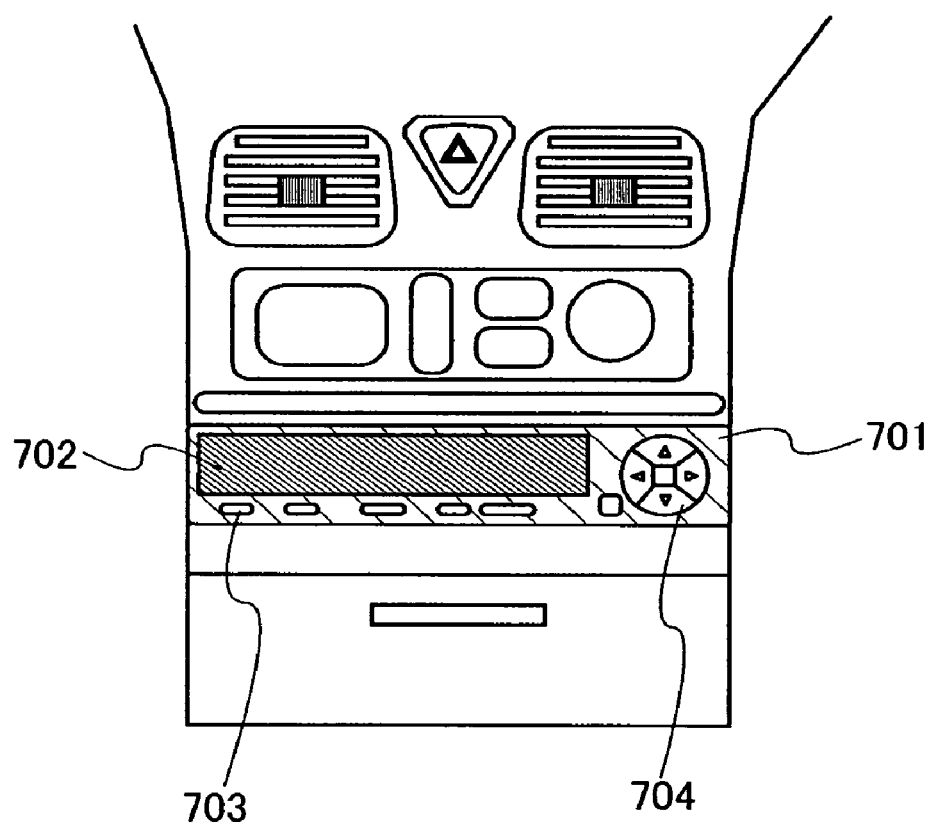
FIG. 9 is a view illustrating an electronic device of the present invention.

FIG. 9 illustrates an audio reproducing device according to this embodiment mode, specifically a car audio, which includes a main body 701, a display portion 702, and operation switches 703 and 704. The display portion 702 can be formed by using the light-emitting device (a passive matrix type or an active matrix type) shown in Embodiment Mode 3. Further, the display portion 702 may be also formed using a light-emitting device of a segment type. In any case, through the use of the light-emitting element according to the present invention, a display portion can be formed with the use of a vehicular power source (12 to 42 V). The display portion which has a longer lifetime and is bright can be formed while low power consumption thereof is achieved. Furthermore, this embodiment mode has shown an in-car audio system; however, the light-emitting device of the present invention may be also used for portable audio systems or audio systems for home use.

Figure 10:
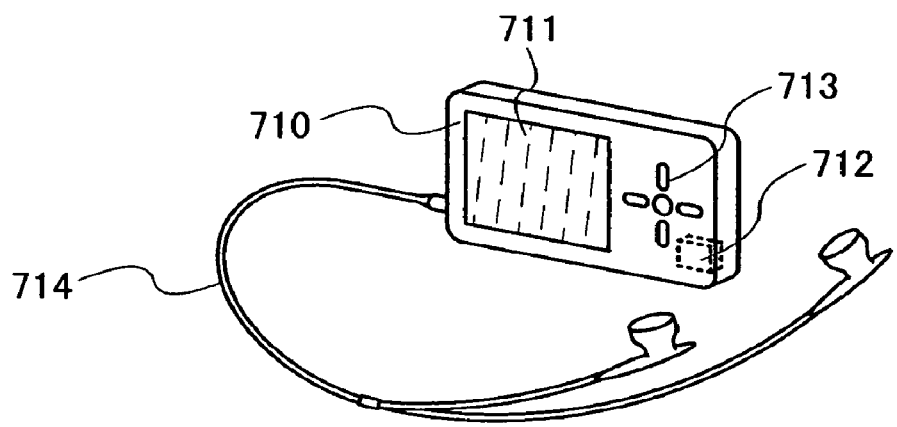
FIG. 10 is a view illustrating an electronic device of the present invention.

FIG. 10 illustrates a digital player as one example of the audio reproducing device. The digital player illustrated in FIG. 10 includes a main body 710, a display portion 711, a memory portion 712, an operation portion 713, a pair of earphones 714, and the like. Note that a pair of headphones or a pair of wireless earphones can be used instead of the pair of earphones 714. The display portion 711 can be formed by using the light-emitting device (a passive matrix type or an active matrix type) shown in Embodiment Mode 3. Further, the display portion 711 may be also formed using a light-emitting device of a segment type. In any case, through the use of the light-emitting element according to the present invention, display can be also performed with a secondary battery (a nickel-hydrogen battery or the like). The display portion 711 which has a longer lifetime and is bright can be formed while low power consumption thereof is achieved. As the memory portion 712, a hard disk or a nonvolatile memory is used. For example, a NAND type nonvolatile memory with a recording capacity of 20 to 200 gigabytes (GBs) is used, and the operation portion 713 is operated, whereby an image or a sound (for example, music) can be recorded and reproduced. The display portions 704 and 711 display white characters on a black background so that power consumption can be suppressed. This is particularly effective for a portable audio system.

As thus described, an application range of the light-emitting device which is manufactured by applying the present invention is quite wide, and this light-emitting device can be applied to electronic devices of every field. By applying the present invention, an electronic device having a display portion which consumes low power and has high reliability can be manufactured.

Moreover, the light-emitting device to which the present invention is applied has a light-emitting element with high luminous efficiency, and the light-emitting device can be also used as a lighting device. One mode of using, as a lighting device, the light-emitting element to which the present invention is applied is described with reference to FIG. 11.

Figure 11:
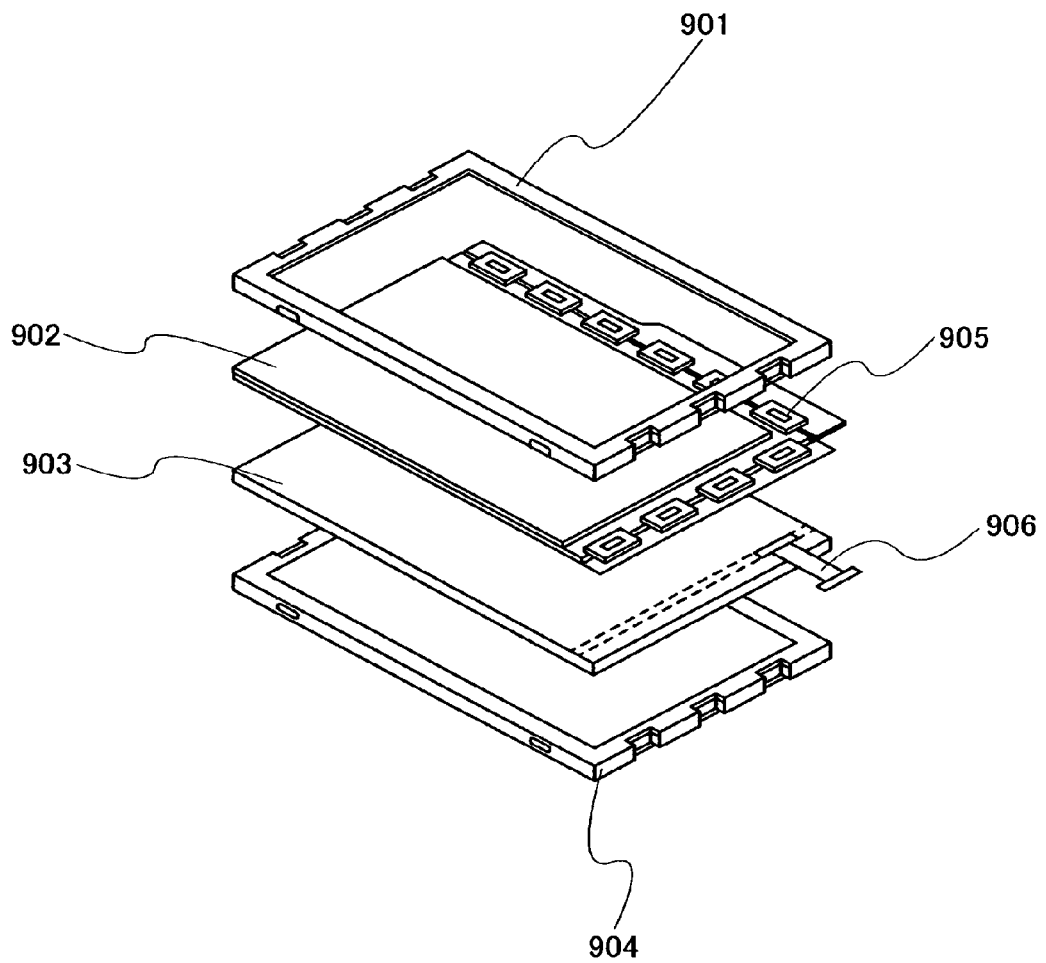
FIG. 11 is a view illustrating an electronic device of the present invention.

FIG. 11 illustrates a liquid crystal display device in which the light-emitting device of the present invention is used as a backlight, as an example of the electronic device using the light-emitting device of the present invention. The liquid crystal display device illustrated in FIG. 11 includes a housing 901, a liquid crystal layer 902, a backlight 903, and a housing 904, in which the liquid crystal layer 902 is connected to a driver IC 905. The light-emitting device of the present invention is used for the backlight 903, and current is supplied to the backlight 903 through a terminal 906.

When the light-emitting device of the present invention is used as the backlight of the liquid crystal display device, a backlight with high luminous efficiency can be obtained. Moreover, a long-lifetime backlight can be also obtained. Further, since the light-emitting device of the present invention is a lighting device of surface light emission and the enlargement of the light-emitting device is possible, the backlight can be made larger and the liquid crystal display device can also have a larger area. Furthermore, since the light-emitting device of the present invention is thin and consumes less power, reduction in thickness and power consumption of the display device is possible.

Figure 12:
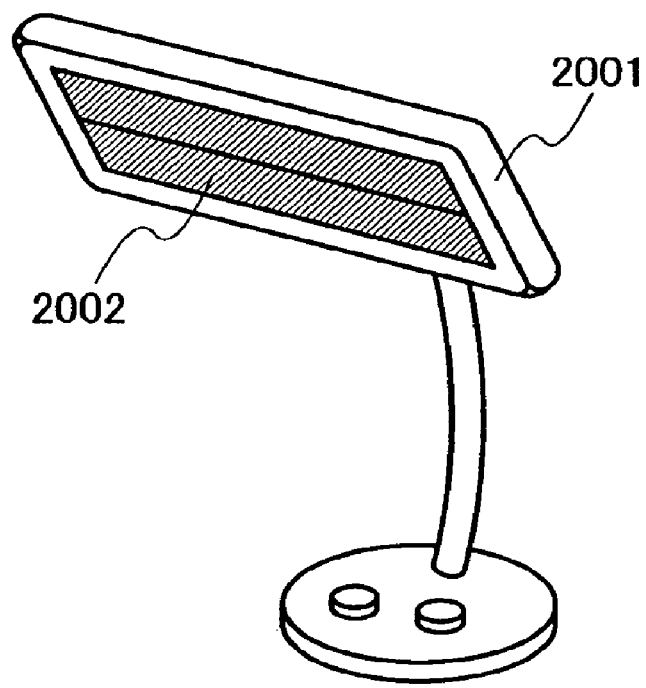
FIG. 12 is a view illustrating a lighting device of the present invention.

FIG. 12 illustrates an example in which the light-emitting device to which the present invention is applied is used as a desk lamp, which is a lighting device. The desk lamp illustrated in FIG. 12 includes a housing 2001 and a light source 2002. The light-emitting device of the present invention is used as the light source 2002. Since the light-emitting device of the present invention has a long lifetime, the desk lamp can also have a long lifetime.

Figure 13:
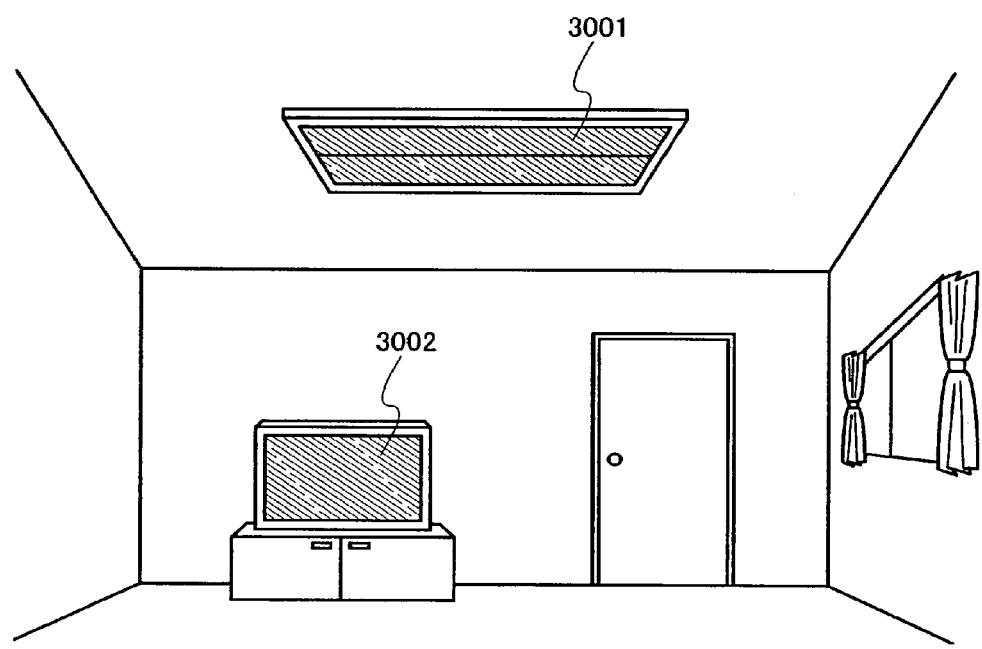
FIG. 13 is a view illustrating a lighting device of the present invention.

FIG. 13 illustrates an example of using the light-emitting device to which the present invention is applied as a lighting device 3001 in the room. Since the light-emitting device of the present invention can be enlarged, the light-emitting device can be used as a large-area lighting device. Moreover, since the light-emitting device of the present invention has a long lifetime, the lighting device can also have a long lifetime. Thus, a television device 3002 according to the present invention similar to the television device described with reference to FIG. 8A can be installed in the room using, as the lighting device 3001, the light-emitting device to which the present invention is applied so that pubic broadcasting and movies can be enjoyed. In such a case, since both the television device and the lighting device have long lifetimes, it is unnecessary to often buy new lighting device or television device (that is, the number of replacing is small) and it is possible to reduce a load to the environment.

Note that this embodiment mode can be combined with other embodiment modes as appropriate.

Embodiment 1

Figure 14:
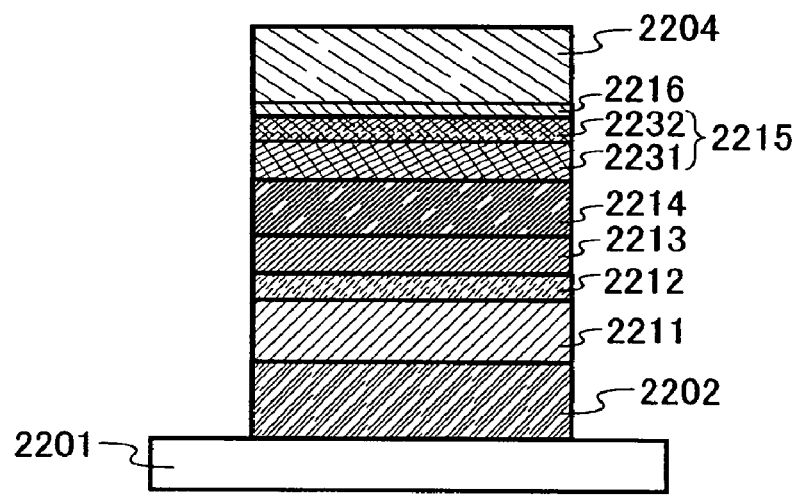
FIG. 14 is a view illustrating a light-emitting element of embodiments.

This embodiment will specifically describe a light-emitting element of the present invention with reference to FIG. 14. Note that a light-emitting element 1, a light-emitting element 2, and a comparative light-emitting element 3 were formed over the same substrate. Structural formulas of organic compounds used in Embodiment 1 are shown below.

[CHEMICAL FORMULA 1]

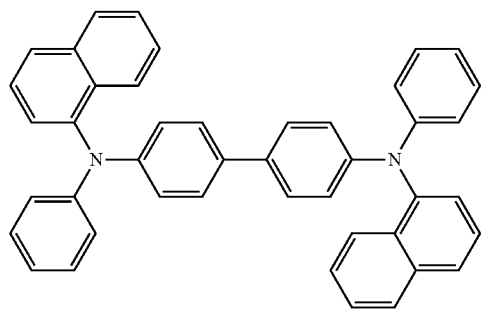

NPB

-continued

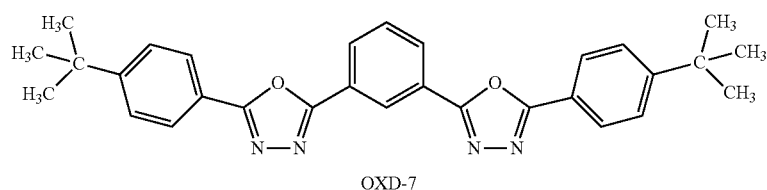
OXD-7

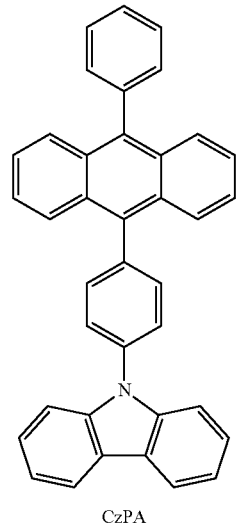
CzPA

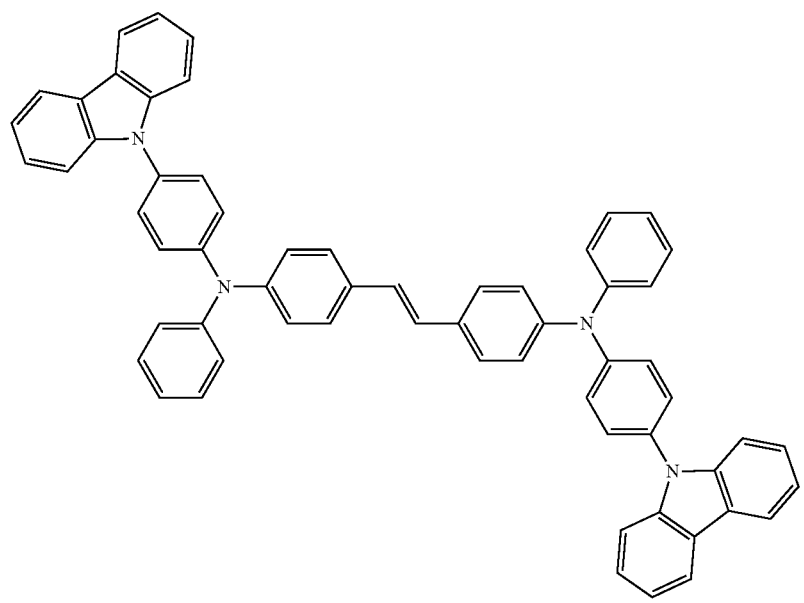
YGA2S

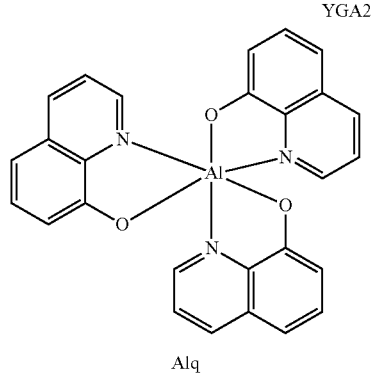
Alq

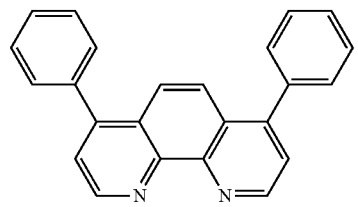
BPhen (Manufacture of Light-Emitting Element 1)

First, a film of indium tin oxide containing silicon oxide was formed over a glass substrate 2201 by a sputtering method to form a first electrode 2202. Note that the thickness was 110 nm and the electrode area was 2 mm×2 mm.

Next, the substrate on which the first electrode 2202 was formed was fixed to a substrate holder that was provided in a vacuum evaporation apparatus, such that the surface on which the first electrode 2202 was formed came to the lower side. After the pressure of the vacuum evaporation apparatus was reduced to be approximately $10^{-4}$ Pa, 4,4'-bis[N-(1-naphtyl)-N-phenylamino]biphenyl (abbreviation: NPB) and molybdenum (VI) oxide were co-evaporated on the first electrode 2202 to form a layer 2211 containing the composite material.

The thickness was 30 nm, and the evaporation rate was controlled so that the weight ratio of NPB to molybdenum (VI) oxide could be 4:1 (=NPB:molybdenum oxide). Note that the co-evaporation method is an evaporation method in which evaporations from a plurality of evaporation sources are performed at the same time in one treatment chamber.

Next, a layer 2212 for controlling the carrier transport was formed over the layer 2211 containing a composite material. The layer 2212 for controlling the carrier transport was formed by co-evaporating 4,4'-bis[N-(1-naphthyl)-N-phenylamino]biphenyl (abbreviation: NPB) and 1,3-bis[5-(p-tert-butylphenyl)-1,3,4-oxadiazol-2-yl]benzene (abbreviation: OXD-7) at a thickness of 10 nm. Here, the evaporation rate was controlled so that the weight ratio of NPB to OXD-7 could be 1:0.05 (=NPB:OXD-7).

Next, by an evaporation method using resistance heating, a film of 4,4'-bis[N-(1-naphthyl)-N-phenylamino]biphenyl (abbreviation: NPB) was formed so as to have a thickness of 20 nm, giving a hole-transporting layer 2213.

Next, a light-emitting layer 2214 was formed over the hole-transporting layer 2213. 9-[4-(10-phenyl-9-antryl)phenyl]-9H-carbazole (abbreviation CzPA) and N,N'-bis[4-(9H-carbazol-9-yl)phenyl]-N,N'-diphenylstilbene-4,4'-diamine (abbreviation: YGA2S) were co-evaporated to form the light-emitting layer 2214 with a thickness of 30 nm. Here, the evaporation rate was controlled so that the weight ratio of CzPA to YGA2S could be 1:0.04 (=CzPA:YGA2S).

After that, an electron-transporting layer 2215 was formed over the light-emitting layer 2214 by an evaporation method using resistance heating. First, tris(8-quinolinolato)aluminum(III) (abbreviation: Alq) was formed over the light-emitting layer 2214 so as to have a thickness of 20 nm to form a first electron-transporting layer 2231. Then, bathophenanthroline (abbreviation: BPhen) was formed over the first electron-transporting layer 2231 so as to have a thickness of 10 nm to form a second electron-transporting layer 2232.

Next, by an evaporation method using resistance heating, a film of lithium fluoride (LiF) was formed over the electron-transporting layer 2215 so as to have a thickness of 1 nm, giving an electron-injecting layer 2216.

Finally, a film of aluminum was formed so as to have a thickness of 200 nm by an evaporation method using resistance heating to form a second electrode 2204. In this manner, a light-emitting element 1 was manufactured.

The light-emitting element 1 of the present invention obtained through the above process was put into a glove box containing a nitrogen so that the light-emitting element was sealed in order not to be exposed to atmospheric air. Then, the operating characteristics of the light-emitting element were measured. Note that the measurement was performed at a room temperature (atmosphere kept at 25° C.).

(Manufacture of Light-Emitting Element 2)

A light-emitting element 2 was manufactured in a similar manner to the light-emitting element 1 except that the weight ratio of NPB to OXD-7 in the layer 2212 for controlling the carrier transport was 1:0.1 (=NPB:OXD-7).

As to the light-emitting element 2 of the present invention, the light-emitting element was also put into a glove box containing a nitrogen so that the light-emitting element was sealed in order not to be exposed to atmospheric air, in a similar manner to the light-emitting element 1. Then, the operating characteristics of the light-emitting element were measured. The measurement was performed at a room temperature (atmosphere kept at 25° C.).

(Manufacture of Comparative Light-Emitting Element 3)

Next, for comparison, the comparative light-emitting element 3 having a structure in which the layer 2212 for controlling the carrier transport in the above light-emitting element 1 and light-emitting element 2 is not provided was formed. The manufacturing method is described below.

First, a film of indium tin oxide containing silicon oxide was formed over a glass substrate by a sputtering method to form a first electrode. Note that the thickness was 110 nm and the electrode area was 2 mm×2 mm.

Next, the substrate on which the first electrode was formed was fixed to a substrate holder that was provided in a vacuum evaporation apparatus, such that the surface on which the first electrode was formed came to the lower side. After the pressure of the vacuum evaporation apparatus was reduced to be approximately $10^{-4}$ Pa, 4,4'-bis[N-(1-naphthyl)-N-phenylamino]biphenyl (abbreviation: NPB) and molybdenum (VI) oxide were co-evaporated on the first electrode to form a layer containing a composite material. The thickness was 30 nm, and the evaporation rate was controlled so that the weight ratio of NPB to molybdenum (VI) oxide could be 4:1 (=NPB:molybdenum oxide).

Next, by an evaporation method using resistance heating, a film of 4,4'-bis[N-(1-naphthyl)-N-phenylamino]biphenyl (abbreviation: NPB) was formed over the layer containing a composite material so as to have a thickness of 30 nm to form a hole-transporting layer.

Next, a light-emitting layer was formed over the hole-transporting layer. 9-[4-(10-phenyl-9-antryl)phenyl]-9H-carbazole (abbreviation: CzPA) and N,N'-bis[4-(9H-carbazol-9-yl)phenyl]-N,N'-diphenylstilbene-4,4'-diamine (abbreviation: YGA2S) were co-evaporated to form the light-emitting layer with a thickness of 30 nm. Here, the evaporation rate was controlled so that the weight ratio of CzPA to YGA2S could be 1:0.04 (=CzPA:YGA2S).

After that, an electron-transporting layer was formed over the light-emitting layer by an evaporation method using resistance heating. First, tris(8-quinolinolato)aluminum(III) (abbreviation: Alq) was formed over the light-emitting layer so as to have a thickness of 20 nm to form a first electron-transporting layer. Then, bathophenanthroline (abbreviation: BPhen) was formed over the first electron-transporting layer so as to have a thickness of 10 nm to form a second electron-transporting layer.

Next, by an evaporation method using resistance heating, a film of lithium fluoride (LiF) was formed over the electron-transporting layer so as to have a thickness of 1 nm to form an electron-injecting layer.

Finally, a film of aluminum was formed so as to have a thickness of 200 nm by an evaporation method using resistance heating to form a second electrode. In this manner, a comparative light-emitting element 3 was manufactured.

As to the comparative light-emitting element 3 obtained through the above process, the light-emitting element was also put into a glove box containing a nitrogen so that the light-emitting element was sealed in order not to be exposed to atmospheric air, in a similar manner to the light-emitting element 1. Then, the operating characteristics of the light-emitting element were measured. Note that the measurement was performed at a room temperature (atmosphere kept at 25° C.).

Figure 15:
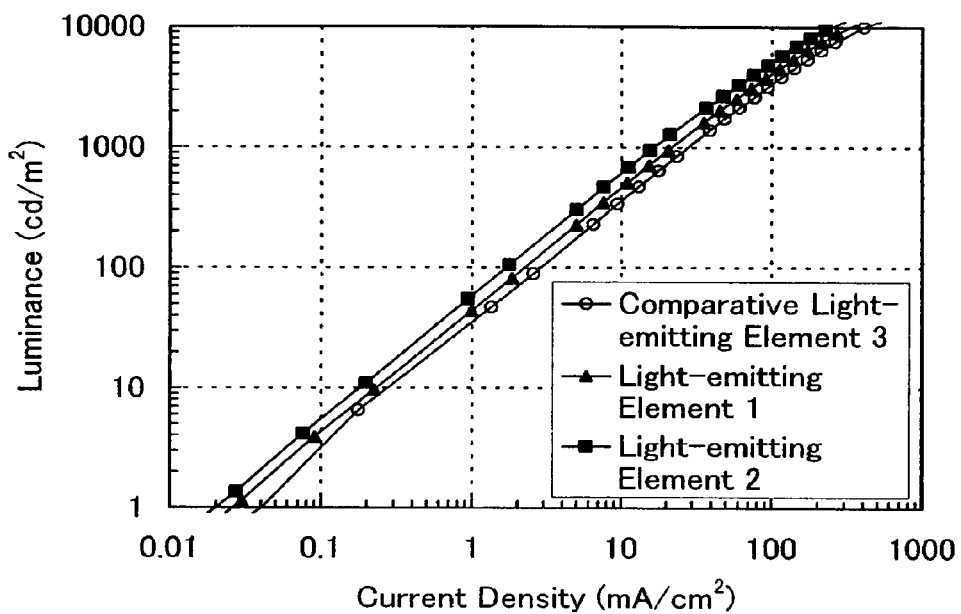
FIG. 15 is a graph illustrating current density-luminance characteristics of the light-emitting elements manufactured in Embodiment 1.
Figure 16:
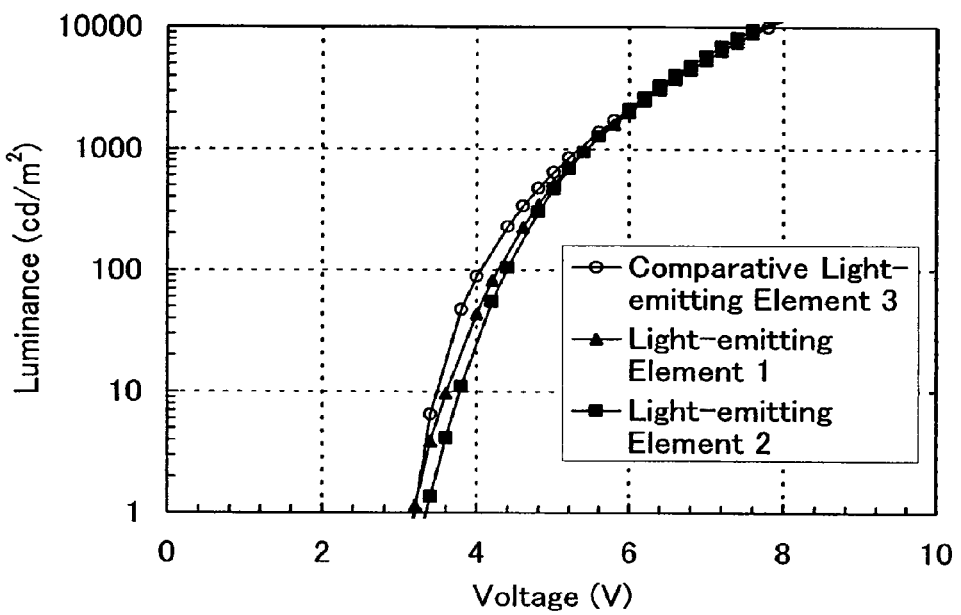
FIG. 16 is a graph illustrating voltage-luminance characteristics of the light-emitting elements manufactured in Embodiment 1.
Figure 17:
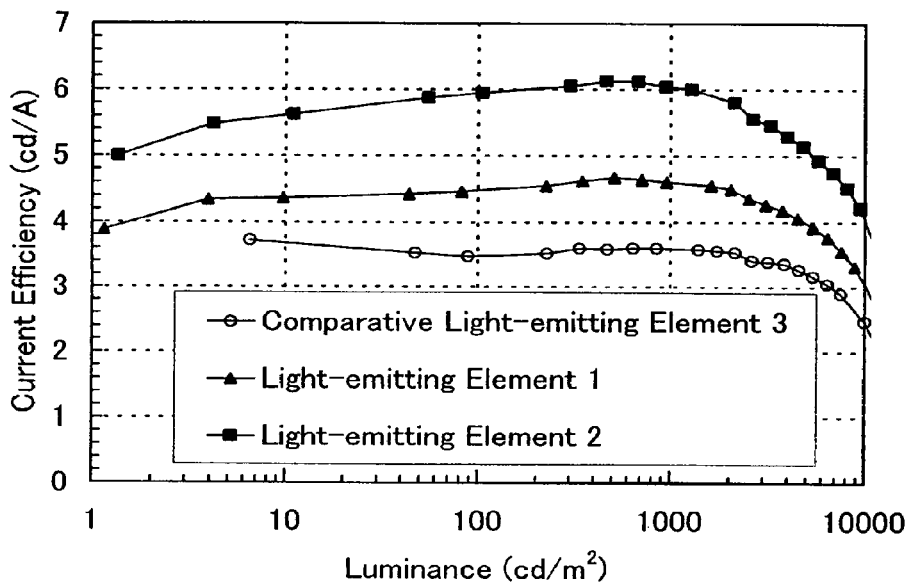
FIG. 17 is a graph illustrating luminance-current efficiency characteristics of the light-emitting elements manufactured in Embodiment 1.
Figure 18:
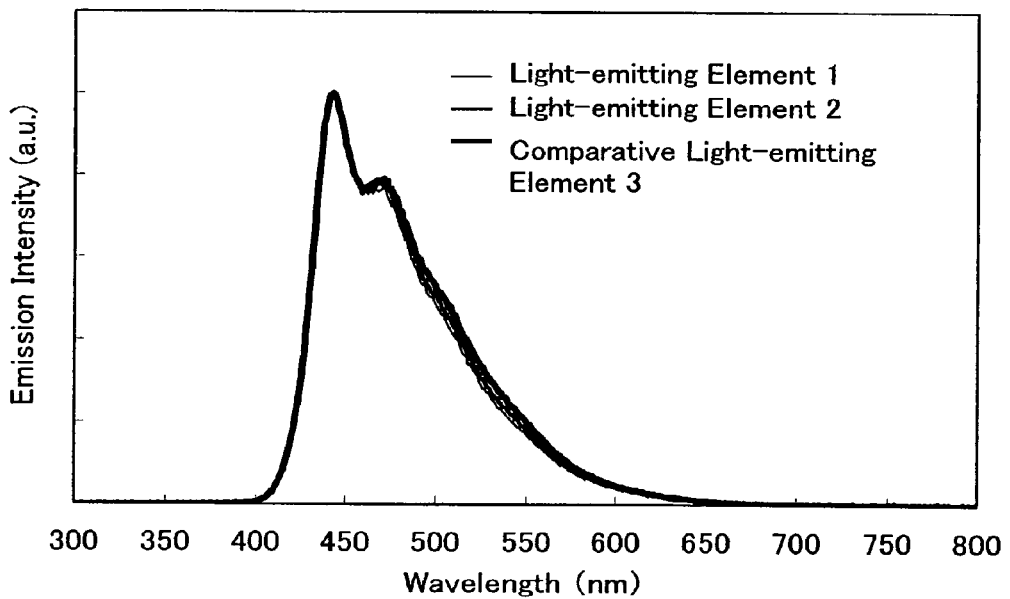
FIG. 18 is a graph illustrating the emission spectra of the light-emitting elements manufactured in Embodiment 1.

FIG. 15 illustrates the current density vs. luminance characteristics of the light-emitting element 1, the light-emitting element 2, and the comparative light-emitting 3. FIG. 16 illustrates the voltage vs. luminance characteristics thereof. FIG. 17 illustrates the luminance vs. current efficiency characteristics thereof. FIG. 18 illustrates the emission spectra thereof obtained at a current supply of 1 mA.

The emission color of the light-emitting element 1 was located at the CIE chromaticity coordinates of (x=0.16, y=0.17) at the luminance of 950 cd/m², and blue emission which derives from YGA2S was obtained. In addition, a current efficiency, a voltage, a current density, and a power efficiency of the light-emitting element 1 at the luminance of 950 cd/m² were 4.6 cd/A, 5.4 V, 20.7 mA/cm², and 2.6 lm/W, respectively.

The emission color of the light-emitting element 2 was located at the CIE chromaticity coordinates of (x=0.16, y=0.17) at the luminance of 950 cd/m², and blue emission which derives from YGA2S was obtained. In addition, a current efficiency, a voltage, a current density, and a power efficiency of the light-emitting element 2 at the luminance of 950 cd/m² were 6.0 cd/A, 5.4 V, 15.7 mA/cm², and 3.5 lm/W, respectively.

The emission color of the comparative light-emitting element 3 was located at the CIE chromaticity coordinates of (x=0.16, y=0.16) at the luminance of 850 cd/m², and blue emission which derives from YGA2S was obtained. In addition, a current efficiency, a voltage, a current density, and a power efficiency of the comparative light-emitting element 3 at the luminance of 850 cd/m² were 3.6 cd/A, 5.2 V, 23.5 mA/cm², and 2.2 lm/W, respectively.

As described above, it is found that high current efficiency is obtained in the light-emitting element 1 and the light-emitting element 2 in each of which the layer for controlling the carrier transport of the present invention is provided, as compared with the comparative light-emitting element 3 without the layer for controlling the carrier transport. Further, since the driving voltage of the light-emitting element 1 and the light-emitting element 2 is not much different from that of the comparative light-emitting element 3 in which the layer for controlling the carrier transport is not provided. Therefore, the light-emitting element 1 and the light-emitting element 2 show high power efficiency, which is contributed by their high current efficiency. Thus, it is found that the light-emitting element of the present invention consumes low power.

Figure 19:
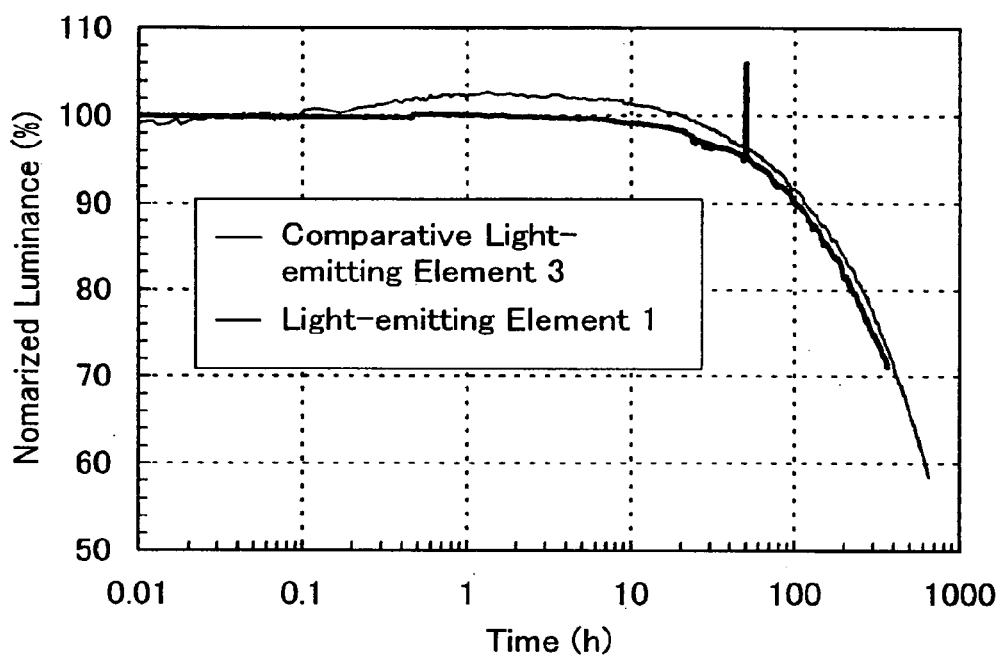
FIG. 19 is a graph illustrating the results of the continuous lighting tests obtained by constant current driving of the light-emitting elements manufactured in Embodiment 1.

FIG. 19 illustrates the result of a continuous lighting test in which the light-emitting element 1 and the comparative light-emitting element 3 were continuously driven at constant current with the initial luminance set at 1000 cd/m². The vertical axis indicates the relative luminance (normalized luminance) on the assumption that 1000 cd/m² is 100%. As apparent from FIG. 19, it is found that the light-emitting element 1 in which the layer for controlling the carrier transport of the present invention is provided has almost the same lifetime as the comparative light-emitting element 3 in which the layer for controlling the carrier transport is not provided. This means that the layer for controlling the carrier transport does not affect the lifetime but improves the current efficiency of the light-emitting element.

The dipole moment of OXD-7 used in the light-emitting element 1 and the light-emitting element 2 was calculated. First, the structure of a ground state of OXD-7 was optimized by density functional theory (DFT) at a level of B3LYP/6-311(d,p). The dipole moment of OXD-7 with an optimized structure was calculated to be 3.78 debye. The accuracy of calculation of the DFT is higher than that of a Hartree-Fock (HF) method which does not consider electron correlation. In addition, the calculation cost of the DFT is lower than that of a method of perturbation (MP) which has the same level accuracy of calculation as the DFT. Therefore, the DFT was employed in this calculation. The calculation was performed using a high performance computer (HPC) (manufactured by SGI Japan, Ltd., Altix3700 DX).

The oxidation characteristics of NPB and OXD-7, which were used in the layer for controlling the carrier transport in the light-emitting element 1 and the light-emitting element 2 manufactured in this embodiment, were evaluated by using the cyclic voltammetry (CV) measurement. The ionization potentials of NPB and OXD-7 were obtained from the CV measurement results. Note that an electrochemical analyzer (ALS model 600A or 600C, product of BAS Inc.) was used for the measurement.

In the CV measurement, dehydrated N,N-dimethylformamide (DMF, product of Sigma-Aldrich Inc., 99.8%, catalog No. 22705-6) was used for a solvent, and tetra-n-butylammonium perchlorate (n-Bu$_4$NClO$_4$, product of Tokyo Chemical Industry Co., Ltd., catalog No. T0836), which is a supporting electrolyte, was dissolved in DMF at the concentration of tetra-n-butylammonium perchlorate of 100 mmol/L. The object compound to be measured was also dissolved in the DMF-solution containing n-Bu$_4$NClO$_4$ at a concentration of 10 mmol/L. A platinum electrode (a PTE platinum electrode, product of BAS Inc.) was used as a working electrode; a platinum electrode (a VC-3 Pt counter electrode (5 cm), product of BAS Inc.) was used as an auxiliary electrode; and an Ag/Ag$^+$ electrode (an RE5 nonaqueous solvent reference electrode, product of BAS Inc.) was used as a reference electrode. The CV measurement was conducted at room temperature (20 to 25° C.).

(Calculation of the Potential Energy of the Reference Electrode with Respect to the Vacuum Level)

First, potential energy (eV) of the reference electrode (Ag/Ag$^+$ electrode) used in this embodiment with respect to the vacuum level was calculated. That is, the Fermi level of the Ag/Ag$^+$ electrode was calculated. It is known that the oxidation potential of ferrocene in methanol is +0.610 V with respect to a standard hydrogen electrode (Reference: Christian R. Goldsmith et al., J. Am. Chem. Soc., Vol. 124, No. 1, pp. 83-96, 2002). The oxidation potential of ferrocene in methanol measured by using the reference electrode used in this embodiment was found to be +0.20 V vs. Ag/Ag$^+$. Therefore, it was confirmed that the potential energy of the reference electrode used in this embodiment was lower than that of the standard hydrogen electrode by 0.41 eV.

Here, it is also known that the potential energy of the standard hydrogen electrode with respect to the vacuum level is −4.44 eV (Reference: Toshihiro Ohnishi and Tamami Koyama, High molecular EL material, Kyoritsu Shuppan, pp. 64-67). Accordingly, the potential energy of the reference electrode used in this embodiment with respect to the vacuum level was determined to be −4.44−0.41=−4.85 eV.

Measurement Example 1

OXD-7

Figure 38:
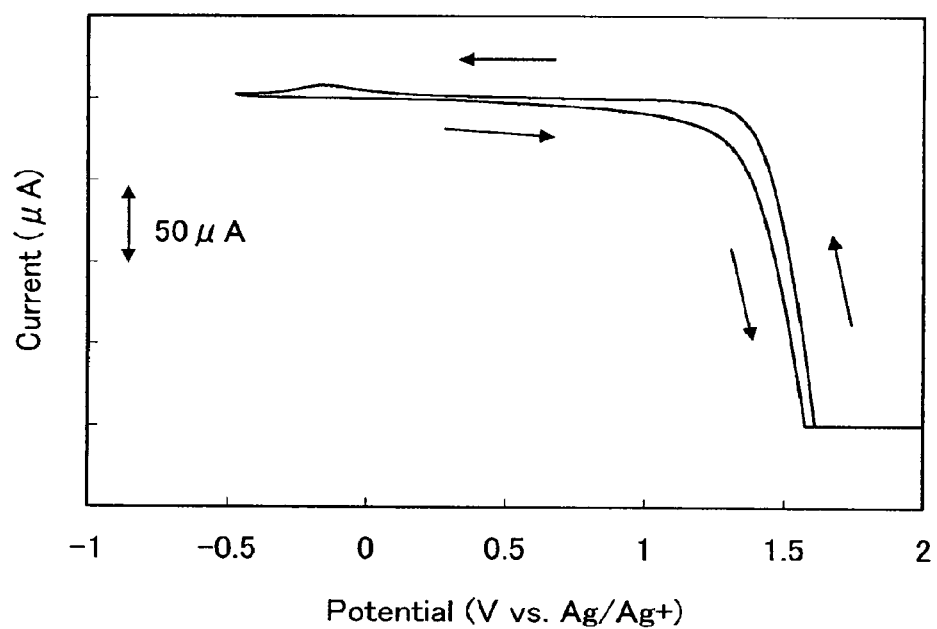
FIG. 38 is a graph illustrating oxidation characteristics of OXD-7.

In this measurement example, the oxidation characteristics of OXD-7 were evaluated by cyclic voltammetry (CV) measurement. The scan rate was set at 0.1 V/sec. FIG. 38 illustrates the measurement result. Note that the measurement of the oxidation characteristics was performed by the steps of: scanning the potential of the working electrode with respect to the reference electrode in the ranges of −0.47 V to −1.60 V, and then 1.60 V to −0.47 V.

As illustrated in FIG. 38, it is found that a peak which corresponds to the oxidation of OXD-7 did not appear even when scanning was performed up to 1.0 V. Even if there were a peak which indicates oxidation at a voltage greater than or equal to 1.0 V, the peak could not be observed due to the influence of flow of a large amount of current. Therefore, it can be concluded from this data that the oxidation potential of OXD-7 is greater than or equal to 1.0 V. Since the potential energy of the reference electrode used in this measurement example with respect to the vacuum level is −4.85 eV, an oxidation potential of 1.0 V in the CV measurement corresponds to an ionization potential of −(−4.85−1.0)=5.85 eV. Therefore, it was found that the ionization potential of OXD-7 was at least greater than or equal to 5.8 eV. Thus, it is found that OXD-7 can be preferably used for the layer for controlling the carrier transport of the present invention.

Measurement Example 2

NPB

Figure 37:
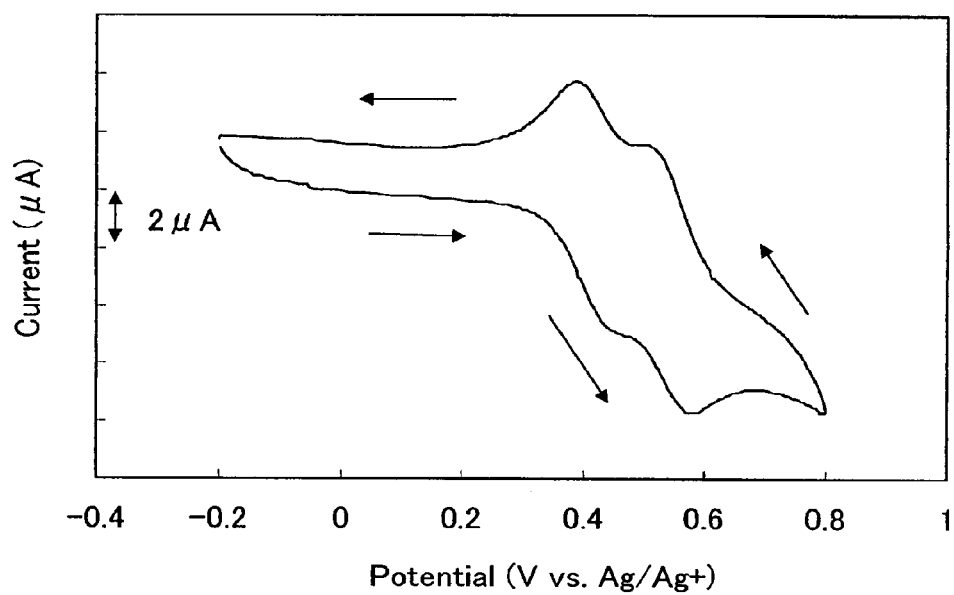
FIG. 37 is a graph illustrating oxidation characteristics of NPB.

In this measurement example, the oxidation characteristics of NPB were evaluated by cyclic voltammetry (CV) measurement. The scan rate was set at 0.1 V/sec. FIG. 37 illustrates the measurement result. The measurement of the oxidation characteristics was performed by the steps of: scanning the potential of the working electrode with respect to the reference electrode in the ranges of −0.20 V to 0.80 V, and then 0.80 V to −0.20 V.

As illustrated in FIG. 37, an oxidation peak potential $E_{pa}$ appeared at 0.45 V. Therefore, a difference in oxidation peak potential between NPB and OXD-7 measured in the Measurement Example 1 is greater than or equal to 0.55 V. Thus, a difference between the oxidation peak potential of NPB and that of OXD-7 is greater than or equal to 0.5 V, which means that a difference between an ionization potential of NPB and that of OXD-7 is at least greater than or equal to 0.5 eV.

As shown above, since the dipole moment and the ionization potential of OXD-7 used for the light-emitting element 1 and the light-emitting element 2 are greater than or equal to 2.0 debye and greater than or equal to 5.8 eV, respectively, OXD-7 can be preferably used for the layer for controlling the carrier transport. That is, the layer containing NPB which is an organic compounds having a hole-transporting property and OXD-7 functions as the layer for controlling the carrier transport.

Accordingly, it was revealed that carrier balance is improved by applying the present invention and thus a light-emitting element with high luminous efficiency can be obtained. Further, it was confirmed that a light-emitting element with low power consumption can be obtained.

Embodiment 2

Figure 20:
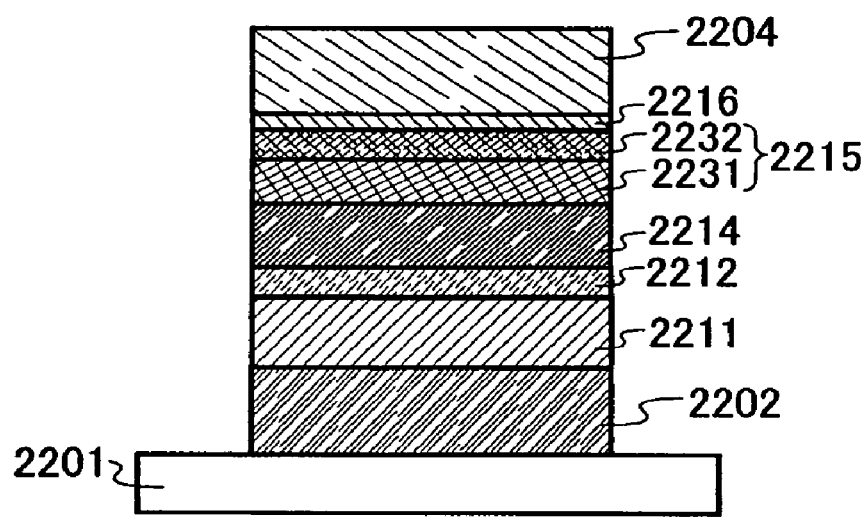
FIG. 20 is a view illustrating a light-emitting element of embodiments.

This embodiment will specifically describe a light-emitting element of the present invention with reference to FIG. 20. Note that a light-emitting element 4 and a light-emitting element 5 manufactured in Embodiment 2 were formed over the same substrate.

(Manufacture of Light-Emitting Element 4)

First, a film of indium tin oxide containing silicon oxide was formed over a glass substrate 2201 by a sputtering method, and a first electrode 2202 was formed. Note that the thickness was 110 nm and the electrode area was 2 mm×2 mm.

Next, the substrate on which the first electrode 2202 was formed was fixed to a substrate holder that was provided in a vacuum evaporation apparatus, such that the surface on which the first electrode 2202 was formed came to the lower side. After the pressure of the vacuum evaporation apparatus was reduced to be approximately $10^{-4}$ Pa, 4,4'-bis[N-(1-naphtyl)-N-phenylamino]biphenyl (abbreviation: NPB) and molybdenum (VI) oxide were co-evaporated on the first electrode 2202 to form a layer 2211 containing a composite material. The thickness was 50 nm, and the evaporation rate was controlled so that the weight ratio of NPB to molybdenum (VI) oxide could be 4:1 (=NPB:molybdenum oxide).

Next, a layer 2212 for controlling the carrier transport was formed over the layer 2211 containing a composite material. The layer 2212 for controlling the carrier transport was formed by co-evaporating 4,4'-bis[N-(1-naphthyl)-N-phenylamino]biphenyl (abbreviation: NPB) and 1,3-bis[5-(p-tert-butylphenyl)-1,3,4-oxadiazol-2-yl]benzene (abbreviation: OXD-7) at a thickness of 10 nm. Here, the evaporation rate was controlled so that the weight ratio of NPB to OXD-7 could be 1:0.05 (=NPB:OXD-7).

Next, a light-emitting layer 2214 was formed over the layer 2212 for controlling the carrier transport. 9-[4-(10-phenyl-9-antryl)phenyl]-9H-carbazole (abbreviation CzPA) and N,N'-bis[4-(9H-carbazol-9-yl)phenyl]N,N'-diphenylstilbene-4,4'-diamine (abbreviation: YGA2S) were co-evaporated to form the light-emitting layer 2214 with a thickness of 30 nm. Here, the evaporation rate was controlled so that the weight ratio of CzPA to YGA2S could be 1:0.04 (=CzPA:YGA2S).

After that, an electron-transporting layer 2215 was formed over the light-emitting layer 2214 by an evaporation method using resistance heating. First, tris(8-quinolinolato)aluminum(III) (abbreviation: Alq) was formed over the light-emitting layer 2214 so as to have a thickness of 20 nm to form a first electron-transporting layer 2231. Then, bathophenanthroline (abbreviation: BPhen) was formed over the first electron-transporting layer 2231 so as to have a thickness of 10 nm to form a second electron-transporting layer 2232.

Next, by an evaporation method using resistance heating, a film of lithium fluoride (LiF) was formed over the electron-transporting layer 2215 so as to have a thickness of 1 nm to form an electron-injecting layer 2216.

Finally, a film of aluminum was formed so as to have a thickness of 200 nm by an evaporation method using resistance heating to form a second electrode 2204. In this manner, a light-emitting element 4 was manufactured.

The light-emitting element 4 of the present invention obtained through the above process was put into a glove box containing a nitrogen so that the light-emitting element was sealed in order not to be exposed to atmospheric air. Then, the operating characteristics of the light-emitting element were measured. Note that the measurement was performed at a room temperature (atmosphere kept at 25° C.).

(Manufacture of Light-Emitting Element 5)

A light-emitting element 5 was manufactured in a similar manner to the light-emitting element 4 except that the weight ratio of NPB to OXD-7 in the layer 2212 for controlling the carrier transport was 1:0.1 (=NPB:OXD-7).

As to the light-emitting element 5 of the present invention, the light-emitting element was also put into a glove box containing a nitrogen so that the light-emitting element was sealed in order not to be exposed to atmospheric air, in a similar manner to the light-emitting element 4. Then, the operating characteristics of the light-emitting element were measured. Note that the measurement was performed at a room temperature (atmosphere kept at 25° C.).

Figure 21:
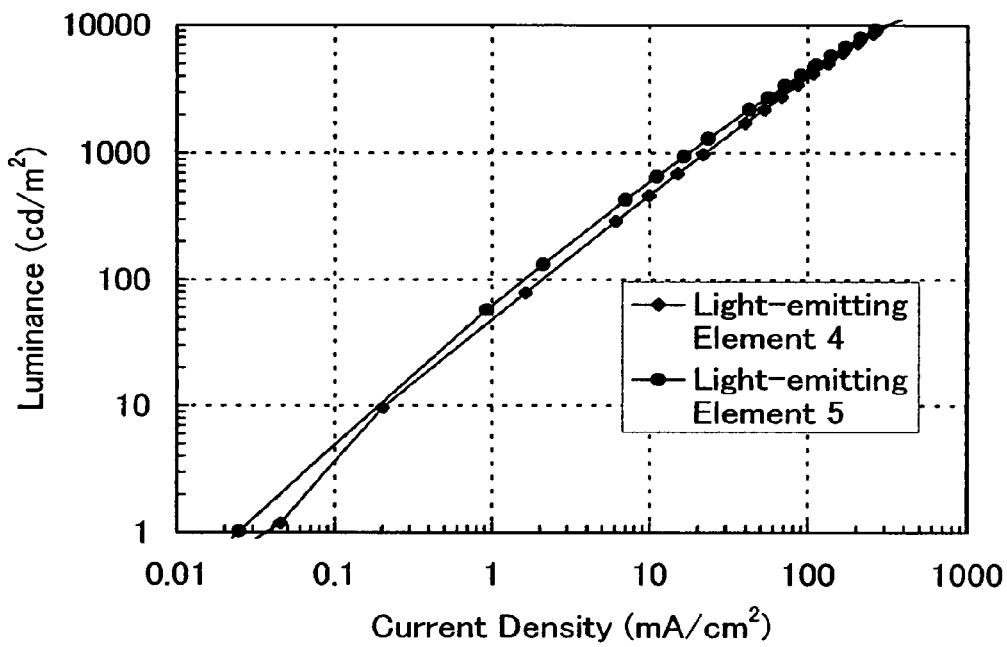
FIG. 21 is a graph illustrating current density-luminance characteristics of the light-emitting elements manufactured in Embodiment 2.
Figure 22:
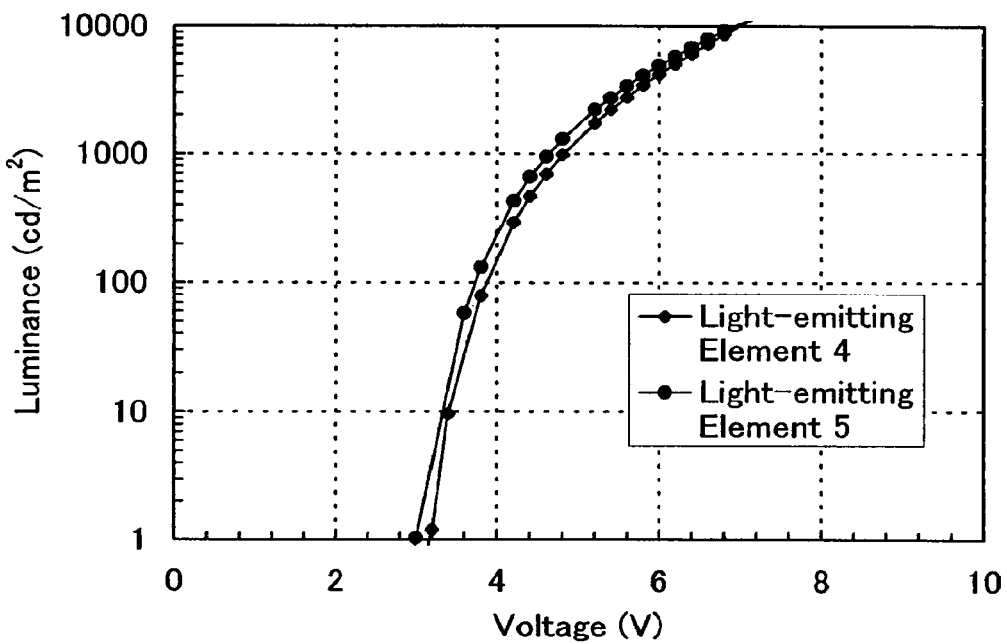
FIG. 22 is a graph illustrating voltage-luminance characteristics of the light-emitting elements manufactured in Embodiment 2.
Figure 23:
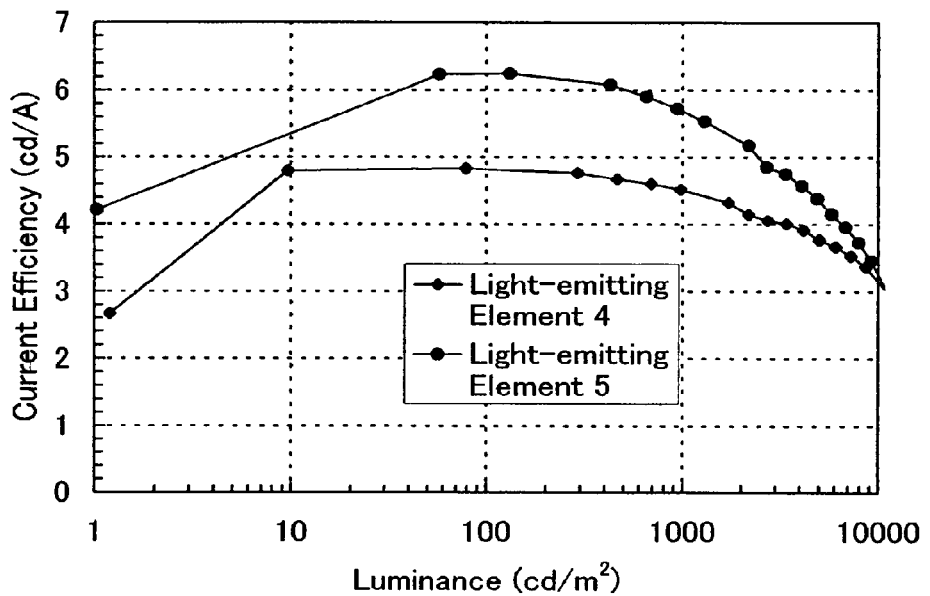
FIG. 23 is a graph illustrating luminance-current efficiency characteristics of the light-emitting elements manufactured in Embodiment 2.
Figure 24:
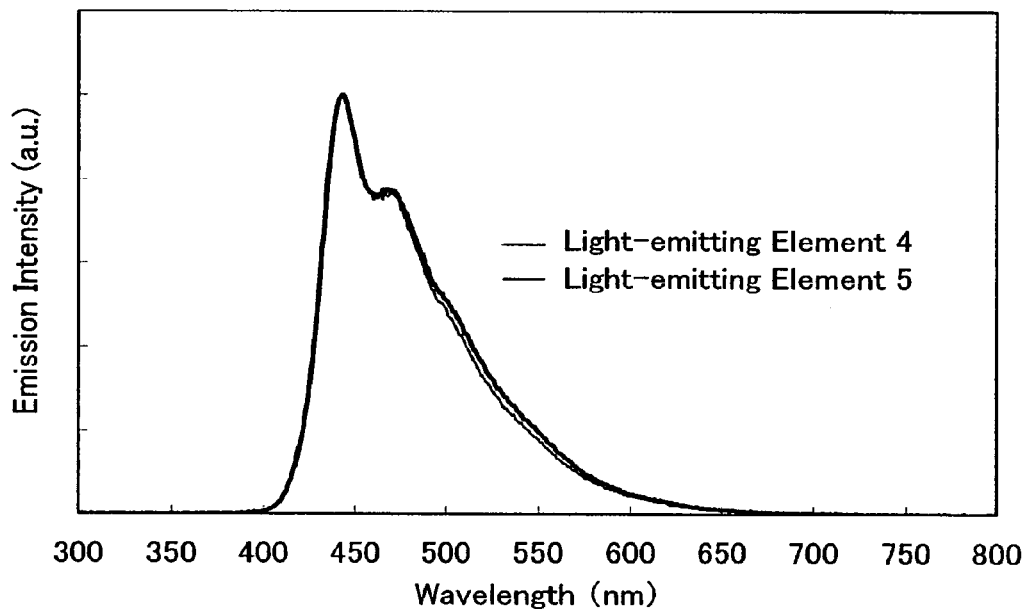
FIG. 24 is a graph illustrating the emission spectra of the light-emitting elements manufactured in Embodiment 2.

FIG. 21 illustrates the current density vs. luminance characteristics of the light-emitting element 4 and the light-emitting element 5. FIG. 22 illustrates the voltage vs. luminance characteristics thereof. FIG. 23 illustrates the luminance vs. current efficiency characteristics thereof. FIG. 24 illustrates the emission spectra thereof obtained at a current supply of 1 mA.

The emission color of the light-emitting element 4 was located at the CIE chromaticity coordinates of (x=0.16, y=0.16) at the luminance of 980 cd/m², and blue emission which derives from YGA2S was obtained. In addition, a current efficiency, a voltage, a current density, and a power efficiency of the light-emitting element 4 at the luminance of 980 cd/m² were 4.5 cd/A, 4.8 V, 21.7 mA/cm², and 3.0 lm/W, respectively.

The emission color of the light-emitting element 5 was located at the CIE chromaticity coordinates of (x=0.16, y=0.17) at the luminance of 940 cd/m², and blue emission which derives from YGA2S was obtained. In addition, a current efficiency, a voltage, a current density, and a power efficiency of the light-emitting element 5 at the luminance of 940 cd/m² were 5.7 cd/A, 4.6 V, 16.5 mA/cm², and 3.9 lm/W, respectively.

As described above, it is found that high current efficiency is obtained in the light-emitting element 4 and the light-emitting element 5 in each of which the layer for controlling the carrier transport of the present invention is provided. Further, high power efficiency is obtained in the light-emitting element 4 and the light-emitting element 5, which is contributed by their high current efficiency. Thus, it can be concluded that the light-emitting element of the present invention consumes low power.

Accordingly, it was found that carrier balance is improved by applying the present invention and thus a light-emitting element with high luminous efficiency can be obtained. Further, it was revealed that a light-emitting element with low power consumption can be obtained.

The dipole moment of OXD-7 used for the light-emitting element 4 and the light-emitting element 5 is 3.78 debye as calculated in Embodiment 1, and the ionization potential of OXD-7 is greater than or equal to 5.8 eV. The difference in ionization potential between NPB and OXD-7 is greater than or equal to 0.5 eV.

Thus, it can be concluded that OXD-7 used for the light-emitting element 4 and the light-emitting element 5 can be preferably used for the layer for controlling the carrier transport. That is, the layer containing NPB which is an organic compounds having a hole-transporting property and OXD-7 functions as the layer for controlling the carrier transport.

The structure in which the light-emitting layer and the layer for controlling the carrier transport are in contact with each other was shown in this embodiment, and it was found that, even in this structure, the layer containing NPB and OXD-7 functions as the layer for controlling the carrier transport, resulting in the formation of a light-emitting element with high luminous efficiency.

Embodiment 3

This embodiment will specifically describe a light-emitting element of the present invention with reference to FIG. 14. Note that a light-emitting element 6, a light-emitting element 7, and a comparative light-emitting element 8 manufactured in Embodiment 3 were formed over the same substrate. A structural formula of an organic compound used in Embodiment 3 is shown below.

[CHEMICAL FORMULA 2]

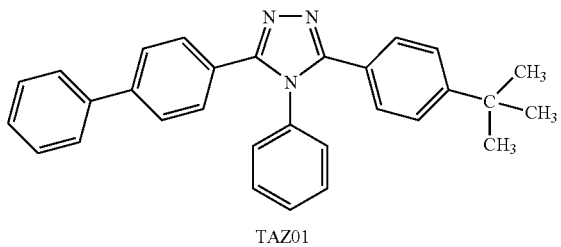

TAZ01

(Manufacture of Light-Emitting Element 6)

First, a film of indium tin oxide containing silicon oxide was formed over a glass substrate 2201 by a sputtering method, and a first electrode 2202 was formed. Note that the thickness was 110 nm and the electrode area was 2 mm×2 mm.

Next, the substrate on which the first electrode 2202 was formed was fixed to a substrate holder that was provided in a vacuum evaporation apparatus, such that the surface on which the first electrode 2202 was formed came to the lower side. After the pressure of the vacuum evaporation apparatus was reduced to be approximately $10^{-4}$ Pa, 4,4'-bis[N-(1-naphthyl)-N-phenylamino]biphenyl (abbreviation: NPB) and molybdenum (VI) oxide were co-evaporated on the first electrode 2202 to form a layer 2211 containing a composite material. The thickness was 30 nm, and the evaporation rate was controlled so that the weight ratio of NPB to molybdenum (VI) oxide could be 4:1 (=NPB:molybdenum oxide).

Next, a layer 2212 for controlling the carrier transport was formed over the layer 2211 containing a composite material. The layer 2212 for controlling the carrier transport was formed by depositing 4,4'-bis[N-(1-naphthyl)-N-phenylamino]biphenyl (abbreviation: NPB) and 3-(4-biphenylyl)-4-phenyl-5-(4-tert-butylphenyl)-1,2,4-triazole (abbreviation: TAZ01) at a thickness of 10 nm by a co-evaporation method. Here, the evaporation rate was controlled so that the weight ratio of NPB to TAZ01 could be 1:0.05 (=NPB:TAZ01).

Next, by an evaporation method using resistance heating, a film of 4,4'-bis[N-(1-naphthyl)-N-phenylamino]biphenyl (abbreviation: NPB) was formed so as to have a thickness of 20 nm to form a hole-transporting layer 2213.

Next, a light-emitting layer 2214 was formed over the hole-transporting layer 2213. 9-[4-(10-phenyl-9-antryl)phenyl]-9H-carbazole (abbreviation: CzPA) and N,N'-bis[4-(9H-carbazol-9-yl)phenyl]-N,N'-diphenylstilbene-4,4'-diamine (abbreviation: YGA2S) were co-evaporated to form the light-emitting layer 2214 with a thickness of 30 nm. Here, the evaporation rate was controlled so that the weight ratio of CzPA to YGA2S could be 1:0.04 (=CzPA:YGA2S).

After that, an electron-transporting layer 2215 was formed over the light-emitting layer 2214 by an evaporation method using resistance heating. First, tris(8-quinolinolato)aluminum(III) (abbreviation: Alq) was formed over the light-emitting layer 2214 so as to have a thickness of 20 nm to form a first electron-transporting layer 2231. Then, bathophenanthroline (abbreviation: BPhen) was formed over the first electron-transporting layer 2231 so as to have a thickness of 10 nm to form a second electron-transporting layer 2232.

Next, by an evaporation method using resistance heating, a film of lithium fluoride (LiF) was formed over the electron-transporting layer 2215 so as to have a thickness of 1 nm to form an electron-injecting layer 2216.

Finally, a film of aluminum was formed so as to have a thickness of 200 nm by an evaporation method using resistance heating to form a second electrode 2204. In this manner, a light-emitting element 6 was manufactured.

The light-emitting element 6 of the present invention obtained through the above process was put into a glove box containing a nitrogen so that the light-emitting element was sealed without exposing to atmospheric air. Then, the operating characteristics of the light-emitting element were measured. Note that the measurement was performed at a room temperature (atmosphere kept at 25° C.).

(Manufacture of Light-Emitting Element 7)

A light-emitting element 7 was manufactured in a similar manner to the light-emitting element 6 except that the weight ratio of NPB to TAZ01 in the layer 2212 for controlling the carrier transport was 1:0.1 (=NPB:TAZ01).

As to the light-emitting element 7 of the present invention, the light-emitting element was also put into a glove box containing a nitrogen so that the light-emitting element was sealed in order not to be exposed to atmospheric air, in a similar manner to the light-emitting element 6. Then, the operating characteristics of the light-emitting element were measured. Note that the measurement was performed at a room temperature (atmosphere kept at 25° C.).

(Manufacture of Comparative Light-Emitting Element 8)

Next, for comparison, the comparative light-emitting element 8 having a structure in which the layer 2212 for controlling the carrier transport in the above light-emitting element 6 and light-emitting 7 is not provided was formed. The manufacturing method is described below.

First, a film of indium tin oxide containing silicon oxide was formed over a glass substrate by a sputtering method, and a first electrode was formed. Note that the thickness was 110 nm and the electrode area was 2 mm×2 mm.

Next, the substrate on which the first electrode was formed was fixed to a substrate holder that was provided in a vacuum evaporation apparatus, such that the surface on which the first electrode was formed came to the lower side. After the pressure of the vacuum evaporation apparatus was reduced to be approximately $10^{-4}$ Pa, 4,4'-bis[N-(1-naphtyl)-N-phenylamino]biphenyl (abbreviation: NPB) and molybdenum (VI) oxide were co-evaporated on the first electrode, resulting in the formation of the layer containing a composite material. The thickness was 30 nm, and the evaporation rate was controlled so that the weight ratio of NPB to molybdenum (VI) oxide could be 4:1 (=NPB:molybdenum oxide).

Next, by an evaporation method using resistance heating, a film of 4,4'-bis[N-(1-naphthyl)-N-phenylamino]biphenyl (abbreviation: NPB) was formed over the layer containing a composite material so as to have a thickness of 30 nm to form a hole-transporting layer.

Next, a light-emitting layer was formed over the hole-transporting layer. 9-[4-(10-phenyl-9-antryl)phenyl]-9H-carbazole (abbreviation: CzPA) and N,N'-bis[4-(9H-carbazol-9-yl)phenyl]-N,N'-diphenylstilbene-4,4'-diamine (abbreviation: YGA2S) were co-evaporated to form the light-emitting layer with a thickness of 30 nm. Here, the evaporation rate was controlled so that the weight ratio of CzPA to YGA2S could be 1:0.04 (=CzPA:YGA2S).

After that, an electron-transporting layer was formed over the light-emitting layer by an evaporation method using resistance heating. First, tris(8-quinolinolato)aluminum(III) (abbreviation: Alq) was formed over the light-emitting layer so as to have a thickness of 20 nm to form a first electron-transporting layer. Then, bathophenanthroline (abbreviation: BPhen) was formed over the first electron-transporting layer so as to have a thickness of 10 nm to form a second electron-transporting layer.

Next, by an evaporation method using resistance heating, a film of lithium fluoride (LiF) was formed over the electron-transporting layer so as to have a thickness of 1 nm to form an electron-injecting layer.

Finally, a film of aluminum was formed so as to have a thickness of 200 nm by an evaporation method using resistance heating to form a second electrode. In this manner, a comparative light-emitting element 8 was manufactured.

As to the comparative light-emitting element 8 obtained through the above process, the light-emitting element was also put into a glove box containing a nitrogen so that the light-emitting element was sealed in order not to be exposed to atmospheric air, in a similar manner to the light-emitting element 6. Then, the operating characteristics of the light-emitting element were measured. Note that the measurement was performed at a room temperature (atmosphere kept at 25° C.).

Figure 25:
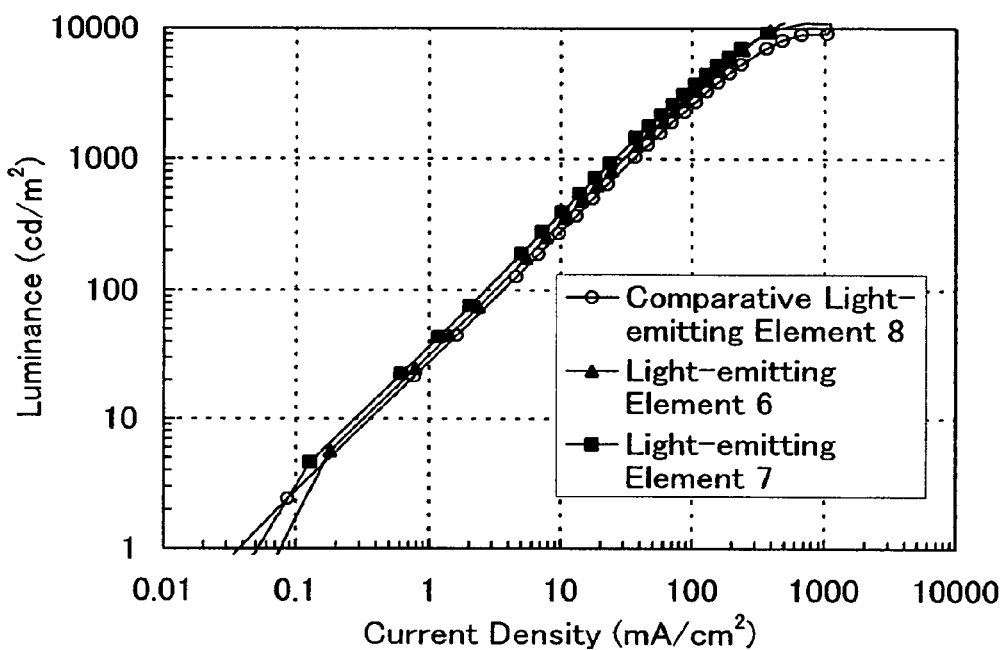
FIG. 25 is a graph illustrating current density-luminance characteristics of the light-emitting elements manufactured in Embodiment 3.
Figure 26:
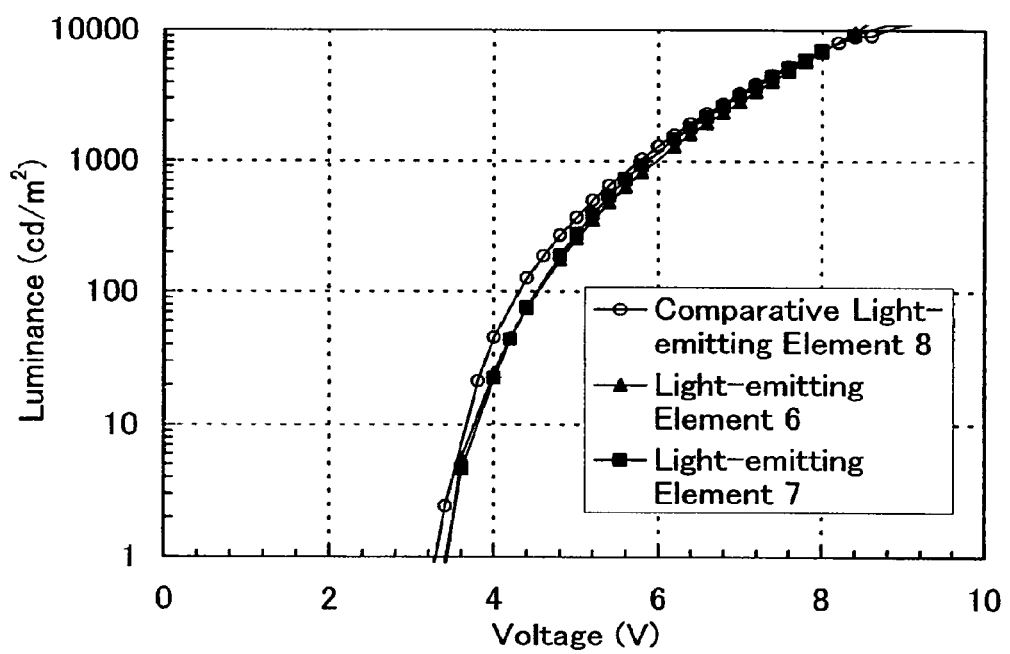
FIG. 26 is a graph illustrating voltage-luminance characteristics of the light-emitting elements manufactured in Embodiment 3.
Figure 27:
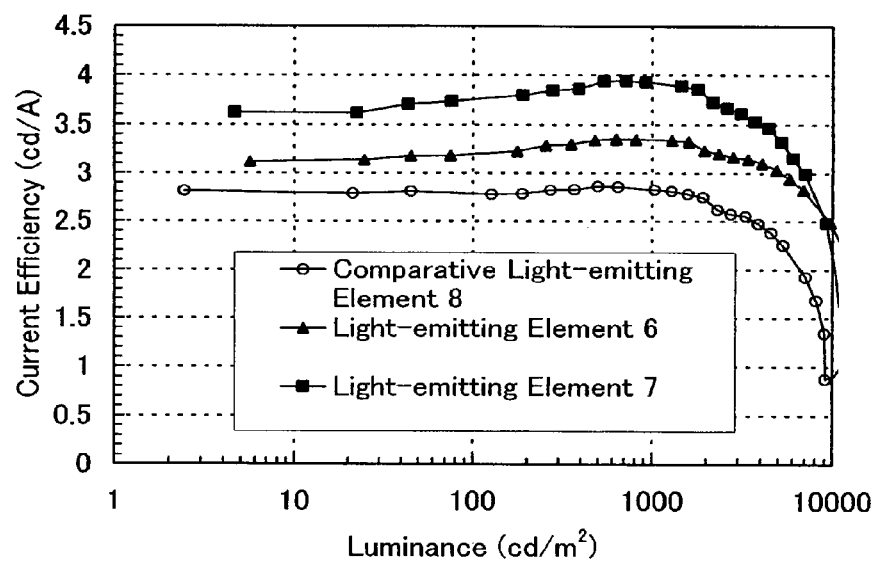
FIG. 27 is a graph illustrating luminance-current efficiency characteristics of the light-emitting elements manufactured in Embodiment 3.
Figure 28:
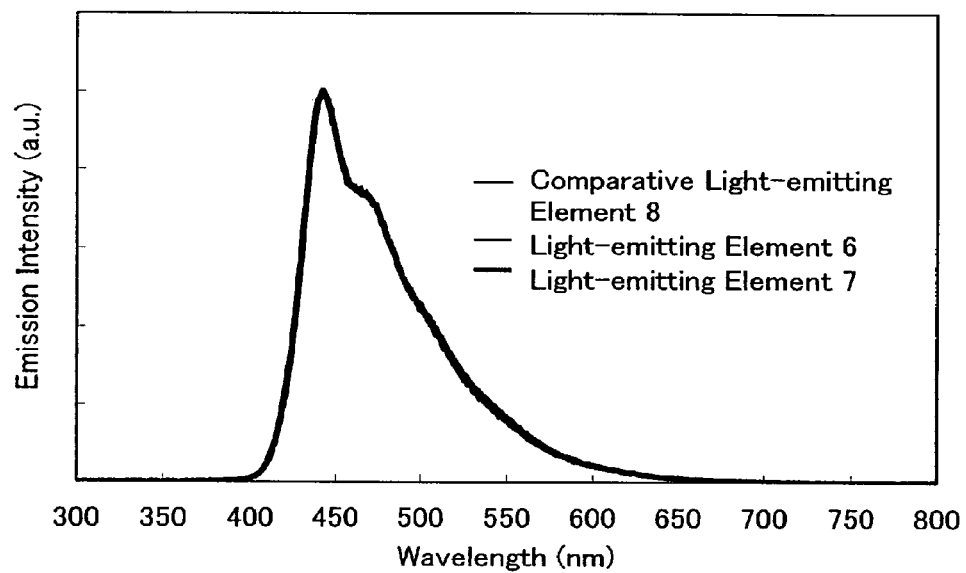
FIG. 28 is a graph illustrating the emission spectra of the light-emitting elements manufactured in Embodiment 3.

FIG. 25 illustrates the current density vs. luminance characteristics of the light-emitting element 6, the light-emitting element 7, and the comparative light-emitting 8. FIG. 26 illustrates the voltage vs. luminance characteristics thereof. FIG. 27 illustrates the luminance vs. current efficiency characteristics thereof. FIG. 28 illustrates the emission spectra thereof obtained at a current supply of 1 mA.

The emission color of the light-emitting element 6 was located at the CIE chromaticity coordinates of (x=0.16, y=0.15) at the luminance of 810 cd/m$^2$, and blue emission which derives from YGA2S was obtained. In addition, a current efficiency, a voltage, a current density, and a power efficiency of the light-emitting element 6 at the luminance of 810 cd/m$^2$ were 3.3 cd/A, 5.8 V, 24.2 mA/cm$^2$, and 1.8 lm/W, respectively.

The emission color of the light-emitting element 7 was located at the CIE chromaticity coordinates of (x=0.16, y=0.15) at the luminance of 930 cd/m$^2$, and blue emission which derives from YGA2S was obtained. In addition, a current efficiency, a voltage, a current density, and a power efficiency of the light-emitting element 7 at the luminance of 930 cd/m$^2$ were 3.9 cd/A, 5.8 V, 23.5 mA/cm$^2$, and 2.2 lm/W, respectively.

The emission color of the comparative light-emitting element 8 was located at the CIE chromaticity coordinates of (x=0.16, y=0.15) at the luminance of 1040 cd/m$^2$, and blue emission which derives from YGA2S was obtained. In addition, a current efficiency, a voltage, a current density, and a power efficiency of the comparative light-emitting element 8 at the luminance of 1040 cd/m$^2$ were 2.8 cd/A, 5.8 V, 36.6 mA/cm$^2$, and 1.5 lm/W, respectively.

As described above, it is found that high current efficiency is obtained in the light-emitting element 6 and the light-emitting element 7 in which the layer for controlling the carrier transport of the present invention is provided, as compared with the comparative light-emitting element 8 in which the layer for controlling the carrier transport is not provided. Further, since the driving voltage of the light-emitting element 6 and the light-emitting element 7 is not much different from that of the comparative light-emitting element 8 without the layer for controlling the carrier transport, the light-emitting elements 6 and 7 show high power efficiency, originating from their high current efficiency. Thus, it is found that the light-emitting element of the present invention consumes low power.

The dipole moment of TAZ01 used in the light-emitting element 6 and the light-emitting element 7 was calculated.

First, the structure of a ground state of TAZ01 was optimized by density functional theory (DFT) at a level of B3LYP/6-311(d,p). The dipole moment of TAZ01 with an optimized structure was calculated to be 5.87 debye. The calculation was carried out in a similar way shown in Embodiment 1.

The oxidation characteristics of TAZ01 which was used for the layer for controlling the carrier transport in the light-emitting element 6 and the light-emitting element 7 were evaluated by cyclic voltammetry (CV) measurement. The measurement was performed under the same conditions as that of Measurement Example 1 in Embodiment 1.

Measurement Example 3

TAZ01

Figure 39:
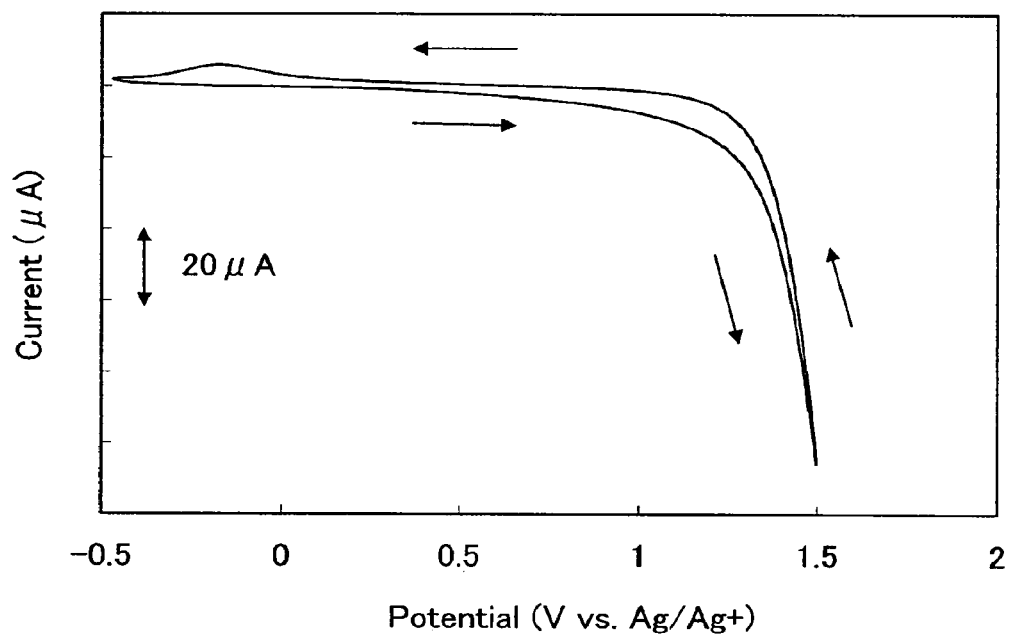
FIG. 39 is a graph illustrating oxidation characteristics of TAZ01.

In this measurement example, the oxidation characteristics of TAZ01 were evaluated by cyclic voltammetry (CV) measurement. The scan rate was set at 0.1 V/sec. FIG. 39 illustrates the measurement result. The measurement of the oxidation characteristics was performed by the steps of: scanning the potential of the working electrode with respect to the reference electrode in the ranges of −0.47 V to −1.50 V, and then 1.50 V to −0.47 V.

As illustrated in FIG. 39, a peak which indicates oxidation of TAZ01 did not appear even when scanning was performed at least up to 1.0 V. Further, even if there were a peak which indicates oxidation at a voltage greater than or equal to 1.0 V, the peak could not be observed due to the influence of flow of a large amount of current. That is, it can be concluded from this data that the oxidation potential of TAZ01 is greater than or equal to 1.0 V. Since the potential energy of the reference electrode used in this measurement example with respect to the vacuum level is −4.85 eV, an oxidation potential of 1.0 V in the CV measurement corresponds to be an ionization potential of −(−4.85−1.0)=5.85 eV. Therefore, it was found that the ionization potential of TAZ01 is at least greater than or equal to 5.8 eV, which means that TAZ01 can be preferably used for the layer for controlling the carrier transport of the present invention.

As shown in Measurement Example 2 in Embodiment 1, an oxidation peak potential $E_{pa}$ of NPB is 0.45 V, and a difference in oxidation peak potential of TAZ01 measured in Measurement Example 3 is greater than or equal to 0.55 V. Therefore, a difference between the oxidation peak potential of NPB and the oxidation peak potential of TAZ01 is greater than or equal to 0.5 V. Accordingly, a difference between an ionization potential of NPB and that of TAZ01 is at least greater than or equal to 0.5 eV.

Thus, it was confirmed that, since a dipole moment and an ionization potential of TAZ01 used for the light-emitting element 6 and the light-emitting element 7 are larger than or equal to 2.0 debye and greater than or equal to 5.8 eV, respectively, TAZ01 can be preferably used for the layer for controlling the carrier transport. That is, it was found that a layer containing NPB and TAZ01 which are organic compounds having a hole-transporting property functions as the layer for controlling the carrier transport. In particular, since a dipole moment of TAZ01 is large, TAZ01 is preferable as a second organic compound which is used for the layer for controlling the carrier transport.

Accordingly, it was revealed that carrier balance is improved by applying the present invention and thus a light-emitting element with high luminous efficiency can be obtained. Further, it was found that a light-emitting element with low power consumption can be obtained.

Embodiment 4

This embodiment will specifically describe a light-emitting element of the present invention with reference to FIG. 20. Note that a light-emitting element 9 and a light-emitting element 10 manufactured in Embodiment 4 were formed over the same substrate.

(Manufacture of Light-Emitting Element 9)

First, a film of indium tin oxide containing silicon oxide was formed over a glass substrate 2201 by a sputtering method, and a first electrode 2202 was formed. Note that the thickness was 110 nm and the electrode area was 2 mm×2 mm.

Next, the substrate on which the first electrode 2202 was formed was fixed to a substrate holder that was provided in a vacuum evaporation apparatus, such that the surface on which the first electrode 2202 was formed came to the lower side. After the pressure of the vacuum evaporation apparatus was reduced to be approximately $10^{-4}$ Pa, 4,4'-bis[N-(1-naphtyl)-N-phenylamino]biphenyl (abbreviation: NPB) and molybdenum (VI) oxide were co-evaporated on the first electrode 2202 to form a layer 2211 containing a composite material. The thickness was 50 nm, and the evaporation rate was controlled so that the weight ratio of NPB to molybdenum (VI) oxide could be 4:1 (=NPB:molybdenum oxide).

Next, a layer 2212 for controlling the carrier transport was formed over the layer 2211 containing a composite material. The layer 2212 for controlling the carrier transport was formed by depositing 4,4'-bis[N-(1-naphthyl)-N-phenylamino]biphenyl (abbreviation: NPB) and 3-(4-biphenylyl)-4-phenyl-5-(4-tert-butylphenyl)-1,2,4-triazole (abbreviation: TAZ01) at a thickness of 10 nm by a co-evaporation method. Here, the evaporation rate was controlled so that the weight ratio of NPB to TAZ01 could be 1:0.05 (=NPB:TAZ01).

Next, a light-emitting layer 2214 was formed over the layer 2212 for controlling the carrier transport. 9-[4-(10-phenyl-9-antryl)phenyl]-9H-carbazole (abbreviation CzPA) and N,N'-bis[4-(9H-carbazol-9-yl)phenyl]-N,N'-diphenylstilbene-4,4'-diamine (abbreviation: YGA2S) were co-evaporated to form the light-emitting layer 2214 with a thickness of 30 nm. Here, the evaporation rate was controlled so that the weight ratio of CzPA to YGA2S could be 1:0.04 (=CzPA:YGA2S).

After that, an electron-transporting layer 2215 was formed over the light-emitting layer 2214 by an evaporation method using resistance heating. First, tris(8-quinolinolato)aluminum(III) (abbreviation: Alq) was formed over the light-emitting layer 2214 so as to have a thickness of 20 nm to form a first electron-transporting layer 2231. Then, bathophenanthroline (abbreviation: BPhen) was formed over the first electron-transporting layer 2231 so as to have a thickness of 10 nm to form a second electron-transporting layer 2232.

Next, by an evaporation method using resistance heating, a film of lithium fluoride (LiF) was formed over the electron-transporting layer 2215 so as to have a thickness of 1 nm to form an electron-injecting layer 2216.

Finally, a film of aluminum was formed so as to have a thickness of 200 nm by an evaporation method using resistance heating to form a second electrode 2204. In this manner, a light-emitting element 9 was manufactured.

The light-emitting element 9 of the present invention obtained through the above process was put into a glove box containing a nitrogen so that the light-emitting element was sealed in order not to be exposed to atmospheric air. Then, the operating characteristics of the light-emitting element were measured. Note that the measurement was performed at a room temperature (atmosphere kept at 25° C.).
(Manufacture of Light-Emitting Element 10)

A light-emitting element 10 was manufactured in a similar manner to the light-emitting element 9 except that the weight ratio of NPB to TAZ01 in the layer 2212 for controlling the carrier transport was 1:0.1 (=NPB:TAZ01).

As to the light-emitting element 10 of the present invention, the light-emitting element was also put into a glove box containing a nitrogen so that the light-emitting element was sealed in order not to be exposed to atmospheric air, in a similar manner to the light-emitting element 9. Then, the operating characteristics of the light-emitting element were measured. Note that the measurement was performed at a room temperature (atmosphere kept at 25° C.).

Figure 29:
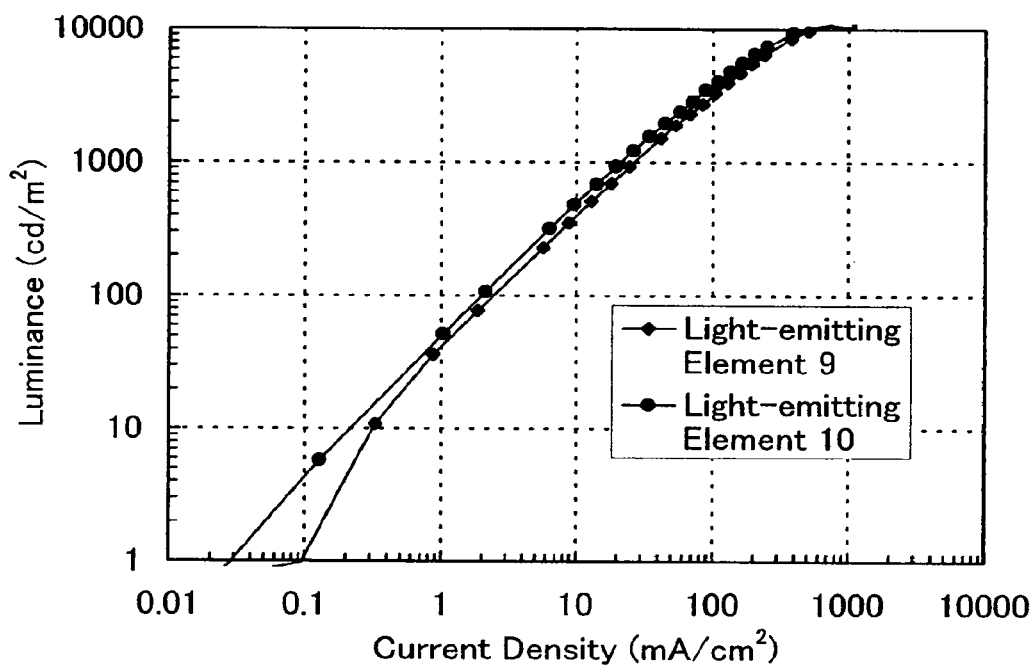
FIG. 29 is a graph illustrating current density-luminance characteristics of the light-emitting elements manufactured in Embodiment 4.
Figure 30:
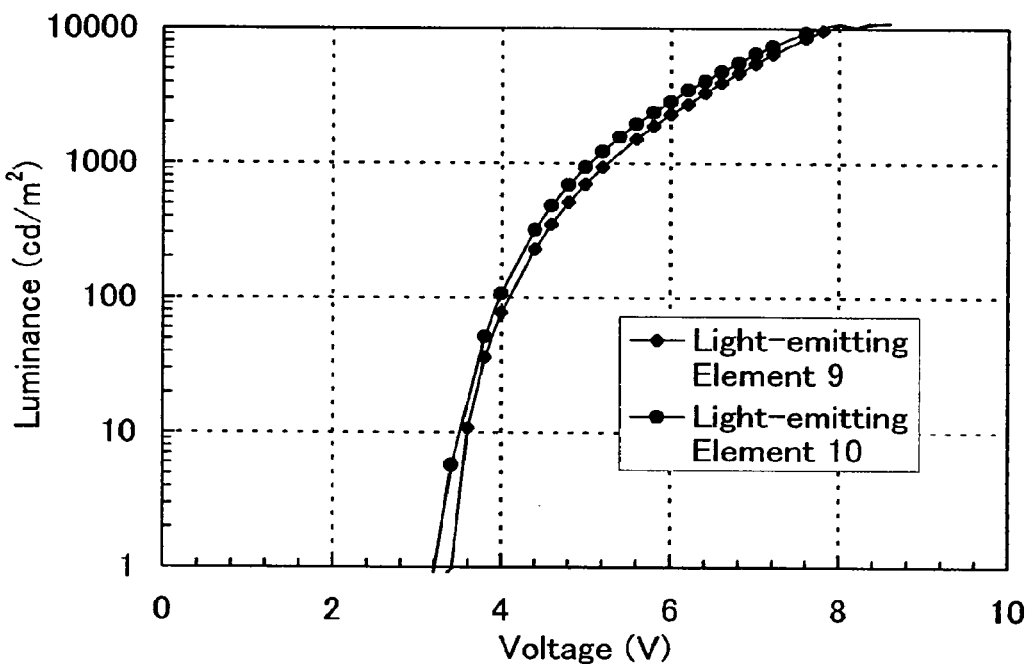
FIG. 30 is a graph illustrating voltage-luminance characteristics of the light-emitting elements manufactured in Embodiment 4.
Figure 31:
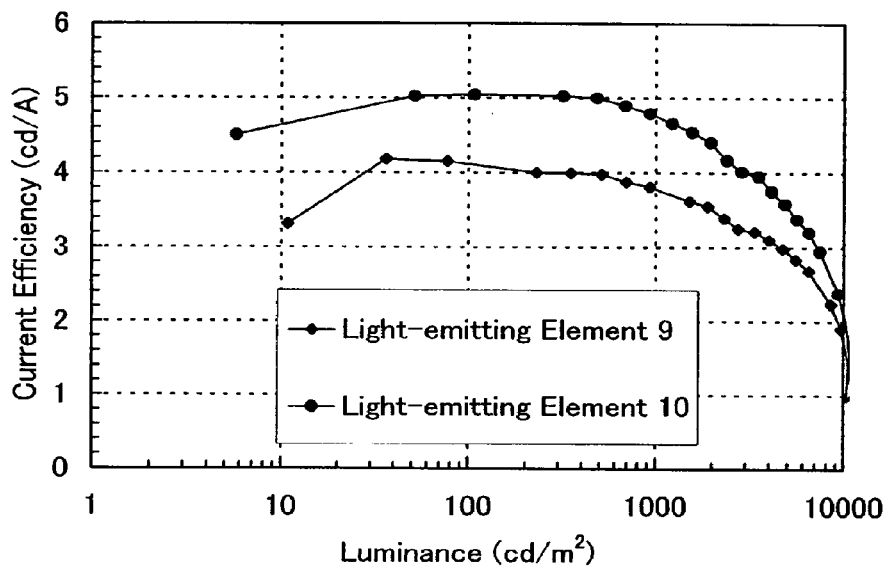
FIG. 31 is a graph illustrating luminance-current efficiency characteristics of the light-emitting elements manufactured in Embodiment 4.
Figure 32:
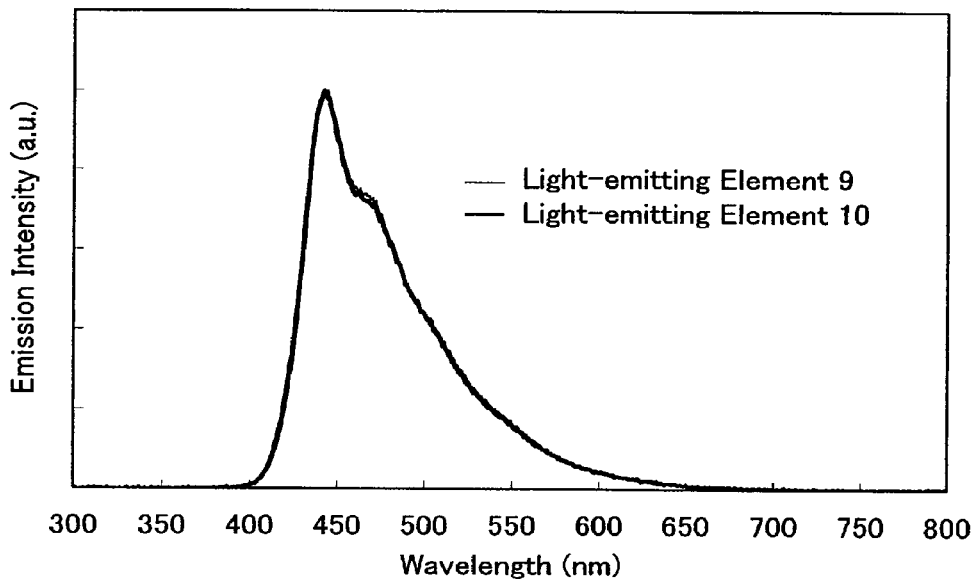
FIG. 32 is a graph illustrating the emission spectra of the light-emitting elements manufactured in Embodiment 4.

FIG. 29 illustrates the current density vs. luminance characteristics of the light-emitting element 9 and the light-emitting element 10. FIG. 30 illustrates the voltage vs. luminance characteristics thereof. FIG. 31 illustrates the luminance vs. current efficiency characteristics thereof. FIG. 32 illustrates the emission spectra thereof obtained at a current supply of 1 mA.

The emission color of the light-emitting element 9 was located at the CIE chromaticity coordinates of (x=0.16, y=0.15) at the luminance of 930 cd/m$^2$, and blue emission which derives from YGA2S was obtained. In addition, a current efficiency, a voltage, a current density, and a power efficiency of the light-emitting element 9 at the luminance of 930 cd/m$^2$ were 3.8 cd/A, 5.2 V, 24.4 mA/cm$^2$, and 2.3 lm/W, respectively.

The emission color of the light-emitting element 10 was located at the CIE chromaticity coordinates of (x=0.16, y=0.15) at the luminance of 930 cd/m$^2$, and blue emission which derives from YGA2S was obtained. In addition, a current efficiency, a voltage, a current density, and a power efficiency of the light-emitting element 10 at the luminance of 930 cd/m$^2$ were 4.8 cd/A, 5.0 V, 19.5 mA/cm$^2$, and 3.0 lm/W, respectively.

As described above, it is found that high current efficiency is obtained in the light-emitting element 9 and the light-emitting element 10 in each of which the layer for controlling the carrier transport of the present invention is provided. The light-emitting element 9 and the light-emitting element 10 have high power efficiency due to the high current efficiency thereof. Thus, it is found that the light-emitting element of the present invention consumes low power.

Accordingly, it can be concluded that carrier balance is improved by applying the present invention and thus a light-emitting element with high luminous efficiency can be obtained. Further, it was found that a light-emitting element with low power consumption can be obtained.

The dipole moment of TAZ01 used for the light-emitting element 9 and the light-emitting element 10 is 5.87 debye as calculated in Embodiment 3 and an ionization potential of TAZ01 is greater than or equal to 5.8 eV. The difference between the ionization potential of NPB and that of TAZ01 is greater than or equal to 0.5 eV.

Thus, it is found that TAZ01 used for the light-emitting element 9 and the light-emitting element 10 can be preferably used for the layer for controlling the carrier transport. That is, it is confirmed that a layer containing NPB which is an organic compound having a hole-transporting property and TAZ01 functions as the layer for controlling the carrier transport.

The structure in which the light-emitting layer and the layer for controlling the carrier transport are in contact with each other is shown in this embodiment, and it is found that, even in this structure, the layer containing NPB and TAZ01 functions as the layer for controlling the carrier transport, so that high luminous efficiency can be obtained.

Embodiment 5

This embodiment will specifically describe a light-emitting element of the present invention with reference to FIG. 14. Note that a light-emitting element 11, a light-emitting element 12, and a comparative light-emitting element 13 manufactured in Embodiment 5 were formed over the same substrate. A structural formula of an organic compound used in Embodiment 5 is shown below.

[CHEMICAL FORMULA 3]

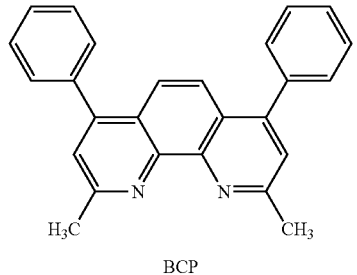

BCP (Manufacture of Light-Emitting Element 11)

First, a film of indium tin oxide containing silicon oxide was formed over a glass substrate 2201 by a sputtering method to form a first electrode 2202. Note that the thickness was 110 nm and the electrode area was 2 mm×2 mm.

Next, the substrate on which the first electrode 2202 was formed was fixed to a substrate holder that was provided in a vacuum evaporation apparatus, such that the surface on which the first electrode 2202 was formed came to the lower side. After the pressure of the vacuum evaporation apparatus was reduced to be approximately 10$^{-4}$ Pa, 4,4'-bis[N-(1-naphtyl)-N-phenylamino]biphenyl (abbreviation: NPB) and molybdenum (VI) oxide were co-evaporated on the first electrode 2202, giving the layer 2211 containing a composite material. The thickness was 30 nm, and the evaporation rate was controlled so that the weight ratio of NPB to molybdenum (VI) oxide could be 4:1 (=NPB:molybdenum oxide).

Next, a layer 2212 for controlling the carrier transport was formed over the layer 2211 containing a composite material. The layer 2212 for controlling the carrier transport was formed by depositing 4,4'-bis[N-(1-naphthyl)-N-phenylamino]biphenyl (abbreviation: NPB) and bathocuproine (abbreviation: BCP) at a thickness of 10 nm by a co-evaporation method. Here, the evaporation rate was controlled so that the weight ratio of NPB to BCP could be 1:0.05 (=NPB:BCP).

Next, by an evaporation method using resistance heating, a film of 4,4'-bis[N-(1-naphthyl)-N-phenylamino]biphenyl (abbreviation: NPB) was formed so as to have a thickness of 20 nm to form a hole-transporting layer 2213.

Next, a light-emitting layer 2214 was formed over the hole-transporting layer 2213. 9-[4-(10-phenyl-9-antryl)phenyl]-9H-carbazole (abbreviation: CzPA) and N,N'-bis[4-(9H-carbazol-9-yl)phenyl]-N,N'-diphenylstilbene-4,4'-diamine (abbreviation: YGA2S) were co-evaporated to form the light-emitting layer 2214 with a thickness of 30 nm. Here, the evaporation rate was controlled so that the weight ratio of CzPA to YGA2S could be 1:0.04 (=CzPA:YGA2S).

After that, an electron-transporting layer 2215 was formed over the light-emitting layer 2214 by an evaporation method using resistance heating. First, tris(8-quinolinolato)aluminum(III) (abbreviation: Alq) was formed over the light-emitting layer 2214 so as to have a thickness of 20 nm to form a first electron-transporting layer 2231. Then, bathophenanthroline (abbreviation: BPhen) was formed over the first electron-transporting layer 2231 so as to have a thickness of 10 nm to form a second electron-transporting layer 2232.

Next, by an evaporation method using resistance heating, a film of lithium fluoride (LiF) was formed over the electron-transporting layer 2215 so as to have a thickness of 1 nm to form an electron-injecting layer 2216.

Finally, a film of aluminum was formed so as to have a thickness of 200 nm by an evaporation method using resistance heating to form a second electrode 2204. In this manner, a light-emitting element 11 was manufactured.

The light-emitting element 11 of the present invention obtained through the above process was put into a glove box containing a nitrogen so that the light-emitting element was sealed in order not to be exposed to atmospheric air. Then, the operating characteristics of the light-emitting element were measured. Note that the measurement was performed at a room temperature (atmosphere kept at 25° C.).

(Manufacture of Light-Emitting Element 12)

A light-emitting element 12 was manufactured in a similar manner to the light-emitting element 11 except that the weight ratio of NPB to BCP in the layer 2212 for controlling the carrier transport was 1:0.1 (=NPB:BCP).

As to the light-emitting element 12 of the present invention, the light-emitting element was also put into a glove box containing a nitrogen so that the light-emitting element was sealed in order not to be exposed to atmospheric air, in a similar manner to the light-emitting element 11. Then, the operating characteristics of the light-emitting element were measured. Note that the measurement was performed at a room temperature (atmosphere kept at 25° C.).

The light-emitting element 12 of the present invention obtained through the above process was put into a glove box containing a nitrogen so that the light-emitting element was sealed in order not to be exposed to atmospheric air. Then, the operating characteristics of the light-emitting element were measured. Note that the measurement was performed at a room temperature (atmosphere kept at 25° C.).

(Manufacture of Comparative Light-Emitting Element 13)

Next, for comparison, a comparative light-emitting element 13 having a structure in which the layer 2212 for controlling the carrier transport in the above light-emitting element 11 and light-emitting 12 is not provided was formed. The manufacturing method is described below.

First, a film of indium tin oxide containing silicon oxide was formed over a glass substrate by a sputtering method to form a first electrode. Note that the thickness was 110 nm and the electrode area was 2 mm×2 mm.

Next, the substrate on which the first electrode was formed was fixed to a substrate holder that was provided in a vacuum evaporation apparatus, such that the surface on which the first electrode was formed came to the lower side. After the pressure of the vacuum evaporation apparatus was reduced to be approximately $10^{-4}$ Pa, 4,4'-bis[N-(1-naphtyl)-N-phenylamino]biphenyl (abbreviation: NPB) and molybdenum (VI) oxide were co-evaporated on the first electrode to form a layer containing a composite material. The thickness was 30 nm, and the evaporation rate was controlled so that the weight ratio of NPB to molybdenum (VI) oxide could be 4:1 (=NPB: molybdenum oxide).

Next, by an evaporation method using resistance heating, a film of 4,4'-bis[N-(1-naphthyl)-N-phenylamino]biphenyl (abbreviation: NPB) was formed over the layer containing a composite material so as to have a thickness of 30 nm to form a hole-transporting layer.

Next, a light-emitting layer was formed over the hole-transporting layer. 9-[4-(10-phenyl-9-antryl)phenyl]-9H-carbazole (abbreviation: CzPA) and N,N'-bis[4-(9H-carbazol-9-yl)phenyl]-N,N'-diphenylstilbene-4,4'-diamine (abbreviation: YGA2S) were co-evaporated to form the light-emitting layer at a thickness of 30 nm. Here, the evaporation rate was controlled so that the weight ratio of CzPA to YGA2S could be 1:0.04 (=CzPA:YGA2S).

After that, an electron-transporting layer was formed over the light-emitting layer by an evaporation method using resistance heating. First, tris(8-quinolinolato)aluminum(III) (abbreviation: Alq) was formed over the light-emitting layer so as to have a thickness of 20 nm to form a first electron-transporting layer. Then, bathophenanthroline (abbreviation: BPhen) was formed over the first electron-transporting layer so as to have a thickness of 10 nm to form a second electron-transporting layer.

Next, by an evaporation method using resistance heating, a film of lithium fluoride (LiF) was formed over the electron-transporting layer so as to have a thickness of 1 nm to form an electron-injecting layer.

Finally, a film of aluminum was formed so as to have a thickness of 200 nm by an evaporation method using resistance heating to form a second electrode. In this manner, a comparative light-emitting element 13 was manufactured.

The light-emitting element 13 of the present invention obtained through the above process was put into a glove box containing a nitrogen so that the light-emitting element was sealed in order not to be exposed to atmospheric air. Then, the operating characteristics of the light-emitting element were measured. Note that the measurement was performed at a room temperature (atmosphere kept at 25° C.).

Figure 33:
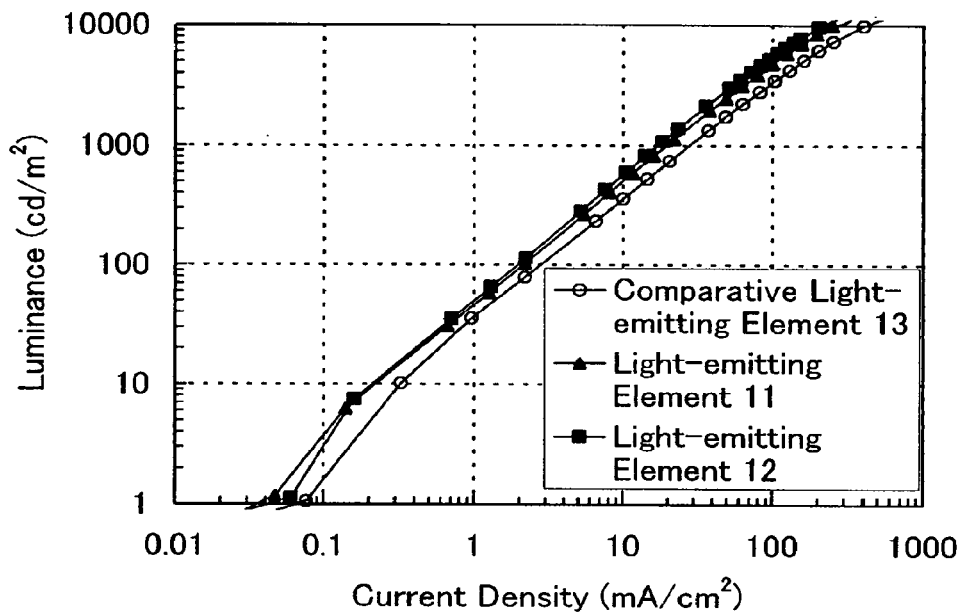
FIG. 33 is a graph illustrating current density-luminance characteristics of the light-emitting elements manufactured in Embodiment 5.
Figure 34:
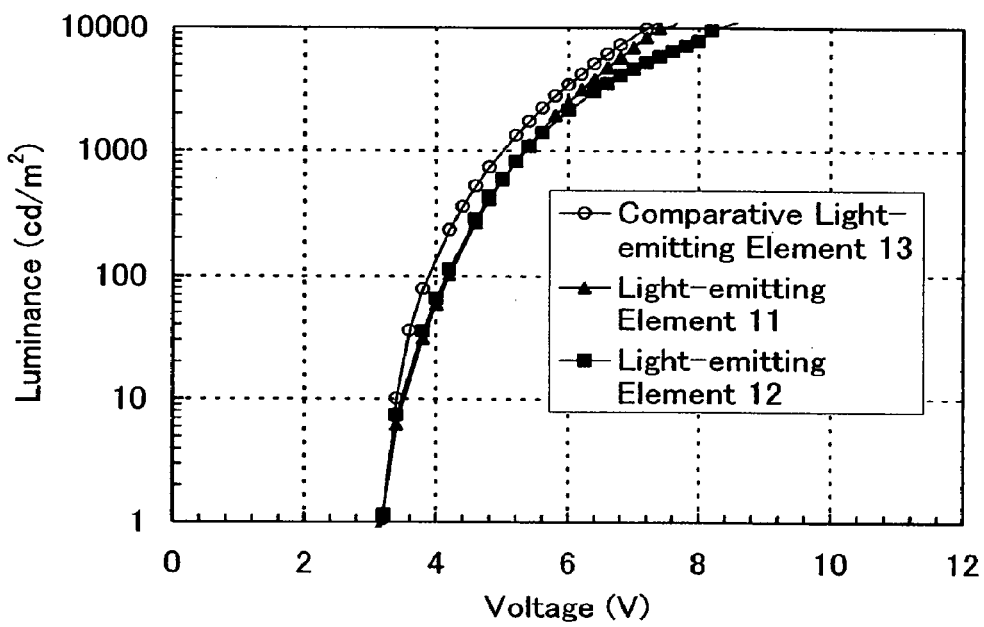
FIG. 34 is a graph illustrating voltage-luminance characteristics of the light-emitting elements manufactured in Embodiment 5.
Figure 35:
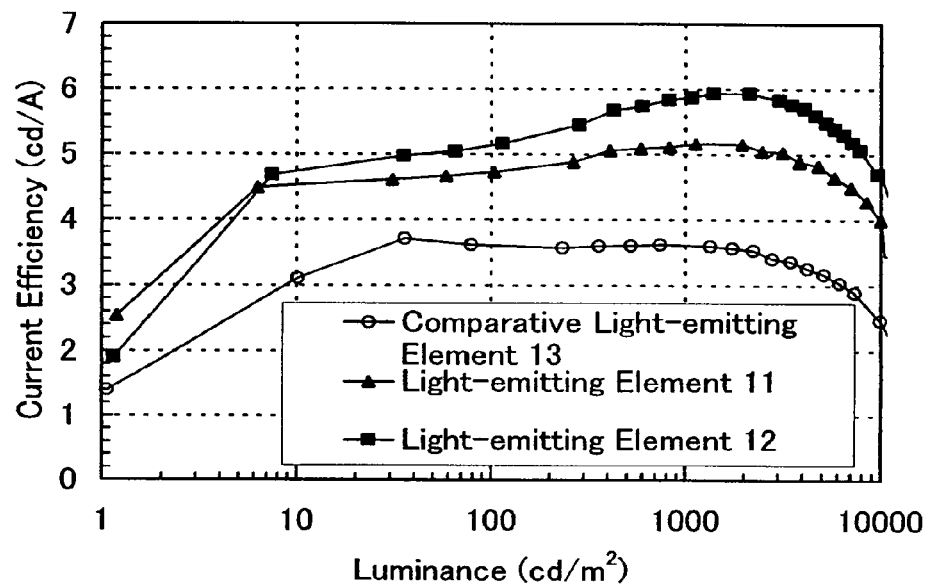
FIG. 35 is a graph illustrating luminance-current efficiency characteristics of the light-emitting elements manufactured in Embodiment 5.
Figure 36:
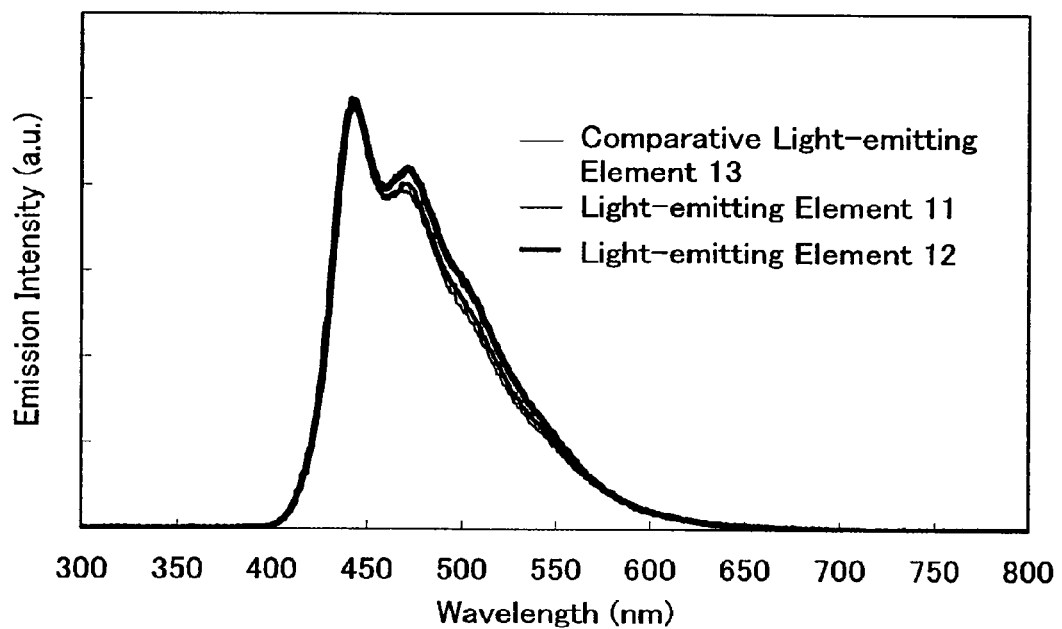
FIG. 36 is a graph illustrating the emission spectra of the light-emitting elements manufactured in Embodiment 5.

FIG. 33 illustrates the current density vs. luminance characteristics of the light-emitting element 11, the light-emitting element 12, and the comparative light-emitting 13. FIG. 34 illustrates the voltage vs. luminance characteristics thereof. FIG. 35 illustrates the luminance vs. current efficiency characteristics thereof. FIG. 36 illustrates the emission spectra thereof obtained at a current supply of 1 mA.

The emission color of the light-emitting element 11 was located at the CIE chromaticity coordinates of (x=0.16, y=0.18) at the luminance of 1130 cd/m$^2$, and blue emission which derives from YGA2S was obtained. In addition, a current efficiency, a voltage, a current density, and a power efficiency of the light-emitting element 11 at the luminance of 1130 cd/m$^2$ were 5.2 cd/A, 5.4 V, 21.9 mA/cm$^2$, and 3.0 lm/W, respectively.

The emission color of the light-emitting element 12 was located at the CIE chromaticity coordinates of (x=0.16, y=0.18) at the luminance of 1080 cd/m$^2$, and blue emission which derives from YGA2S was obtained. In addition, a current efficiency, a voltage, a current density, and a power efficiency of the light-emitting element 12 at the luminance of 1080 cd/m$^2$ were 5.9 cd/A, 5.4 V, 18.4 mA/cm$^2$, and 3.4 lm/W, respectively.

The emission color of the comparative light-emitting element 13 was located at the CIE chromaticity coordinates of (x=0.16, y=0.17) at the luminance of 740 cd/m$^2$, and blue emission which derives from YGA2S was obtained. In addition, a current efficiency, a voltage, a current density, and a power efficiency of the comparative light-emitting element 13 at the luminance of 740 cd/m² were 3.6 cd/A, 4.8 V, 20.4 mA/cm², and 2.3 lm/W, respectively.

As described above, it is found that high current efficiency is obtained in the light-emitting element 11 and the light-emitting element 12 in which the layer for controlling the carrier transport of the present invention is provided, as compared with the comparative light-emitting element 13 without the layer for controlling the carrier transport. Since the driving voltage of the light-emitting element 11 and the light-emitting element 12 is not much different from that of the comparative light-emitting element 13 without the layer for controlling the carrier transport, high power efficiency is obtained, resulting from the high current efficiency thereof. Thus, it is found that the light-emitting element of the present invention consumes low power.

A dipole moment of BCP used in the light-emitting element 11 and the light-emitting element 12 was calculated. First, the structure of a ground state of BCP was optimized by density functional theory (DFT) at a level of B3LYP/6-311 (d,p). The dipole moment of the optimized BCP was calculated to be 2.90 debye. The calculation was carried out in a similar way to that shown in Embodiment 1.

The oxidation characteristics of BCP which was used for the layer for controlling the carrier transport in the light-emitting element 11 and the light-emitting element 12 manufactured in this embodiment were evaluated by cyclic voltammetry (CV) measurement. The measurement was performed under the same conditions as that of Measurement Example 1 in Embodiment 1.

Measurement Example 4

BCP

Figure 40:
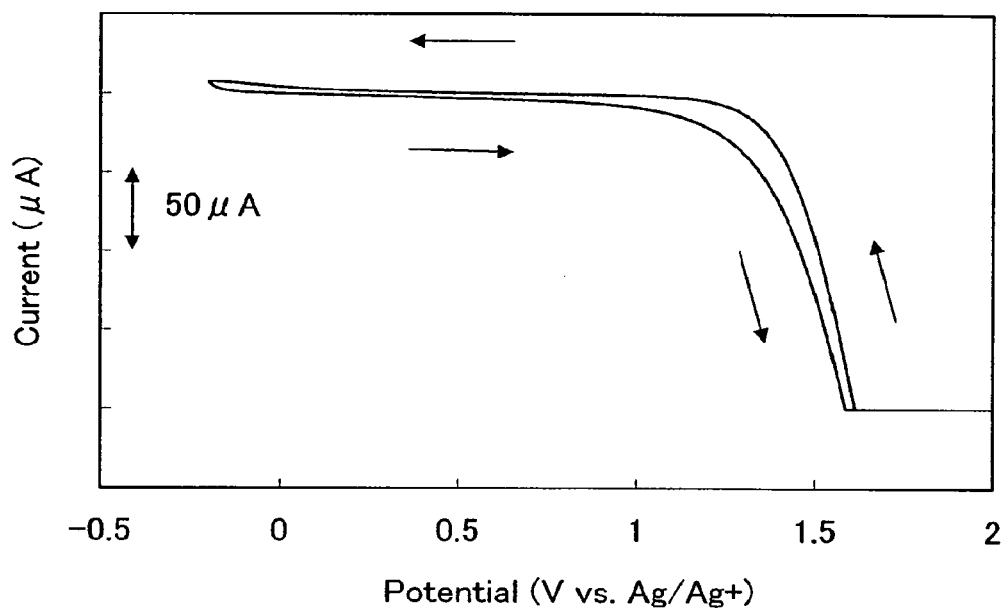
FIG. 40 is a graph illustrating oxidation characteristics of BCP.

In this measurement example, the oxidation characteristics of BCP were evaluated by cyclic voltammetry (CV) measurement. The scan rate was set at 0.1 V/sec. FIG. 40 illustrates the measurement result. The measurement of the oxidation characteristics was performed by the steps of: scanning the potential of the working electrode with respect to the reference electrode in the ranges of −0.20 V to −1.60 V, and then 1.60 V to −0.20 V.

As illustrated in FIG. 40, a peak which corresponds to the oxidation of BCP did not appear even when scanning was performed at least up to 1.0 V. Further, even if there were a peak which indicates oxidation at a voltage greater than or equal to 1.0 V, the peak could not be observed due to the influence of flow of a large amount of current. This means that the oxidation potential of BCP is greater than or equal to 1.0 V. Since the potential energy of the reference electrode used in this measurement example with respect to the vacuum level is −4.85 eV, an oxidation potential of 1.0 V in the CV measurement corresponds to an ionization potential of −(−4.85−1.0)=5.85 eV. Therefore, it can be concluded that the ionization potential of BCP is greater than or equal to 5.8 eV. Thus, it was confirmed that BCP can be preferably used for the layer for controlling the carrier transport of the present invention.

As shown in Measurement Example 2 in Embodiment 1, an oxidation peak potential $E_{pa}$ of NPB is 0.45 V, and a difference from an oxidation peak potential of BCP measured in Measurement Example 4 is greater than or equal to 0.55 V. Therefore, a difference between the oxidation peak potential of NPB and that of BCP is greater than or equal to 0.5 V. Accordingly, the difference between the ionization potential of NPB and that of BCP is greater than or equal to 0.5 eV.

Thus, it is found that, since the dipole moment and the ionization potential of BCP used for the light-emitting element 11 and the light-emitting element 12 are greater than or equal to 2.0 debye and greater than or equal to 5.8 eV, respectively, BCP can be preferably used for the layer for controlling the carrier transport. Namely, a layer containing NPB which is an organic compound having a hole-transporting property and BCP functions as the layer for controlling the carrier transport.

These data lead to a conclusion that carrier balance can be improved by applying the present invention and thus a light-emitting element with high luminous efficiency can be obtained. Further, it was found that a light-emitting element with low power consumption can be obtained.

The present application is based on Japanese Patent Application serial no. 2006-327662 filed with Japan Patent Office on Dec. 4, in 2006, the entire contents of which are hereby incorporated by reference.

EXPLANATION OF REFERENCE

201: substrate, 202: first electrode, 203: EL layer, 204: second electrode, 211: hole-injecting layer, 212: layer for controlling the carrier transport, 213: hole-transporting layer, 214: light-emitting layer, 215: electron-transporting layer, 216: electron-injecting layer, 221: first organic compound, 222: second organic compound, 501: first electrode, 502: second electrode, 511: first light-emitting unit, 512: second light-emitting unit, 513: charge generation layer, 601: driver circuit portion (source-side driver circuit), 602: pixel portion, 603: driver circuit portion (gate-side driver circuit), 604: sealing substrate, 605: sealing material, 607: space, 608: wiring, 609: FPC (Flexible Printed Circuit), 610: element substrate, 611: switching TFT, 612: current-controlling TFT, 613: first electrode, 614: insulator, 616: EL layer, 617: second electrode, 618: light-emitting element, 623: N-channel TFT, 624: P-channel TFT, 701: main body, 702: display portion, 703: operation switch, 704: display portion, 710: main body, 711: display portion, 712: memory portion, 713: operation portion, 714: earphone, 901: housing, 902: liquid crystal layer, 903: backlight, 904: housing, 905: driver IC, 906: terminal, 951: substrate, 952: electrode, 953: insulating layer, 954: partition layer, 955: EL layer, 956: electrode, 2001: housing, 2002: light source, 2201: glass substrate, 2202: first electrode, 2204: second electrode, 2211: layer containing a composite material, 2212: layer for controlling the carrier transport, 2213: hole-transporting layer, 2214: light-emitting layer, 2215: electron-transporting layer, 2216: electron-injecting layer, 2231: first electron-transporting layer, 2232: second electron-transporting layer, 3001: lighting device, 3002: television device, 9101: housing, 9102: support, 9103: display portion, 9104: speaker portion, 9105: video input terminal, 9201: main body, 9202: housing, 9203: display portion, 9204: keyboard, 9205: external connection port, 9206: pointing device, 9401: main body, 9402: housing, 9403: display portion, 9404: audio input portion, 9405: audio output portion, 9406: operation key, 9407: external connection port, 9408: antenna, 9501: main body, 9502: display portion, 9503: housing, 9504: external connection port, 9505: remote control receiving portion, 9506: image receiving portion, 9507: battery, 9508: audio input portion, 9509: operation key, 9510: eyepiece portion.

The invention claimed is:

1. A light-emitting apparatus having a light-emitting element, the light-emitting element comprising:
   an anode and a cathode;
   a light-emitting layer between the anode and the cathode;
   a first layer between the light-emitting layer and the anode; and a second layer between the first layer and the anode, wherein the first layer contains a first organic compound having a hole-transporting property and a hole-blocking organic compound, wherein a weight percent of the first organic compound is larger than a weight percent of the hole-blocking organic compound, wherein the second layer contains a second organic compound having a hole-transporting property and a substance having an acceptor property, and wherein the substance having an acceptor property is molybdenum oxide.

2. The light-emitting apparatus according to claim 1, wherein an ionization potential of the hole-blocking organic compound is larger than an ionization potential of the first organic compound, and wherein a difference between the ionization potential of the first organic compound and the ionization potential of the hole-blocking organic compound is larger than or equal to 0.5 eV.

3. The light-emitting apparatus according to claim 1, wherein an ionization potential of the hole-blocking organic compound is larger than or equal to 5.8 eV.

4. The light-emitting apparatus according to claim 1, wherein the weight percent of the hole-blocking organic compound in the first layer is greater than or equal to 1 weight percent and less than or equal to 20 weight percent.

5. The light-emitting apparatus according to claim 1, wherein a thickness of the first layer is greater than or equal to 1 nm and less than or equal to 20 nm.

6. The light-emitting apparatus according to claim 1, wherein the light-emitting apparatus is a lighting device.

7. A light-emitting apparatus having a light-emitting element, the light-emitting element comprising:

an anode and a cathode;

a light-emitting layer between the anode and the cathode;

a first layer between the light-emitting layer and the anode; and a second layer between the first layer and the anode, wherein the first layer contains a first organic compound having a hole-transporting property and a second organic compound, wherein a dipole moment of the second organic compound is larger than or equal to 2.0 debye, wherein a weight percent of the first organic compound is larger than a weight percent of the second organic compound, wherein the second layer contains a third organic compound having a hole-transporting property and a substance having an acceptor property, and wherein the substance having an acceptor property is molybdenum oxide.

8. The light-emitting apparatus according to claim 7, wherein an ionization potential of the second organic compound is larger than an ionization potential of the first organic compound, and wherein a difference between the ionization potential of the first organic compound and the ionization potential of the second organic compound is larger than or equal to 0.5 eV.

9. The light-emitting apparatus according to claim 7, wherein an ionization potential of the second organic compound is larger than or equal to 5.8 eV.

10. The light-emitting apparatus according to claim 7, wherein the weight percent of the second organic compound in the first layer is greater than or equal to 1 weight percent and less than or equal to 20 weight percent.

11. The light-emitting apparatus according to claim 7, wherein a thickness of the first layer is greater than or equal to 1 nm and less than or equal to 20 nm.

12. The light-emitting apparatus according to claim 7, wherein the light-emitting apparatus is a lighting device.

13. A light-emitting apparatus having a light-emitting element, the light-emitting element comprising:

an anode and a cathode;

a light-emitting layer between the anode and the cathode;

a first layer between the light-emitting layer and the anode; and a second layer between the first layer and the anode, wherein the first layer contains a first organic compound having a hole-transporting property and a second organic compound having a heterocycle, wherein a weight percent of the first organic compound is larger than a weight percent of the second organic compound, wherein the second layer contains a third organic compound having a hole-transporting property and a substance having an acceptor property, and wherein the substance having an acceptor property is molybdenum oxide.

14. The light-emitting apparatus according to claim 13, wherein the second organic compound is selected from an oxadiazole derivative, a triazole derivative, and phenanthroline derivative.

15. The light-emitting apparatus according to claim 13, wherein an ionization potential of the second organic compound is larger than an ionization potential of the first organic compound, and wherein a difference between the ionization potential of the first organic compound and the ionization potential of the second organic compound is greater than or equal to 0.5 eV.

16. The light-emitting apparatus according to claim 13, wherein an ionization potential of the second organic compound is larger than or equal to 5.8 eV.

17. The light-emitting apparatus according to claim 13, wherein the weight percent of the second organic compound in the first layer is greater than or equal to 1 weight percent and less than or equal to 20 weight percent.

18. The light-emitting apparatus according to claim 13, wherein a thickness of the first layer is greater than or equal to 1 nm and less than or equal to 20 nm.

19. The light-emitting apparatus according to claim 13, wherein the light-emitting apparatus is a lighting device.

* * * * *